United States Patent
Jin et al.

(10) Patent No.: US 11,671,116 B2
(45) Date of Patent: *Jun. 6, 2023

(54) METHOD AND APPARATUS FOR LOW DENSITY PARITY CHECK CHANNEL CODING IN WIRELESS COMMUNICATION SYSTEM

(71) Applicant: Huawei Technologies Co., Ltd., Shenzhen (CN)

(72) Inventors: Jie Jin, Shenzhen (CN); Ivan Leonidovich Mazurenko, Moscow (RU); Aleksandr Aleksandrovich Petiushko, Moscow (RU); Chaolong Zhang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/591,347

(22) Filed: Feb. 2, 2022

(65) Prior Publication Data

US 2022/0231705 A1    Jul. 21, 2022

Related U.S. Application Data

(63) Continuation of application No. 17/013,640, filed on Sep. 6, 2020, now Pat. No. 11,277,153, which is a (Continued)

(30) Foreign Application Priority Data

Jun. 27, 2017  (CN) .......................... 201710503056.2
Jul. 13, 2017  (CN) .......................... 201710572364.0

(51) Int. Cl.
 H03M 13/11   (2006.01)
 H03M 13/00   (2006.01)
(Continued)

(52) U.S. Cl.
 CPC ..... *H03M 13/255* (2013.01); *H03M 13/1174* (2013.01); *H03M 13/616* (2013.01); *H03M 13/6362* (2013.01)

(58) Field of Classification Search
 CPC ............. H03M 13/255; H03M 13/616; H03M 13/618; H03M 13/6516; H03M 13/1185;
(Continued)

(56) References Cited

U.S. PATENT DOCUMENTS 7,178,082 B2  2/2007  Yu et al.
7,188,297 B2  3/2007  Blankenship et al.
(Continued)

FOREIGN PATENT DOCUMENTS

CN  1845482 A  10/2006
CN  1973440 A  5/2007
(Continued)

OTHER PUBLICATIONS

R1-1701600 ZTE et al.,"Further consideration on compact LDPC design for eMBB," 3GPP TSG RAN WG1 Meeting #88, Athens, Greece, total 14 pages (Feb. 13-17, 2017).
(Continued)

*Primary Examiner* — Guy J Lamarre
(74) *Attorney, Agent, or Firm* — Leydig, Voit & Mayer, Ltd.

(57) ABSTRACT

Embodiments of this application disclose provides a low density parity check (LDPC) channel encoding method for use in a wireless communications system. A communication device encodes an input bit sequence by using a LDPC matrix, to obtain an encoded bit sequence for transmission. The LDPC matrix is obtained based on a lifting factor Z and a base matrix. Embodiments of the application provide eight particular designs of the base matrix. The encoding method provided in the embodiments of the application can be used
(Continued)

US 11,671,116 B2
Page 2 in various communications systems including the fifth generation (5G) telecommunication systems, and can support various encoding requirements for information bit sequences with different code lengths.

20 Claims, 14 Drawing Sheets

Related U.S. Application Data continuation of application No. 16/423,175, filed on May 28, 2019, now Pat. No. 10,771,092, which is a continuation of application No. PCT/CN2018/082851, filed on Apr. 12, 2018.

(51) Int. Cl.
*H04L 1/00* (2006.01)
*H03M 13/25* (2006.01)

(58) Field of Classification Search
CPC ......... H03M 13/1174; H03M 13/6362; H03M 13/116; H04L 1/0057
See application file for complete search history.

(56) References Cited

U.S. PATENT DOCUMENTS

| | | | |
|---|---|---|---|
| 7,191,378 B2 | 3/2007 | Eroz et al. | |
| 7,600,174 B2 | 10/2009 | Kyung et al. | |
| 8,433,984 B2 | 4/2013 | Khandekar et al. | |
| 8,578,249 B2 | 11/2013 | Khandekar et al. | |
| 9,100,052 B2 | 8/2015 | Pisek | |
| 9,306,601 B2 | 4/2016 | Richardson | |
| 9,432,052 B2 | 8/2016 | Korb et al. | |
| 9,559,722 B1 | 1/2017 | Huang et al. | |
| 9,847,794 B2 | 12/2017 | Kim et al. | |
| 10,432,219 B2 | 10/2019 | Zheng et al. | |
| 11,277,153 B2* | 3/2022 | Jin ..................... | H03M 13/6362 |
| 2004/0093549 A1 | 5/2004 | Song et al. | |
| 2004/0186992 A1 | 9/2004 | Matsumoto | |
| 2006/0077947 A1 | 4/2006 | Kim et al. | |
| 2006/0156183 A1 | 7/2006 | Kim et al. | |
| 2009/0204868 A1 | 8/2009 | Park et al. | |
| 2010/0058139 A1 | 3/2010 | Wang et al. | |
| 2010/0257425 A1 | 10/2010 | Yue et al. | |
| 2011/0289375 A1 | 11/2011 | Jiang et al. | |
| 2012/0240001 A1 | 9/2012 | Abu-Surra et al. | |
| 2014/0223254 A1 | 8/2014 | Pisek | |
| 2014/0229789 A1 | 8/2014 | Richardson | |
| 2014/0344639 A1 | 11/2014 | Kyung et al. | |
| 2016/0087648 A1 | 3/2016 | Korb et al. | |
| 2016/0094246 A1 | 3/2016 | Vasista Srinivasan Ranganathan et al. | |
| 2016/0173132 A1 | 6/2016 | Cho | |
| 2016/0218750 A1 | 7/2016 | Ma | |
| 2016/0345028 A1 | 11/2016 | Kim et al. | |
| 2017/0149528 A1 | 5/2017 | Kim et al. | |
| 2017/0222660 A1 | 8/2017 | Li et al. | |
| 2017/0230058 A1 | 8/2017 | Xu et al. | |
| 2018/0198466 A1 | 7/2018 | Chiu et al. | |
| 2018/0294822 A1 | 10/2018 | Shinohara et al. | |
| 2018/0323801 A1 | 11/2018 | Hsu et al. | |
| 2019/0229751 A1 | 7/2019 | Kim et al. | |
| 2019/0245654 A1 | 8/2019 | Richardson et al. | |
| 2019/0288708 A1 | 9/2019 | Ma et al. | |
| 2019/0393890 A1 | 12/2019 | Montorsi et al. | |

FOREIGN PATENT DOCUMENTS

| | | |
|---|---|---|
| CN | 101162907 A | 4/2008 |
| CN | 101515839 A | 8/2009 |
| CN | 100539442 C | 9/2009 |
| CN | 101662290 A | 3/2010 |
| CN | 101834613 A | 9/2010 |
| CN | 102315911 A | 1/2012 |
| CN | 102412842 A | 4/2012 |
| CN | 104333390 A | 2/2015 |
| CN | 104518847 A | 4/2015 |
| CN | 104521147 A | 4/2015 |
| CN | 104821831 A | 8/2015 |
| CN | 104868925 A | 8/2015 |
| CN | 104917536 A | 9/2015 |
| CN | 105075128 A | 11/2015 |
| CN | 105827251 A | 8/2016 |
| CN | 106685586 A | 5/2017 |
| CN | 106849958 A | 6/2017 |
| CN | 104168030 B | 11/2017 |
| CN | 108173621 A | 6/2018 |
| EP | 1596501 B1 | 4/2009 |
| JP | 2006157926 A | 6/2006 |
| JP | 2010517444 A | 5/2010 |
| JP | 6820438 B2 | 1/2021 |
| KR | 20090087386 A | 8/2009 |
| KR | 20150118992 A | 10/2015 |
| RU | 2310274 C1 | 11/2007 |
| RU | 2443053 C2 | 2/2012 |
| WO | 2010057407 A1 | 5/2010 |
| WO | 2014127140 A1 | 8/2014 |
| WO | 2016126202 A1 | 8/2016 |
| WO | 2018082290 A1 | 5/2018 |

OTHER PUBLICATIONS

R.G. Gallager, "Low-Density Parity-Check Codes," IRE Transactions on Information Theory, total 8 pages (1962).
R1-1709189 Nokia et al.,"Performance of LDPC design for eMBB," 3GPP TSG RAN WG1 Meeting #89, Hangzhou, P.R. China, total 4 pages (May 15-19, 2017).
3GPP TS 38.212 V0.0.0, "3rd Generation Partnership Project; Technical Specification Group Radio Access Network; NR; Multiplexing and channel coding (Release 15)," total 10 pages (May 2017).
Panyuh Joo et al.,"LDPC coding for OFDMA PHY," IEEE 802.16 Broadband Wireless Access Working Group, IEEE C802.16d-04/86r1, total 12 pages (May 1, 2004).
Huawei et al.,"LDPC design for eMBB data," 3GPP TSG RAN WG1 Meeting #89, R1-1706970, Hangzhou, China, total 11 pages (May 15-19, 2017).
Huawei et al.,"Performance evaluation of LDPC codes," 3GPP TSG RAN WG1 Meeting #89, R1-1706971,Hangzhou, China, total 12 pages (May 15-19, 2017).
Huawei et al.,"Throughput of LDPC codes," 3GPP TSG RAN WG1 Meeting #89, R1-1706972, Hangzhou, China, total 7 pages (May 15-19, 2017).
Huawei et al.,"Rate matching for LDPC codes," 3GPP TSG RAN WG1 Meeting #89, R1-1706973, Hangzhou, China, total 4 pages (May 15-19, 2017).
Nokia et al.,"WF on Candidate LDPC Base Matrices," 3GPP TSG RAN WG1 Meeting #89, R1-1709751, Hangzhou, China, with "Simulation results for LDPC codes," Prepared by Zeng Xin,total 33 pages (May 15-19, 2017).
Huawei et al.,"LDPC design for base graph 1," 3GPP TSG RAN WG1 Meeting AH#2, R1-1711436, Qingdao, P.R. China, total 4 pages (Jun. 27-30, 2017).
Huawei et al.,"LDPC design for base graph 2," 3GPP TSG RAN WG1 Meeting AH#2, R1-1711437, Qingdao, P.R. China, total 4 pages (Jun. 27-30, 2017).
Huawei et al., "Rate matching for LDPC codes," 3GPP TSG RAN WG1 NR Ad-Hoc#2, R1-1711438, Qingdao, China, total 6 pages (Jun. 27-30, 2017).
Nokia et al.,"Summary of [89-24] Email discussion on LDPC code base graph #1 for NR," 3GPP TSG RAN WG1 NR Ad-Hoc #2, R1-1711545, Qingdao, P.R. China, total 4 pages (Jun. 27-30, 2017).
Nokia et al.,"Summary of [89-25] Email discussion on LDPC code base graph #2 for NR," 3GPP TSG RAN WG1 NR Ad-Hoc #2, R1-1711546, Qingdao, P.R. China, total 3 pages (Jun. 27-30, 2017).

(56) References Cited

OTHER PUBLICATIONS

Huawei et al.,"LDPC design for base graph 1," 3GPP TSG RAN WG1 Meeting AH#2, R1-1711727, Qingdao, P.R. China, total 4 pages (Jun. 27-30, 2017).
Nokia et al., "WF on LDPC parity check matrices," 3GPP TSG RAN WG1 NR AH #2, R1-1711982, Qingdao, China, total 2 pages (Jun. 27-30, 2017).
Xiangyun Chen, "Elementary Transformation of Matrix and Its Application", Journal of Higher Correspondence Education (Natural Sciences),vol. 25, No. 2 (Mar. 2012). with a machine translation, total 8 pages.
Huawei: "R1-1711437_PCMs for BG2," pp. 1-10, retrieved from the internet: https://www.3gpp.org/ftp/tsg_ran/WG1_RL1/TSGR1_AH/NR_AH_ 1706/Docs/R1-1711437.zip, XP055695142 (Jun. 27, 2017).
"3rd Generation Partnership Project; Technical Specification Group Radio Access Network; NR; Multiplexing and channel coding {Release 15)," 3GPP TS 38.212 V0.0.1, pp. 1-23, XP051336737 (Jul. 2017).
Mediatek Inc: "On NR LDPC design and performance," 3GPP TSG-RAN WG1 Meeting NR#2, R1-1710829, Qingdao, CN, total 6 pages, XP051300033 (Jun. 27-30, 2017).
ZTE: "R1-1710846, Shift coefficient design for BG2," pp. 1-8, retrieved from the internet:https://www.3gpp.org/ftp/tsg_ran/wg1_rl1/TSGR1_AH/NR_AH_1706/Docs/R1-1710846.zip, XP055694976 (Jun. 20, 2017).
Huawei et al., "LDPC design for eMBB data," 3GPP TSG RAN WG1 Meeting #88bis, R1-1704250, Spokane, USA, total 6 pages, XP051242402 (Apr. 3-7, 2017).
Mediatek Inc: "A multi-codebook embedded compact QC-LDPC design," 3GPP TSG-RAN WG1 NR, R1-1704457, Spokane, USA, total 10 pages, XP051242602 (Apr. 3-7, 2017).
MediaTek Inc.,"High Performance LDPC code Features," 3GPP TSG-RAN WG1 NR, R1-1701470, total 17 pages (Jan. 16-20, 2017).
Mediatek Inc., "On design and performance of NR eMBB LDPC Code," 3GPP TSG-RAN WG1, Meeting #89 R1-1709856, total 14 pages (May 15-19, 2017).
CATT, "LDPC design for eMBB data," 3GPP TSG RAN WG1 WG1 NR Ad-Hoc#2, R1-1710046, total 4 pages (Jun. 27-30, 2017).
Nokia et al: "LDPC Basegraph 2 / R1-1711546—Summary of [89-25] email discussion," XP055698232, pp. 1-1 (Jun. 19, 2017).
Weidu Wu et al: "LDPC merged BG2.xlsx," XP055698448, 3GPP TSG_RAN_WG1 Archives, pp. 1-12 (Jun. 15, 2017).
Keeth Jayasinghe, "Candidates for base matrix 2 final.xlsx," XP055698522, pp. 1-8 (Jun. 14, 2017).
"Design of LDPC Codes for NR," 3GPP TSG RAN WG1 Meeting #87, Reno, USA, R1-1611321, total 11 pages, 3rd Generation Partnership Project, Valbonne, France (Nov. 14-18, 2016).
"Length compatibility of LDPC," 3GPP TSG RAN WG1 Meeting #86bis, Lisbon, Portugal, R1-1609242, total 4 pages, 3rd Generation Partnership Project, Valbonne, France (Oct. 10-14, 2016).
"Shift coefficient design for base graph #2," 3GPP TSG RAN WG1 NR Ad-Hoc#2, Qingdao, P.R. China, R1-1710846, pp. 1-3, 3rd Generation Partnership Project, Valbonne, France (Jun. 27-30, 2017).
"LDPC Codes Design for eMBB data channel," 3GPP TSG RAN WG1 NR ad-hoc, Spokane, USA, R1-1700518, Total 6 pages, 3rd Generation Partnership Project, Valbonne, France (Jan. 16-20, 2017).
CATT, "LDPC design for eMBB data," 3GPP TSG RAN WG1 WG1 NR Ad-Hoc#2, Qingdao, P.R. China, R1-1710046, total 4 pages, 3rd Generation Partnership Project, Valbonne, France (Jun. 27-30, 2017).
LG Electronics, "LDPC Codes Design for eMBB data channel," 3GPP TSG RAN WG1 #89, Hangzhou, China, R1-1709641, total 6 pages, 3rd Generation Partnership Project, Valbonne, France (May 15-19, 2017).
1. U.S. Appl. No. 17/013,640, filed Sep. 6, 2020.
2. U.S. Appl. No. 16/423,175, filed May 28, 2019.

* cited by examiner

FIG. 3b-8 though the LDPC code has a higher throughput than a conventional Turbo code. The LDPC code may be used as an error correction code in a communication system, so as to improve reliability and power utilization in channel-based transmission. The LDPC code may also be widely used in spatial communications, optical fiber communications, personal communication systems, asymmetrical digital subscriber loop (ADSL), magnetic recording devices, and the like. Currently, the LDPC code has been considered as one of channel coding schemes in the fifth generation (5G) mobile communication systems.

METHOD AND APPARATUS FOR LOW DENSITY PARITY CHECK CHANNEL CODING IN WIRELESS COMMUNICATION SYSTEM

CROSS REFERENCE TO RELATED APPLICATIONS

This application is a continuation of U.S. patent application Ser. No. 17/013,640, filed on Sep. 6, 2020, which is a continuation of U.S. patent application Ser. No. 16/423,175, filed on May 28, 2019 (now U.S. Pat. No. 10,771,092), which is a continuation of International Application No. PCT/CN2018/082851, filed on Apr. 12, 2018. The International Application claims priority to Chinese Patent Application No. 201710503056.2, filed on Jun. 27, 2017 and Chinese Patent Application No. 201710572364.0, filed on Jul. 13, 2017. All of the afore-mentioned patent applications are hereby incorporated by reference in their entireties.

TECHNICAL FIELD

Embodiments of the present application relate to the communications field, and in particular, to an information processing method and a communication apparatus.

BACKGROUND

Information transmitted in a wireless communication channel is usually encoded by a channel coding scheme such as Turbo code, Polar code and low density parity check (LDPC) code. LDPC code is a type of linear block code characterized by a sparse check matrix (referred to as a LDPC matrix), and has a flexible structure and low decoding complexity. Because a partially parallel iterative decoding algorithm can be used in decoding an LDPC coded codeword, the LDPC code has a higher throughput than a conventional Turbo code. The LDPC code may be used as an error correction code in a communication system, so as to improve reliability and power utilization in channel-based transmission. The LDPC code may also be widely used in spatial communications, optical fiber communications, personal communication systems, asymmetrical digital subscriber loop (ADSL), magnetic recording devices, and the like. Currently, the LDPC code has been considered as one of channel coding schemes in the fifth generation (5G) mobile communication systems.

In actual applications, LDPC matrices having different special structures may be used. An LDPC matrix H, having a special structure, may be obtained by expanding (also called lifting) an LDPC base matrix having a quasi-cycle (QC) structure (H is referred to as a QC-LDPC matrix). A coding scheme using QC-LDPC matrices is suitable for hardware with a high degree of parallelism, and provides a higher throughput. The QC-LDPC matrix may be designed to be suitable for channel coding.

SUMMARY

Embodiments of the present application provide an information processing method, and a communication apparatus and system, so as to support encoding and decoding of information bit sequences with a plurality of lengths.

According to a first aspect, an encoding method and an encoder are provided. The encoder encodes an input sequence by using a low density parity check (LDPC) matrix.

According to a second aspect, a decoding method and a decoder are provided. The decoder decodes an input sequence by using an LDPC matrix.

In a first implementation of the first aspect or the second aspect, the LDPC matrix is obtained based on a lifting factor Z and a base matrix.

The base matrix of a base graph includes one of the following:

1. the base matrix includes row 0 to row 6, column 0 to column 16 of one of matrices shown in FIG. 3$b$-1 to 3$b$-8, or 2. the base matrix includes row 0 to row 6, some columns of column 0 to column 16 in one of matrices shown in FIG. 3$b$-1 to 3$b$-8, or 3. the base matrix is a matrix obtained by performing row/column transformation on row 0 to row 6 column 0 to column 16 in one of matrices shown in FIG. 3$b$-1 to 3$b$-8, or 4. the base matrix is a matrix obtained by performing row/column transformation on row 0 to row 6, some columns of column 0 to column 16 in one of matrices shown in FIGS. 3$b$-1 to 3$b$-8.

To support different code block lengths, different lifting factors Z are needed for an LDPC code. Based on the foregoing implementations, base matrices corresponding to different lifting factors Z are used based on the different lifting factors Z. In some implementations, $Z=a \times 2^j$, where $0 \leq j < 7$, and a□{2, 3, 5, 7, 9, 11, 13, 15}.

Further, based on the foregoing implementations, the LDPC matrix may be obtained based on a lifting factor Z and a matrix Hs that is obtained by offsetting the foregoing base matrix. Alternatively, the LDPC matrix may be obtained based on a lifting factor Z and a matrix that is obtained by performing row/column transformation on a matrix Hs, and Hs is obtained by offsetting the foregoing base matrix. The offsetting the foregoing base matrix may be increasing or decreasing a shift value greater than or equal to 0 in one or more columns by an offset.

The base graph and the base matrix of the LDPC matrix in the foregoing implementations can satisfy a performance requirement of code blocks of a plurality of block lengths.

The lifting factor Z may be determined by the encoder or the decoder based on a length K of the input sequence, or may be determined by another device and provided to the encoder or the decoder as an input parameter. Optionally, the LDPC matrix may be obtained based on the obtained lifting factor Z and a base matrix corresponding to the lifting factor Z.

In a second implementation of the first aspect or the second aspect, the LDPC matrix is obtained based on the lifting factor Z and parameter(s) of the LDPC matrix.

The parameters of the LDPC matrix may include a row index, a column index of a column in which a non-zero-element is located, and a shift value of the non-zero-element. The parameters are stored in manners like row 0 to row 6 in one of Table 2 and Table 3b-1 to Table 3b-8. The parameters of the LDPC matrix may further include a row weight. Locations of non-zero-elements in columns are in a one-to-one correspondence with shift values of the non-zero-elements.

For a communication device at a transmitting side, the encoding an input sequence by using an LDPC matrix may include: encoding the input sequence by using an LDPC matrix corresponding to the lifting factor Z; or encoding an input sequence by using a matrix that is obtained by performing row/column transformation on an LDPC matrix corresponding to the lifting factor Z. The row/column transformation in this application means row transformation, column transformation, or row transformation and column transformation.

For a communication device at a receive side, the decoding an input sequence by using an LDPC matrix may include: decoding the input sequence by using an LDPC matrix corresponding to the lifting factor Z; or decoding the input sequence by using a matrix that is obtained by performing row/column transformation on an LDPC matrix corresponding to the lifting factor Z. The row/column transformation in this application means row transformation, column transformation, or row transformation and column transformation.

In a possible implementation, an LDPC matrix may be stored, and the LDPC matrix is used to encode the input sequence, or an LDPC matrix that can be used for encoding is obtained by performing transformation (row/column transformation) or lifting based on the LDPC matrix.

In another possible implementation, a parameter or parameters may be stored, and an LDPC matrix used for encoding or decoding may be obtained based on the parameter, so that the input sequence can be encoded or decoded based on the LDPC matrix. The parameter or parameters include at least one of the following: a base graph, a base matrix, a transformed matrix obtained by performing row/column transformation on a base graph or a base matrix, a lifting matrix based on a base graph or a base matrix, a shift value of a non-zero-element in a base matrix, or any parameter used to obtain the LDPC matrix.

In still another possible implementation, the base matrix of the LDPC matrix may be stored in a memory.

In yet another possible implementation, the base graph of the LDPC matrix may be stored in a memory, and the shift value of the non-zero-element in the base matrix of the LDPC matrix may be stored in the memory.

In still yet another possible implementation, the parameter of the LDPC matrix is stored in a memory in manners like Table 2 or Table 3b-1 to Table 3b-8, or some element groups of the parameter may be stored.

Based on the foregoing possible implementations, in a possible design, at least one of a base graph and a base matrix used for LDPC encoding or decoding is obtained by performing row transformation, or column transformation, or row transformation and column transformation on at least one of the base graph and the base matrix of the LDPC matrix.

According to a third aspect, a communication apparatus is provided. The communication apparatus may include software modules and/or hardware components configured to perform the foregoing method designs.

In a possible design, the communication apparatus provided in the third aspect includes a processor and a transceiver component. The processor and the transceiver component may be configured to perform any one of the possible implementations of the encoding method or the decoding method. The communication apparatus may be a terminal, a base station, or another network device, and the transceiver component of the communication apparatus may be a transceiver. The communication apparatus may be a baseband chip or a baseband board, and the transceiver component of the communication apparatus may be an input/output circuit of the baseband chip or the baseband board, and is configured to receive/send an input/output signal. Optionally, the communication apparatus may further include a memory, configured to store data and/or an instruction.

In an implementation, the processor may include the encoder according to the first aspect and a determining unit. The determining unit is configured to determine a lifting factor Z required to encode an input sequence. The encoder is configured to encode the input sequence by using an LDPC matrix corresponding to the lifting factor Z.

In another implementation, the processor may include the decoder according to the second aspect and an obtaining unit. The obtaining unit is configured to obtain a soft value of an LDPC code and a lifting factor Z. The decoder is configured to decode the soft value of the LDPC code based on a base matrix HB corresponding to the lifting factor Z, to obtain an information bit sequence.

According to a fourth aspect, a communication apparatus is provided. The communication apparatus includes one or more processors. In a possible design, the one or more processors configured to perform any one of the possible implementations of the encoder according to the first aspect. In another possible design, the encoder according to the first aspect may be a part of the processor. In addition to the functions of the encoder according to the first aspect, the processor can further implement other functions. In a possible design, the one or more processors can implement functions of the decoder according to the second aspect. In another possible design, the decoder according to the second aspect may be a part of the processor.

Optionally, the communication apparatus may further include a transceiver and an antenna.

Optionally, the communication apparatus may further include a component for transport block cyclic redundancy check (CRC), a component for code block segmentation and CRC check, an interleaver for interleaving, a modulator for modulation processing, or the like. In a possible design, functions of these components may be implemented by using the one or more processors.

Optionally, the communication apparatus may further include a demodulator for a demodulation operation, a deinterleaver for deinterleaving, a component for rate de-matching, or the like. Functions of these devices may be implemented by using the one or more processors.

According to a fifth aspect, an embodiment of the present application provides a communication system. The system includes the communication apparatus according to the third aspect.

According to a sixth aspect, an embodiment of the present application provides a communication system. The system includes one or more communication apparatuses according to the fourth aspect.

According to still another aspect, an embodiment of the present application provides a computer storage medium. The computer storage medium stores a program, and when the program is run, a computer is caused to perform the methods described in the foregoing aspects.

Yet another aspect of this application provides a computer program product including an instruction, when the instruction is run on a computer, the computer is caused to perform the methods according to the foregoing aspects.

According to the information processing method, the apparatus, the communication device, and the communication system in the embodiments of the present application, flexible code length and code rate requirements of a system can be met in terms of encoding performance and an error floor.

BRIEF DESCRIPTION OF DRAWINGS

FIGS. 3b-1 to 3b-8 are base matrices according to embodiments of the present application;

FIG. 4 is a performance diagram provided by an embodiment of the present application;

FIG. 5 is a flowchart of an information processing procedure according to an embodiment of the present application;

FIG. 6 is a flowchart of an information processing procedure according to an embodiment of the present application;

FIG. 7 is a simplified block diagram of a communication apparatus according to an embodiment of the present application; and FIG. 8 is a block diagram of a communication system according to an embodiment of the present application.

DETAILED DESCRIPTION OF EMBODIMENTS

For ease of understanding, the following describes some terms used in this application.

In this application, terms "network" and "system" are often interchangeably used, "apparatus" and "device" are often interchangeably used, and "information" and "data" are also often interchangeably used. Means of these terms are conventionally understood. A "communication apparatus" may refer to a chip (for example, a baseband chip, a digital signal processing chip, or a general-purpose chip), a terminal, a base station, or other network devices. The article "a" or "an" is intended to indicate one or more.

A terminal is a device having communication functions. A terminal may be a handheld device, an in-vehicle device, a wearable device, or other kinds of devices that have wireless communication functions. A terminal may be called by different names in different networks, such as user equipment, mobile station, subscriber unit, station, cellular phone, personal digital assistant, wireless modem, wireless communication device, handheld device, laptop computer, cordless telephone set, or wireless local loop station. For ease of description, these devices are collectively referred to as a terminal in this application.

A base station or a base station device is a device deployed in a radio access network to provide wireless communication functions. The base station may be called by different names in different wireless access systems. For example, a base station in a Universal Mobile Telecommunications System (UMTS) network is referred to as a NodeB. A base station in a long term evolution (LTE) network is referred to as an evolved NodeB (eNB or eNodeB). A base station in a new radio (NR) network is referred to as a transmission reception point (TRP) or a next generation NodeB (gNB). Base stations in other networks may be called by other names. This is not limited in the present application.

The technical solutions in the embodiments of the present application are described below with reference to the accompanying drawings.

Figure 1:
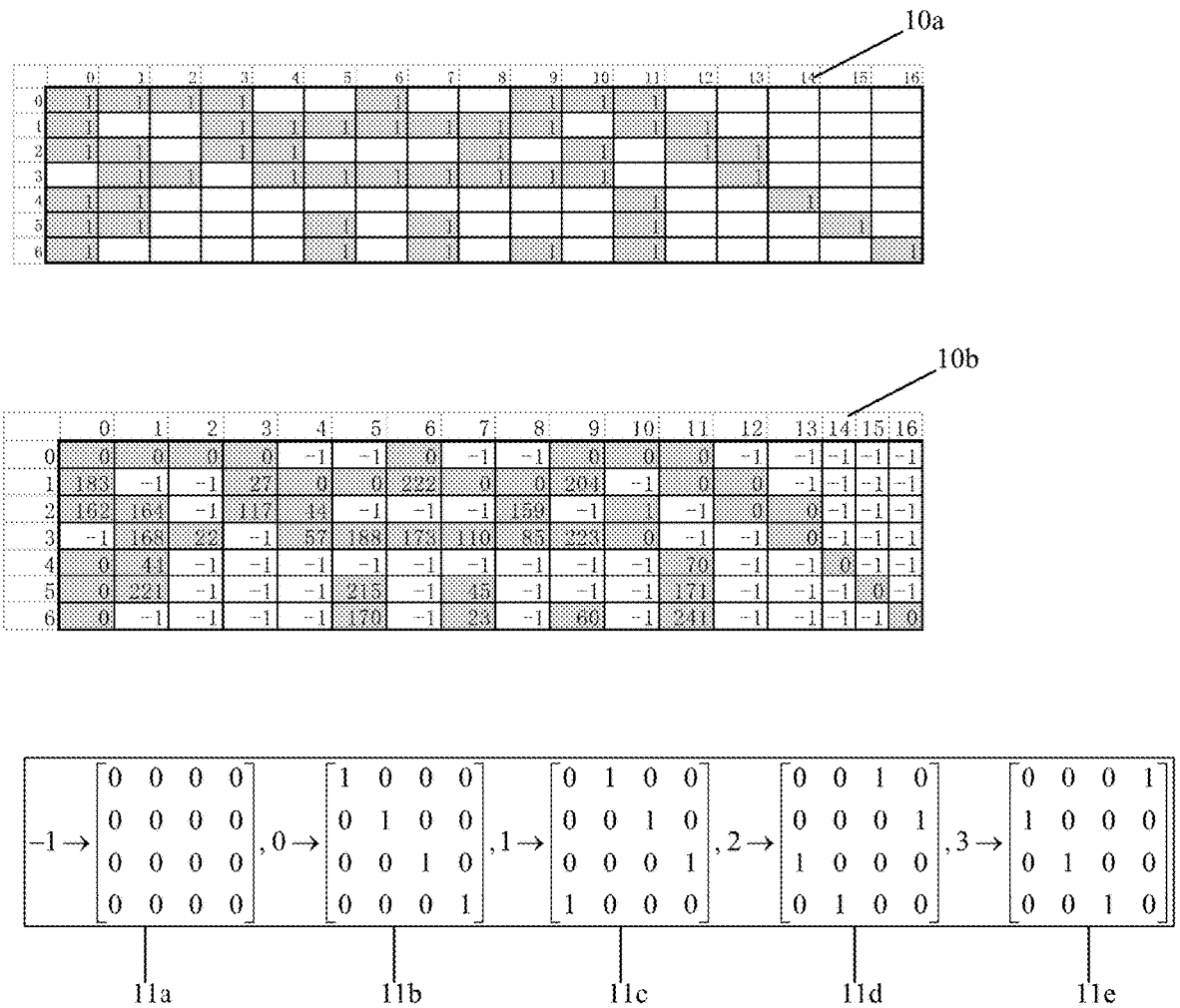
FIG. 1 shows examples of a base graph, a base matrix, and circular permutation matrices that are used in LDPC code.

An LDPC code can be defined by a parity check matrix H. In an implementation, the parity check matrix H for LDPC code, also referred to as a LDPC matrix, is represented by a matrix called a base graph. An example of the base graph 10a is shown in FIG. 1. Each element in the base graph 10a represents a Z×Z spreading (lifting) matrix. Z is a positive integer, and is referred to as a lifting factor. Z may also be referred to as a lifting size or the like. The base graph is used to indicate locations of zero-elements and non-zero-elements. Each non-zero-element in the base graph 10a corresponds to a shift value, as shown in FIG. 1, matrix 10b. The parity check matrix H for the LDPC code may be obtained based on the base graph and shift values. Usually, a base graph includes mxn matrix elements (also called entries), and is represented by a matrix of m rows and n columns. A value of each matrix element is either 0 or 1. An element whose value is 0 is called a zero-element, which corresponds to a Z column x Z row all-zero matrix. An element whose value is 1 is called a non-zero-element, which corresponds to a Z column x Z row circular permutation matrix. In other words, each element of the base graph represents either an all zero matrix or a circular permutation matrix. In the base graph example 10a shown in FIGS. 1, m=7 and n=17, and the base graph 10a has a QC structure.

It should be noted that, throughout this application, row indexes and column indexes of base graphs and base matrices are numbered starting from 0, and this is merely for ease of description. For example, column index 0 represents a first column in a base graph or a base matrix, column index 1 represents a second column in the base graph or the base matrix, row index 0 represents a first row in the base graph or the base matrix, row index 1 represents a second row in the base graph or the base matrix, and so on.

It should be understood that the rows and the columns of the base graph or the base matrix may be numbered by other manners, and the present application is not limited by any particular manner of numbering.

A base matrix of m rows and n columns (which is sometimes referred to as a parity check matrix (PCM)) may be specifically defined. Matrix 10b in FIG. 1 is a particular example of the base matrix. Elements in the base matrix 10b are in a one-to-one correspondence with elements in the base graph 10a. A zero-element in the base graph 10a has a same position in the base matrix 10b. In the base matrix 10b, a zero-element is represented by −1 or "null". A non-zero-element in row i and column j, whose value is 1 in the base graph 10a, corresponds to a non-zero element at a same position in the base matrix 10b. The non-zero-element is represented by a value $V_{i,j}$. $V_{i,j}$ may be defined by a system, may be predefined, or may be obtained based on a shift value $P_{i,j}$ and a lifting factor Z. $P_{i,j}$ is a shift value corresponding to a predetermined or a particular lifting factor Z. $P_{i,j}$ may be obtained based on Z and $V_{i,j}$. In an implementation, $P_{i,j}$ and $V_{i,j}$ satisfy the following relationship:

$$P_{i,j} = \mathrm{mod}(V_{i,j}, Z)$$

where i and j represent a row index and a column index of the non-zero element, and indicate a location of the element in the base matrix.

In the embodiments of this application, sometimes the base matrix is also referred to as a shift matrix of the base graph. The base matrix may be obtained according to the base graph and the shift value. If an element in row i and column j of the base graph has a value 1, and a shift value of the element is $P_{i,j}$, where $P_{i,j}$ is an integer greater than or equal to 0, it indicates that the element can be replaced by a Z×Z circular permutation matrix corresponding to $P_{i,j}$. The circular permutation matrix may also be referred to as a shift matrix. The circular permutation matrix may be obtained by circularly shifting a Z×Z identity matrix to the right or to the left for $P_{i,j}$ times. In an implementation, $$P_{i,j} = \mathrm{mod}(V_{i,j}, Z)$$

where $V_{i,j}$ is a value in the base matrix, that is corresponding to a non-zero-element in the base graph.

Sometimes, $V_{i,j}$ may also be referred to as a shift value, a cyclic shift value, or a shift coefficient. $V_{i,j}$ may be, for example, a shift value corresponding to a maximum lifting factor $Z_{max}$. $Z_{max}$ is a maximum value in a value set of Z. If a value of an element in row i and column j in the base graph is 0, the element may be replaced with a Z×Z all zero matrix. If a value of an element in row i and column j in the base graph is 1, the element may be replaced with a Z×Z circular permutation matrix having the shift value of $P_{i,j}$. In this way, a parity check matrix H for the LDPC code is obtained.

Z is a positive integer, and may be referred to as a lifting factor, a lifting size, or the like. Z may be determined based on a code block size and an information data size that are supported by a system. It can be seen that for a base graph of m rows×n columns, a size of the parity check matrix H for the LDPC code is (m×Z) rows x(n×Z) columns. For example, if the lifting factor Z is 4, each zero-element is replaced with an all zero matrix of size 4×4 (see 11a of FIG. 1). If $P_{2,3}$=2, a non-zero-element in row 2 and column 3 of the base matrix is replaced with a 4×4 circular permutation matrix 11d of FIG. 1. The matrix 11d is obtained by circularly shifting a 4×4 identity matrix 11b rightward twice. If $P_{2,4}$=0, a non-zero-element in row 2 and column 4 is replaced with the identity matrix 11b. It should be noted that, this example is merely for illustration, and is not intended to impose a limitation.

Value of $P_{i,j}$ may depend on the lifting factor Z. For an element of 1 (a non-zero element) in row i and column j of the base graph, $P_{i,j}$ may be different for different lifting factors Z. For example, for a value of 1 in row 1 and column 3 in the base graph 10a, a corresponding shift value $V_{i,j}$ in row 1 and column 3 in the base matrix 10b is 27. The value of $P_{i,j}$ may be obtained according to $P_{i,j}$=mod($V_{i,j}$,Z). In this way, an element in row 1 and column 3 can be replaced with a circular permutation matrix that is obtained by circularly shifting an identity matrix of size Z×Z rightward or leftward for $P_{i,j}$ times.

Usually, the base graph or the base matrix for the LDPC code may further include p columns of built-in puncture column, where p may be an integer from 0 to 2. These columns may be used in encoding, but the encoded system bits corresponding to the built-in puncture columns are not sent. In this case, a code rate of the base matrix for the LDPC code satisfies R=(n–m)/(n–p). Using the base graph 10a as an example, if there are two built-in puncture columns, the code rate is (17–7)/(17–2)=0.667, which is approximately ⅔.

As mentioned above, an LDPC code used in a wireless communication system is a QC-LDPC code. A parity bit part of the QC-LDPC code has a bi-diagonal structure or a raptor-like structure. This can simplify encoding and support incremental redundancy hybrid repeat. A decoder for the QC-LDPC code usually uses a QC-LDPC shift network (QSN), a Banyan network, or a Benes network, to cyclical shift information.

Figure 2:
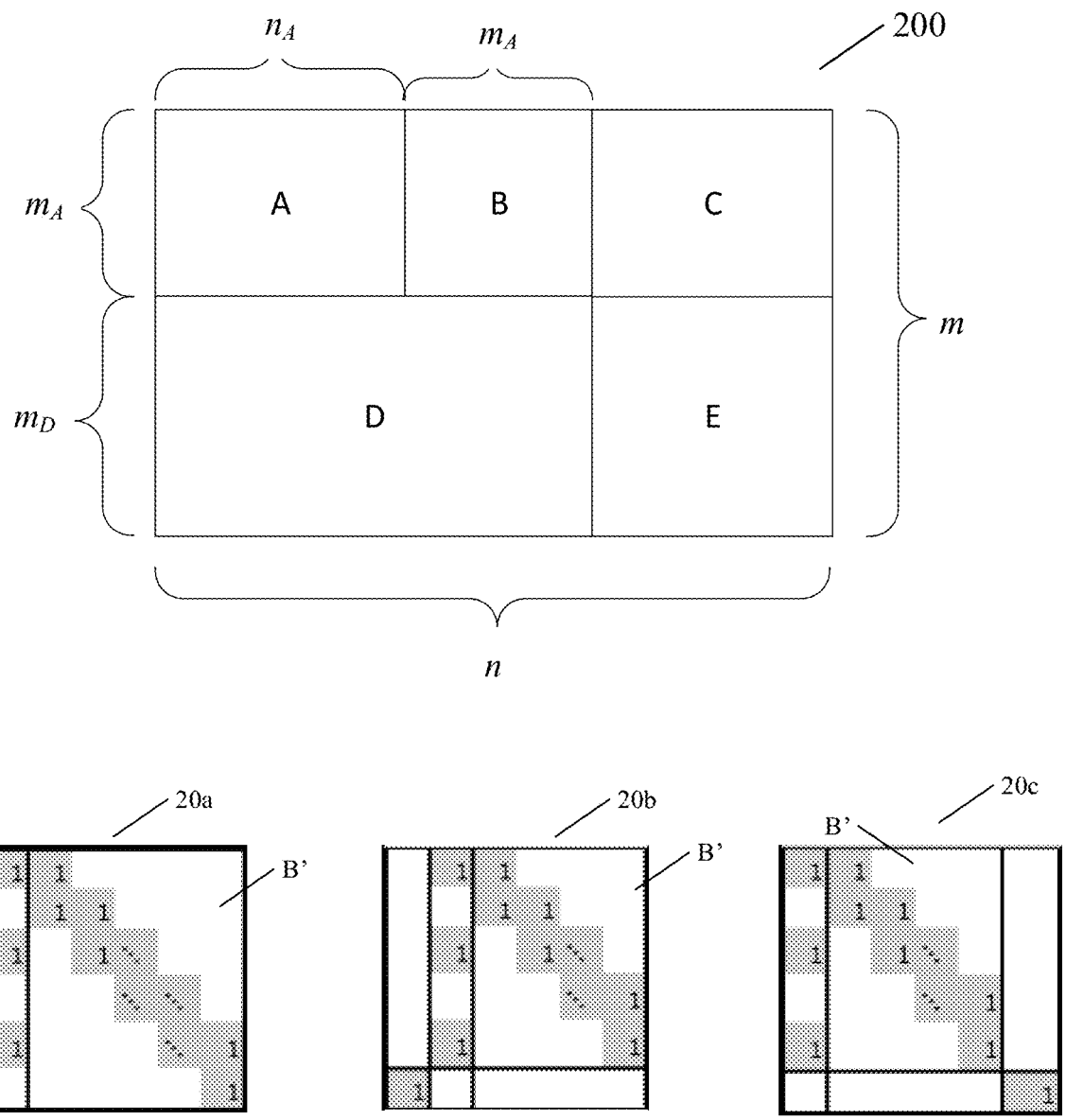
FIG. 2 is a schematic structural diagram of a base graph and examples of a core part of the base graph.

As shown in FIG. 2, a base graph 200 for the QC-LDPC code, which has a raptor-like structure, is a matrix of m rows and n columns. The base graph 200 may include five submatrices A, B, C, D, and E. A weight of a row or a column of the matrix is determined by quantity of non-zero-elements in the row or the column. A weight of a row (row weight) means a quantity of non-zero-elements in a row, and a weight of a column (column weight) means a quantity of non-zero-elements in a column. The following is shown in base graph 200 of FIG. 2:

The submatrix A is a matrix of $m_A$ rows and $m_A$ columns, and a size of the submatrix A is $m_A \times n_A$. Each column corresponds to Z system bits in the LDPC code, and a system bit is sometimes referred to as an information bit.

The submatrix B is a matrix of $m_A$ rows and $m_A$ columns, and a size of the submatrix B is $m_A \times m_A$. Each column corresponds to Z parity bits in the LDPC code. Further shown in 20a of FIG. 2, the submatrix B includes a submatrix B' having a bi-diagonal structure and a matrix column whose column weight is 3 (weight-3 column for short). The weight-3 column may be located at the left side of the submatrix B'. The submatrix B may further include one or more matrix columns whose column weights are 1 (weight-1 column for short). 20b and 20c of FIG. 2 are examples of possible locations of the weight-1 columns.

Usually, a matrix generated based on the submatrices A and B may be referred to as a core matrix, which may be used to support high code-rate encoding.

The submatrix C is an all zero matrix, and a size of the submatrix C is $m_A \times m_D$.

The submatrix E is an identity matrix, and a size of the submatrix E is $m_D \times m_D$, where $m_D = m - m_A$.

A size of the submatrix D is $m_D \times (n_A + m_A)$, and may usually be used to generate low code-rate parity bits.

Because the submatrices C and E have relatively definite structures, structures of the three submatrices A, B, and D are some of the factors affecting encoding/decoding performance of the LDPC code.

The foregoing describes the structure of the base graph/the base matrix from a perspective of principles. The division of the submatrices A, B, C, D, and E is merely to facilitate understanding from the perspective of principles. It may be understood that the division of the submatrices A, B, C, D, and E is not limited to the foregoing division manner. In an implementation, C is an all zero matrix, E is an identity matrix, and structures of C and E are known. Therefore, an LDPC matrix may be represented in a simplified form without using all of the submatrices A, B, C, D, and E. For example, the LDPC matrix may be represented in a simplified form by the submatrices A, B, and D, by the submatrices A, B, C, and D, or by the submatrices A, B, D, and E. In another implementation, because the submatrix B includes one or more weight-1 columns, for the one or more weight-1 columns in the submatrix B, a structure is relatively definite. Therefore, the one or more weight-1 columns may not be used to represent the LDPC matrix. For example, the submatrix A, some columns in the submatrix B, and corresponding columns in the submatrix D may be used to represent the LDPC matrix.

When an LDPC matrix having the raptor-like structure is used for encoding, a possible implementation is that the part of the matrix including the submatrices A and B, namely a core matrix, may first be used in encoding to obtain one or more parity bits corresponding to the submatrix B. Then, the entire LDPC matrix is used in encoding to obtain one or more parity bits corresponding to the submatrix E. Because the submatrix B may include a submatrix B' with bi-diagonal structure and one or more weight-1 columns, during encoding, parity bits corresponding to the submatrix B' may be first obtained, and parity bits corresponding to the weight-1 columns may be then obtained.

An example of an encoding scheme is provided below. Assuming that the core matrix including the submatrices A and B is $H_{core}$. The matrix B has a structure of 20c in FIG. 2. A last row and a last column of the $H_{core}$ are removed. In other words, a weight-1 column and a row in which the non-zero-element in the weight-1 column is located are removed from the $H_{core}$ to obtain a matrix $H_{core\text{-}dual}$. Parity bits part of the $H_{core\text{-}dual}$ is represented as $H_e = [H_{e1}\ H_{e2}]$, where $H_{e1}$ is a weight-3 column, and Het has a bi-diagonal structure. According to a definition of the LDPC matrix, $H_{core\text{-}dual}[S\ P_e]^T = 0$, where S is an input sequence and is represented by a vector of information bits, $P_e$ is a vector of parity bits, and $[S\ P_e]^T$ represents a transposed matrix formed by the input sequence S and $P_e$. Therefore, parity bits corresponding to $H_{core\text{-}dual}$ may be first calculated based on the input sequence S and $H_{core\text{-}dual}$, where the input sequence S includes all information bits. Then, parity bits corresponding to the one or more weight-1 columns in the submatrix B are calculated based on the parity bits corresponding to $H_{core\text{-}dual}$ and the input sequence S. In this case, all parity bits corresponding to the submatrix B may be obtained. Parity bits corresponding to the submatrix E are obtained by encoding the submatrix D based on the input sequence S and the parity bits corresponding to the submatrix B, to obtain all information bits and all parity bits. These bits constitute an encoded sequence, namely, an LDPC codeword.

The LDPC code may further include a shortening operation or a puncturing operation on the encoded sequence. The shortened bits or punctured bits are not sent.

Shortening is usually performed starting from the last bit of the information bits, and may be performed in different manners. For example, if a quantity of shortened bits is so, the last so bits in the input sequence S may be set as known bits, for example, set to 0, null, or other value, to obtain an input sequence S'. Then, the input sequence S' is encoded by using an LDPC matrix. For another example, the last ($s_0$ mod Z) bits in the input sequence S may alternatively be set as known bits, for example, set as zero, null, or some other value, to obtain an input sequence S'. The last $[s_0/Z]$ columns in the submatrix A are deleted to obtain an LDPC matrix H', and the input sequence S' is encoded by using the LDPC matrix H'; or the last $[s_0/Z]$ columns in the submatrix A do not participate in encoding of the input sequence S'. After the encoding, the shortened bits are not sent.

Puncturing may be performed on built-in puncture bit(s) or parity bit(s) in the input sequence. Puncturing parity bit(s) is/are usually performed starting from the last bit in the parity bits. Alternatively, puncturing parity bit(s) may be performed according to a preset puncturing order of the system. A possible implementation is as follows: The input sequence is first encoded, and then, last p bits in the parity bits is/are selected based on a quantity p of bits that need to be punctured, or p bits is/are selected based on the preset puncturing order of the system. The p bits is/are not sent. In another possible implementation, alternatively, p columns in a matrix that correspond to the punctured bits and p rows in which nonzero elements in the columns are located may be determined. These rows and columns do not participate in encoding, and no corresponding parity bits are generated.

It should be noted that the encoding implementation described herein is merely an example, and other conventionally known encoding implementations may alternatively be used based on the base graph and/or the base matrix provided in embodiments of this application. This is not limited in this application. Decoding in this application may be performed in a plurality of decoding methods, for example, a min-sum (MS) decoding method or a belief propagation decoding method may be used. The MS decoding method is sometimes referred to as a Flood MS decoding method. For example, the input sequence is initialized and then iteration processing is performed. Hard decision detection is performed after the iteration, and a check is performed on a hard decision result. If a decoding result satisfies a check equation, the decoding succeeds, the iteration ends, and the decision result is output. If the decoding result does not satisfy the check equation, iteration processing is performed again within a maximum quantity of iterations. If a check still does not pass when the maximum quantity of iterations is reached, the decoding fails. A principle of the MS decoding is conventionally known, and details are not described herein.

It should be noted that the decoding method described herein is merely an example, and other known decoding methods may alternatively be used based on the base graph and/or the base matrix provided in this application. The decoding method is not limited in this application.

Figure 3A:
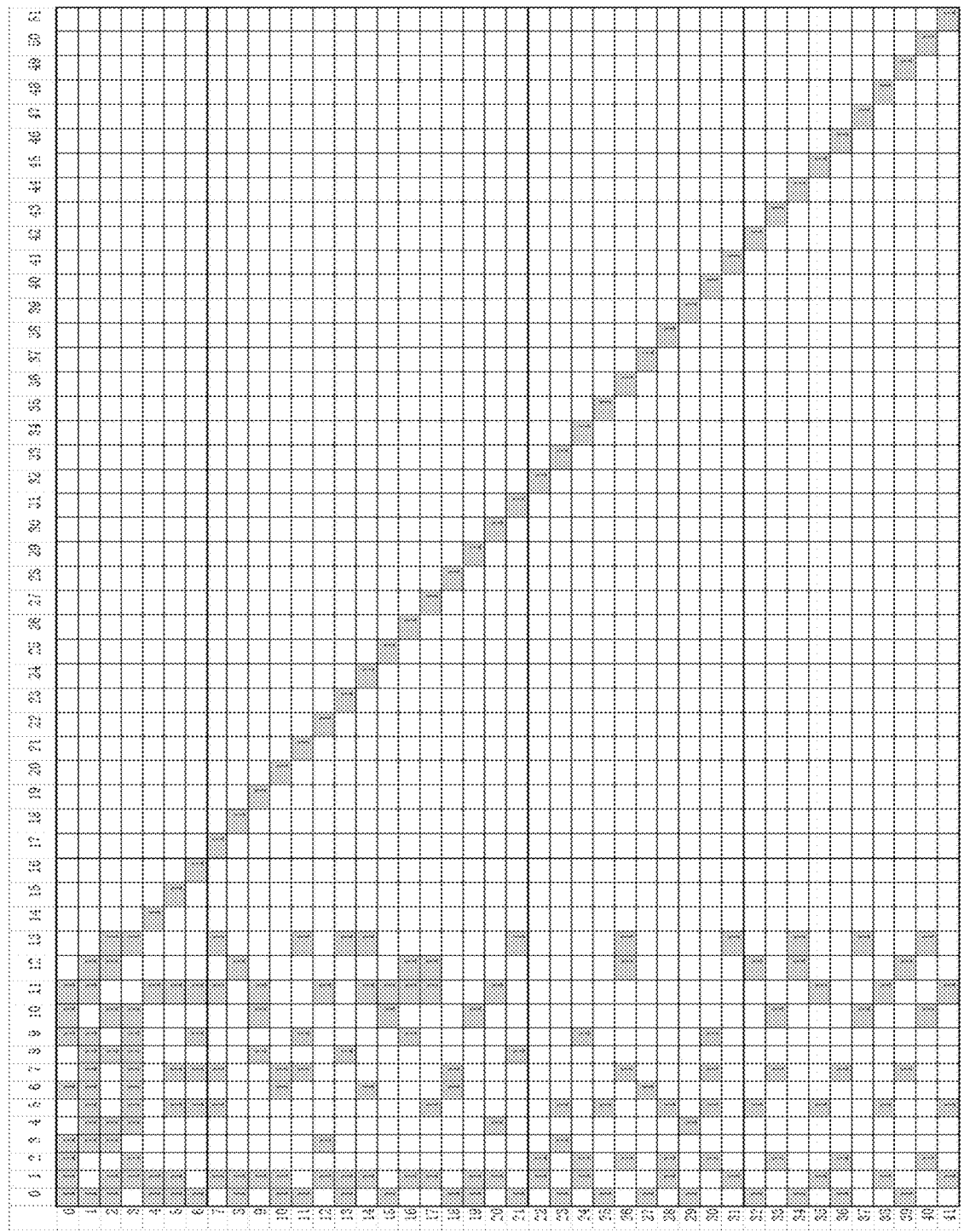
FIG. 3a is a base graph according to an embodiment of the present application.

An LDPC codeword is obtained depending on the design of a base graph or a base matrix. For example, a performance upper limit of an LDPC code may be determined by performing density evolution on the base graph or the base matrix. An error floor of the LDPC code is determined based on a shift value in the base matrix. The encoding or decoding performance can be improved and the error floor can be lowered by properly designing the base graph or the base matrix. In the wireless communication systems, code length is flexible, for example, 2560 bits or 38400 bits. FIG. 3a shows an example of a base graph for an LDPC code. FIGS. 3b-1 to 3b-8 show examples of base matrices corresponding to the base graph in FIG. 3a. The base matrices may satisfy performance requirements of a plurality of block lengths. For ease of description and understanding, column indexes and row indexes are respectively shown on the uppermost side and the leftmost side in FIG. 3a and FIGS. 3b-1 to 3b-8.

Similar to FIG. 1, elements in base matrices in FIGS. 3b-1 to 3b-8 are in a one-to-one correspondence with the base graph in FIG. 3a, respectively. A zero-element in the base graph of FIG. 3a has a same position in any one of the base matrices in FIGS. 3b-1 to 3b-8. In the base matrices, a zero-element is represented by the value of −1 or "null". A non-zero-element in row i and column j, whose value is 1 in the base graph of FIG. 3a, corresponds to a non-zero element at a same position in any one of the base matrices. The non-zero-element is represented by a value $V_{i,j}$. $V_{i,j}$ may be defined by a system, may be predefined, or may be obtained based on a shift value $P_{i,j}$ and a lifting factor Z. $P_{i,j}$ is a shift value corresponding to a predetermined or a particular lifting factor Z. $P_{i,j}$ may be obtained based on Z and $V_{i,j}$. In an implementation, $P_{i,j}$ and $V_{i,j}$ satisfy the following relationship:

$$P_{i,j} = \mathrm{mod}(V_{i,j}, Z)$$

where i and j represent a row index and a column index of the non-zero element, and indicate a location of the element in the any one of the base matrices. $V_{i,j}$ may be, for example, a shift value corresponding to a maximum lifting factor $Z_{max}$. $Z_{max}$ is a maximum value in a value set of Z. A zero-element the element in the base matrix may be replaced with a Z×Z all zero matrix. A non-zero-element may be replaced with a Z×Z circular permutation matrix having the shift value of $P_{i,j}$. In this way, a parity check matrix H for the LDPC code is obtained.

Figures 1, 3B:
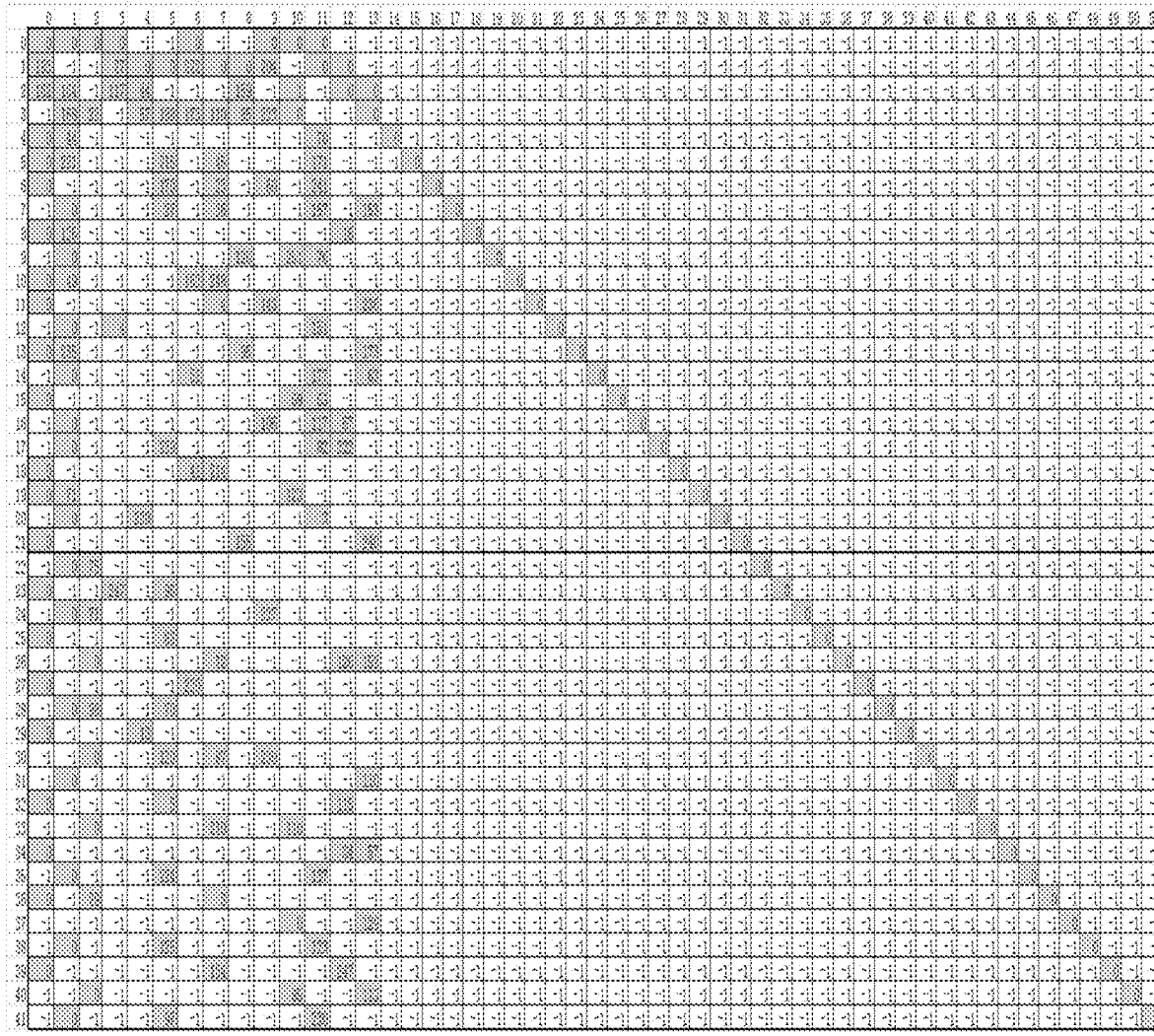
Figures 2, 3B:
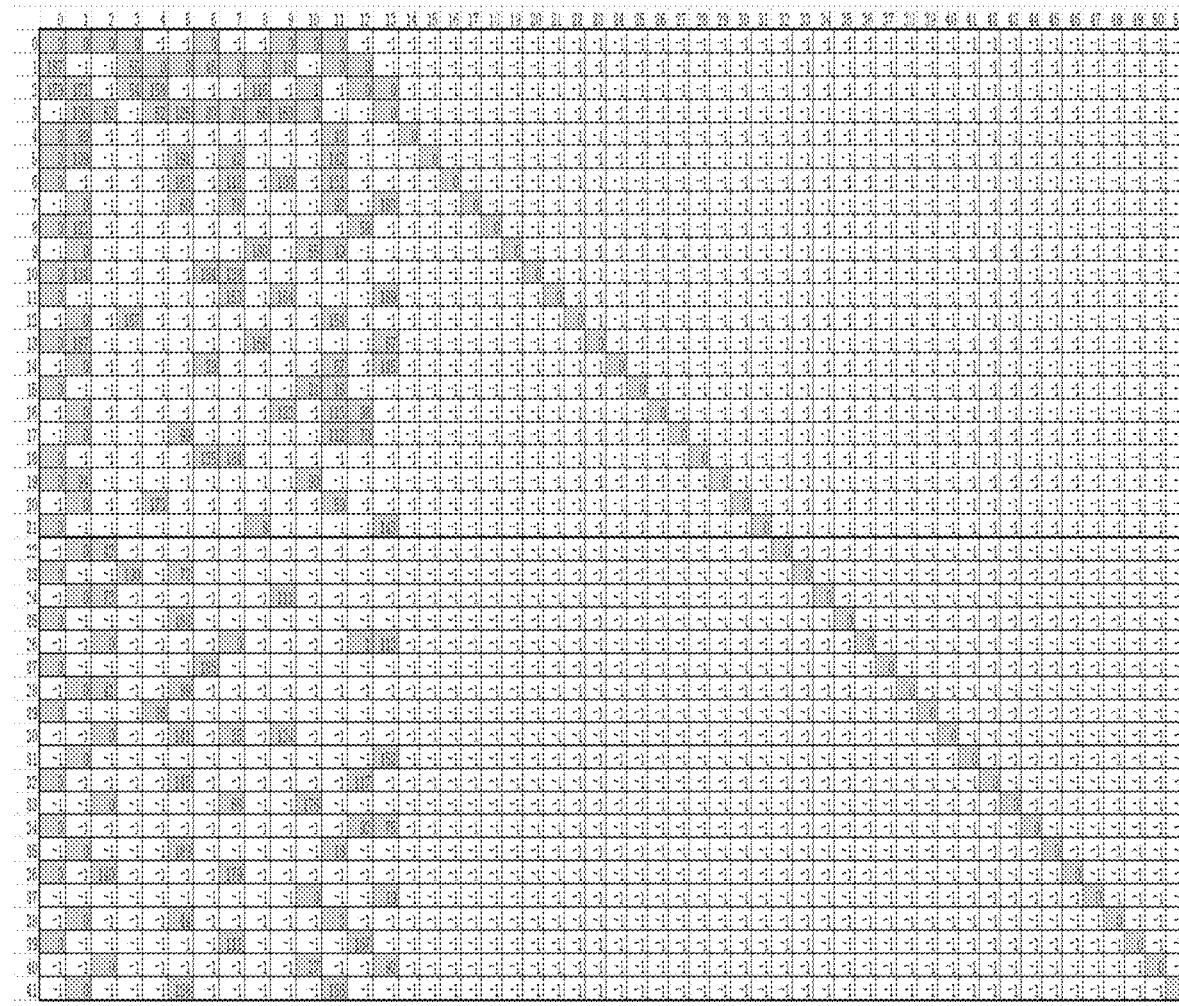
Figures 3, 3B:
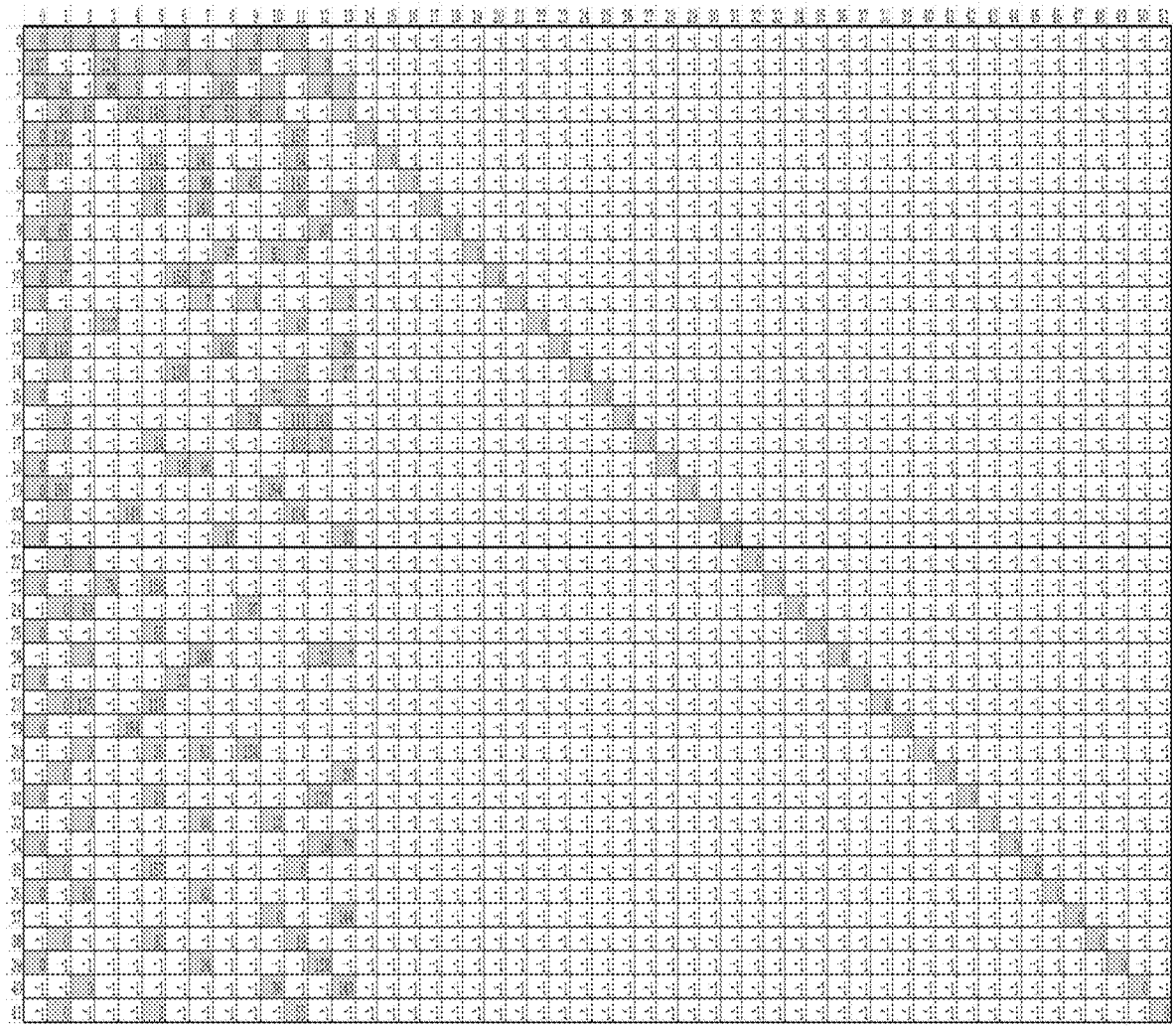
Figures 3, 3B, 4:
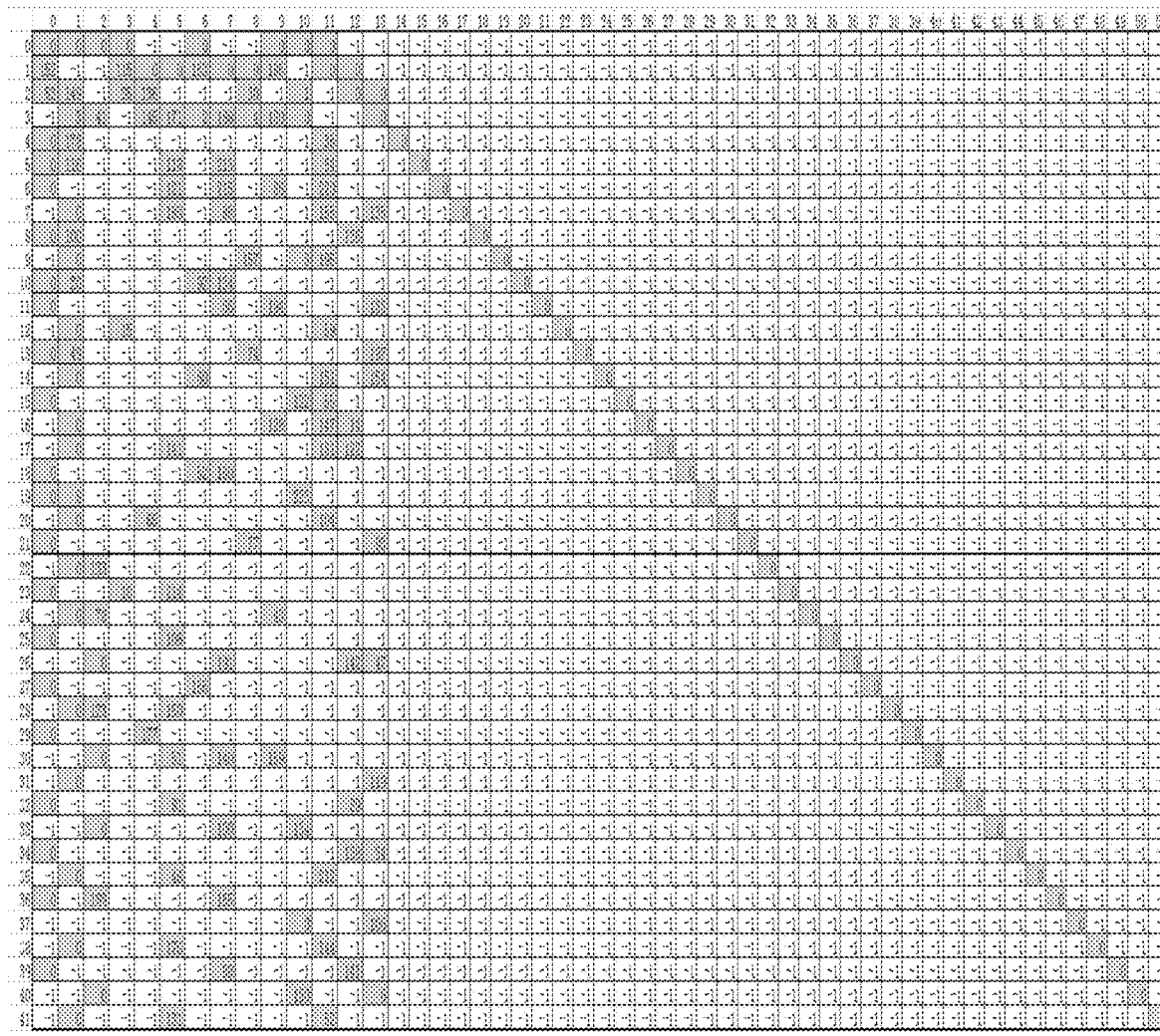

FIG. 4 is a schematic performance diagram of an LDPC code shown in FIG. 3a. In the performance diagram shown in FIG. 4, encoding performance curves using any one of matrices shown in FIGS. 3b-1 to 3b-8 are shown. The horizontal coordinate represents a length of an information bit sequence in units of bits, and the vertical coordinate is a signal-to-noise ratio (Es/N0) for a symbol required to reach a corresponding block error rate (BLER). Two lines of each code rate correspond to two BLERs 0.01 and 0.0001. For a same code rate, 0.01 is corresponding to an upper curve, and 0.0001 is corresponding to a lower curve. If the curves are smooth, it indicates that the matrix has relatively high performance in cases of different block lengths.

In the base graph of FIG. 3a, numbers 0 to 51 in the uppermost row are column indexes, and correspond to column 0 to column 51 of the base graph, respectively. Numbers 0 to 41 in the leftmost column are row indexes, and correspond to row 0 to row 41 of the base graph, respectively. That is, the base graph has a size of 42 rows and 52 columns.

As mentioned above, a combination of the submatrix A and the submatrix B may be considered as a core matrix of the base graph for the LDPC code, and the core matrix may be used for high code-rate encoding. As shown in FIG. 3a, a matrix of 7 rows and 17 columns in the upper corner of the base graph may be considered as the core matrix of the base graph. The core matrix includes the submatrix A and the submatrix B. The submatrix A is a matrix of 7 rows and 10 columns, and is constituted by row 0 to row 6 and column 0 to column 9 of the base matrix in FIG. 3a. The submatrix B is a matrix of 7 rows and 7 columns, and is constituted by row 0 to row 6 and column 10 to column 16 of the base matrix in FIG. 3a.

In another implementation, a matrix constituted by 7 rows and 14 columns, or a matrix constituted by 7 rows and 15 columns, or a matrix constituted by 7 rows and 16 columns, at an upper left corner in the base graph shown in FIG. 3a, may be considered as the core part. In other words, in the base graph shown in FIG. 3a, a matrix constituted by row 0 to row 6 and column 0 to column 13, or a matrix constituted by row 0 to row 6 and column 0 to column 14, or a matrix constituted by row 0 to row 6 and column 0 to column 15, may be considered as the core part. Correspondingly, a part in any one of the matrices shown in FIGS. 3b-1 to 3b-8 that corresponds to a core part in the base graph of FIG. 3a may alternatively be considered as a core part.

In an implementation, the submatrix A may include one or more built-in puncture columns. For example, the submatrix A may include two built-in puncture columns. In this case, after the puncturing, a code rate that can be supported by the core matrix is ⅔. The submatrix B may include one weight-1 column. To be specific, a column weight of the first column in the submatrix B is 3 (column 10 in the core matrix). A column weight of the second column in the submatrix B is 5 (column 11 in the core matrix). The second column to the fourth column (column 11 to column 13 in the core matrix) and row 0 to row 3 in the submatrix B are of a bi-diagonal structure, where column weights of the third column and the fourth column (column 12 and column 13 in the core matrix) are 2. The submatrix B further includes three weight-1 columns (column 14 to column 16 in the core matrix).

In an implementation, the submatrix A may correspond to system bits, sometimes is also referred to as information bits, and has a size of $m_A$ rows and 10 columns, where $m_A$=5. The submatrix A is constituted by elements in row 0 to row 4 and column 0 to column 9 in the base graph in FIG. 3a.

In an implementation, the submatrix B may correspond to parity bits, and have a size of $m_A$ rows and $m_A$ columns. The submatrix B is constituted by elements in row 0 to row 6 and column 10 to column 16 in the base graph in FIG. 3a.

To obtain a flexible code rate, the submatrix C, the submatrix D, and the submatrix E of corresponding sizes may be added based on the core matrix, to obtain different code rates. Because the submatrix C is a zero matrix, the submatrix E is an identity matrix, and sizes of the submatrices are mainly determined based on the code rates, structures are relatively fixed. The encoding/decoding performance is mainly affected by the core matrix and the submatrix D. Rows and columns are added based on the core matrix, to form corresponding parts C, D, and E, thereby obtaining different code rates.

A quantity $m_D$ of columns in the submatrix D is a sum of quantities of columns in the submatrix A and the submatrix B. A quantity of rows in the submatrix D is mainly related to a code rate. Using the base graph in FIG. 3a as an example, the submatrix D has 17 columns. If a code rate supported by the LDPC code is $R_m$, the base graph or the base matrix for the LDPC code has m rows and n columns, where $n=n_A/R_m+p$, $m=n-n_A=n_A/R_m+p-n_A$, and p is the quantity of built-in puncture columns. The code rate supported by the LDPC code may be obtained based on the formula. If a lowest code rate is $R_m$=⅓ and the quantity p of built-in puncture columns is 2, in the example of the base graph in FIG. 3a as an example, n=52, m=42, and a quantity $m_D$ of rows in the submatrix D may be up to $m-m_A$=42−7=35, so that $0 \le m_D \le 35$.

Using the base graph in FIG. 3a as an example, the submatrix D may include $m_D$ rows in row 7 to row 41 in the base graph.

In this application, if there is at most one non-zero-element in each column for two adjacent rows in the base graph, the two rows are orthogonal. In other columns different from some columns for two adjacent rows in the base graph, if there is at most one non-zero-element in each column of the other columns for two adjacent rows, the two adjacent rows are quasi-orthogonal. For example, for two adjacent rows, in each column other than the built-in puncture columns, if there is only one non-zero-element, it may be considered that the two adjacent rows are quasi-orthogonal.

Row 7 to row 41 in the base graph in FIG. 3a may include a plurality of rows in a quasi-orthogonal structure and at least two rows in an orthogonal structure. For example, row 32 and row 33 in the base graph in FIG. 3a are orthogonal, row 34 and row 35 are orthogonal, and rows 36, 37, and 38 are orthogonal. For any two adjacent rows, in other columns different from the built-in puncture column, if there is at most one non-zero-element in each column, the two adjacent rows satisfy a quasi-orthogonal structure. If the built-in puncture columns are included, there is at most one non-zero-element in any one of columns, the two adjacent rows satisfy an orthogonal structure.

If $m_D$=15, the submatrix D in the base graph of the LDPC code has 15 rows and 17 columns, and may be a matrix constituted by row 7 to row 21 and column 0 to column 16 in the base graph of FIG. 3a. A corresponding code rate supported by the LDPC code may be obtained based on the foregoing calculation formula.

The submatrix E is an identity matrix of 15 rows and 15 columns, and the submatrix C is an all zero matrix of 7 rows and 15 columns.

If $m_D$=19, the submatrix D in the base graph of the LDPC code has 19 rows and 17 columns, and may be a matrix constituted by row 7 to row 25 and column 0 to column 16 in the base graph of FIG. 3a. A corresponding code rate supported by the LDPC code may be obtained based on the foregoing calculation formula. At this code rate, the base graph of the LDPC code is corresponding to a matrix constituted by row 0 to row 25 and column 0 to column 16 in the base graph of FIG. 3a. The submatrix E is an identity matrix of 16 rows and 16 columns, and the submatrix C is an all zero matrix of 7 rows and 16 columns. The same is true if $m_D$ is other value, details are not described.

In a design, row/column permutation may be performed on the base graph and/or the base matrix. Row/column permutation maybe row permutation, column permutation, or row permutation and column permutation. The row/column permutation does not change a row weight or a column weight, and does not change a quantity of non-zero-elements either. Therefore, a base graph and/or a base matrix obtained by performing row/column permutation have/has limited impact on system performance. As a whole, the impact on the system performance due to the row/column permutation is acceptable and is within a tolerance range. For example, the performance decreases within a tolerance range in some scenarios or in some ranges, while in some scenarios or in some ranges, the performance improves to some extent, and overall performance is not greatly affected.

For example, row 34 and row 36 of the base graph in FIG. 3a may be interchanged, and column 44 and column 45 may be interchanged. For another example, the submatrix D includes $m_D$ rows in a matrix F. Row interchange may not be performed on the $m_D$ rows, or row interchange may be performed on one or more of the $m_D$ rows. The submatrix E is still of a diagonal structure, and no row interchange or column interchange is performed on the submatrix E. For example, row interchange is performed on row 27 and row 29 in the matrix F. The submatrix D includes the $m_D$ rows in the matrix F, and the submatrix E is still of a diagonal structure. It may be understood that if the base graph or the base matrix includes the submatrix D, when column interchange is performed on the core matrix, column interchange needs to be performed correspondingly on the submatrix D.

Matrices shown in FIGS. 3b-1 to 3b-8 are examples of the base matrices corresponding to the base graph in FIG. 3a. A location of a non-zero-element in row i and column j in the base graph in FIG. 3a is the same as that in the matrices shown in FIGS. 3b-1 to 3b-8. A shift value of the non-zero-element is $V_{i,j}$. A zero-element is represented as a value −1 or null in the base matrix. A corresponding part of the submatrix D in the base matrix may include $m_D$ rows in row 7 to row 41 in any one of the base matrices and values of $m_D$ may be selected based on different code rates. It may be understood that if the base graph is a matrix obtained by performing row/column transformation on the base graph in FIG. 3a, accordingly, the base matrix is a corresponding matrix obtained by performing row/column transformation.

In a possible design, because structures of the submatrices C and E are relatively fixed, the base graph/the base matrix of the LDPC code may be represented by using the submatrices A, B, and D, that is, row 0 to row 41 and column 0 to column 16 in any of the matrix shown in FIG. 3a or FIGS. 3b-1 to 3b-8.

In a possible design, because column 14 to column 51 have relatively definite structure, the base graph/the base matrix of the LDPC code may be represented in a simplified form by using row 0 to row 41 and column 0 to column 13 in any of the matrix shown in FIG. 3a or FIGS. 3b-1 to 3b-8.

In a possible design, the base graph/the base matrix of the LDPC code may be represented by using row 0 to row 41 and column 0 to column 13 plus some of column 14 to column 51 in any of the matrix shown in FIG. 3a or FIGS. 3b-1 to 3b-8. For example, the base graph/the base matrix of the LDPC code may be represented by using row 0 to row 41 and column 0 to column 15 or row 0 to row 41 and column 0 to column 14 in any of the matrices shown in FIG. 3a or FIGS. 3b-1 to 3b-8.

In a possible design, the base matrix of the LDPC code may include row 0 to row 6 and column 0 to column 16 in any one of the matrices shown in FIGS. 3b-1 to 3b-8. In this case, a matrix constituted by row 0 to row 6 and column 0 to column 16 in any one of the matrices shown in FIGS. 3b-1 to 3b-8 may be used as a core part of the base matrix. In this design, a structure of another part, for example, submatrices C, D, and E, of the base matrix of the LDPC code is not limited. For example, any structure shown in FIGS. 3b-1 to 3b-8 or another matrix design may be used.

In another possible design, the base matrix of the LDPC code may include a matrix constituted by row 0 to row m-1 and column 0 to column n-1 in any one of the matrices shown in FIGS. 3b-1 to 3b-8, where 7≤m≤42, m is an integer, 18≤n≤52, and n is an integer.

In this design, a structure of another part of the base matrix of the LDPC code is not limited. For example, any structure shown in FIGS. 3b-1 to 3b-8 or another matrix design may be used.

In still another possible design, the base matrix of the LDPC code may include row 0 to row 6 and some columns of column 0 to column 16 in any one of the matrices shown in FIGS. 3b-1 to 3b-8. For example, the core part (row 0 to row 6 and column 0 to column 16) of the matrices shown in FIGS. 3b-1 to 3b-8 may be shortened and/or punctured. In an implementation, the base matrix of the LDPC code may not include column(s) corresponding to shortened and/or punctured bit(s).

In this design, other part of the base matrix of the LDPC code is not limited. For example, a structure shown in FIGS. 3b-1 to 3b-8 may be used, and other structures may be used as well.

In still another possible design, the base matrix of the LDPC code may include a matrix constituted by row 0 to row m-1 and some columns of column 0 to column n-1 in any one of the matrices shown in FIGS. 3b-1 to 3b-8, where 7≤m≤42, m is an integer, 18≤n≤52, and n is an integer. For example, shortening operation and/or puncturing operation may be performed on row 0 to row m-1 and column 0 to column n-1 of any one of matrices shown in FIGS. 3b-1 to 3b-8. In an implementation, the base matrix of the LDPC code may not include the column(s) corresponding to the shortened and/or punctured bit(s). In this design, other part of the base matrix of the LDPC code is not limited. For example, a structure shown in any of FIGS. 3b-1 to 3b-8 may be used, and other structures may be used as well.

In an implementation, the shortening operation may be shortening information bits. Using any one of the matrices shown in FIGS. 3b-1 to 3b-8 as an example, one or more columns of column 0 to column 9 are shortened. In this case, the base matrix of the LDPC code may not include the one or more shortened columns in any one of the matrices shown in FIGS. 3b-1 to 3b-8. For example, if column 9 is shortened, the base matrix of the LDPC code may include column 0 to column 8 and column 10 to column 16 in any one of the matrices in FIGS. 3b-1 to 3b-8.

In another implementation, the puncturing operation may be puncturing parity bits. Using any one of the matrices shown in FIGS. 3b-1 to 3b-8 as an example, one or more columns of column 10 to column 16 are punctured. In this case, the base matrix of the LDPC code may not include the one or more punctured columns in any one of the matrices shown in FIGS. 3b-1 to 3b-8. For example, if column 16 is punctured, the base matrix of the LDPC code may include column 0 to column 15 in any one of the matrices shown in FIGS. 3b-1 to 3b-8.

To support different block lengths, the LDPC code needs different lifting factors Z. In a possible design, different base matrices may be used for different lifting factors, to achieve relatively high performance. For example, the lifting factor is $Z=a\times 2^j$, where $0\leq j<7$ and $a\in\{2, 3, 5, 7, 9, 11, 13, 15\}$. Table 1A shows a possibly supported lifting factor set $\{2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384\}$. Each of cells except for the uppermost row and the leftmost column represents a value of Z corresponding to values of corresponding a and j. For example, for a column a=2 and a row j=1, Z is 4. For another example, for a=11 and j=3, Z is 88. By analogy, details are not described.

TABLE 1A

| Z | a = 2 | a = 3 | a = 5 | a = 7 | a = 9 | a = 11 | a = 13 | a = 15 |
|---|---|---|---|---|---|---|---|---|
| j = 0 | 2 | 3 | 5 | 7 | 9 | 11 | 13 | 15 |
| j = 1 | 4 | 6 | 10 | 14 | 18 | 22 | 26 | 30 |
| j = 2 | 8 | 12 | 20 | 28 | 36 | 44 | 52 | 60 |
| j = 3 | 16 | 24 | 40 | 56 | 72 | 88 | 104 | 120 |
| j = 4 | 32 | 48 | 80 | 112 | 144 | 176 | 208 | 240 |
| j = 5 | 64 | 96 | 160 | 224 | 288 | 352 | | |
| j = 6 | 128 | 192 | 320 | | | | | |
| j = 7 | 256 | 384 | | | | | | |

It may be understood that Table 1A merely shows a form of describing a lifting factor set. Actual product implementation is not limited to the form in Table 1A, and the lifting factors may have another representation form.

For example, each a value is corresponding to a set of lifting factor. The lifting factor set may be identified by a set index. For example, Table 1B shows another representation form of lifting factor set.

TABLE 1B

| Set index | Set of lifting factors |
|---|---|
| 1 | {2, 4, 8, 16, 32, 64, 128, 256} |
| 2 | {3, 6, 12, 24, 48, 96, 192, 384} |
| 3 | {5, 10, 20, 40, 80, 160, 320} |
| 4 | {7, 14, 28, 56, 112, 224} |
| 5 | {9, 18, 36, 72, 144, 288} |
| 6 | {11, 22, 44, 88, 176, 352} |
| 7 | {13, 26, 52, 104, 208} |
| 8 | {15, 30, 60, 120, 240} |

The lifting factor set supported by the base graph may include all lifting factors or some lifting factors in Table 1A or Table 1B. For example, the lifting factor set may be $\{24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384\}$. In other words, Z is greater than or equal to 24. For another example, the lifting factor set may be a union set of $\{24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384\}$ and one or more of $\{2, 3, 4, 5, 6, 7, 8, 9, 10, 11, 12, 13, 14, 15, 16, 18, 20, 22\}$. It should be noted that this is merely an example herein. The lifting factor set supported by the base graph may be divided into different subsets based on a value of a. For example, if a=2, a subset of lifting factors Z may include one or more of $\{2, 4, 8, 16, 32, 64, 128, 256\}$; for another example, if a=3, a subset of lifting factors Z may include one or more of $\{3, 6, 12, 24, 48, 96, 192, 384\}$; and so on.

The lifting factor set supported by the base graph may be divided based on different values of a, and a corresponding base matrix is determined.

If a=2 or a value of the lifting factor Z is one of $\{2, 4, 8, 16, 32, 64, 128, 256\}$, the base matrix may include the row 0 to row 6 and column 0 to column 16 in any one of the matrices shown in FIGS. 3b-1 to 3b-8; or the base matrix includes row 0 to row m-1 and column 0 to column n-1 in a matrix shown in FIG. 3b-1, where $7\leq m\leq 42$, m is an integer, $17\leq n\leq 52$, and n is an integer; or the base matrix includes row 0 to row m-1 and some columns of column 0 to column n-1 in a matrix shown in FIG. 3b-1, where $7\leq m\leq 42$, m is an integer, $17\leq n\leq 52$, and n is an integer.

If a=3 or a value of the lifting factor Z is one of $\{3, 6, 12, 24, 48, 96, 192, 384\}$, the base matrix may include row 0 to row 6 and column 0 to column 16 in a matrix shown in FIG. 3b-2; or the base matrix includes row 0 to row m-1 and column 0 to column n-1 in a matrix shown in FIG. 3b-2, where $7\leq m\leq 42$, m is an integer, $17\leq n\leq 52$, and n is an integer; or the base matrix includes row 0 to row m-1 and some columns of column 0 to column n-1 in a matrix shown in FIG. 3b-2, where $7\leq m\leq 42$, m is an integer, $17\leq n\leq 52$, and n is an integer.

For example, a base matrix PCM includes row 0 to row 41 and column 0 to column 13, or column 0 to column 14, or column 0 to column 15 in FIG. 3b-2.

If a=5 or a value of the lifting factor Z is one of $\{5, 10, 20, 40, 80, 160, 320\}$, the base matrix may include row 0 to row 6 and column 0 to column 16 in a matrix shown in FIG. 3b-3; or the base matrix includes row 0 to row m-1 and column 0 to column n-1 in a matrix shown in FIG. 3b-3, where $7\leq m\leq 42$, m is an integer, $17\leq n\leq 52$, and n is an integer; or the base matrix includes row 0 to row m-1 and some columns of column 0 to column n-1 in a matrix shown in FIG. 3b-3, where $7\leq m\leq 42$, m is an integer, $17\leq n\leq 52$, and n is an integer.

If a=7 or a value of the lifting factor Z is one of $\{7, 14, 28, 56, 112, 224\}$, the base matrix may include row 0 to row 6 and column 0 to column 16 in a matrix shown in FIG. 3b-4; or the base matrix includes row 0 to row m-1 and column 0 to column n-1 in a matrix shown in FIG. 3b-4, where $7\leq m\leq 42$, m is an integer, $17\leq n\leq 52$, and n is an integer; or the base matrix includes row 0 to row m-1 and some columns of column 0 to column n-1 in a matrix shown in FIG. 3b-4, where $7\leq m\leq 42$, m is an integer, $17\leq n\leq 52$, and n is an integer.

If a=9 or a value of the lifting factor Z is one of $\{9, 18, 36, 72, 144, 288\}$, the base matrix may include row 0 to row 6 and column 0 to column 16 in a matrix shown in FIG. 3b-5; or the base matrix includes row 0 to row m-1 and column 0 to column n-1 in a matrix shown in FIG. 3b-5, where $7\leq m\leq 42$, m is an integer, $17\leq n\leq 52$, and n is an integer; or the base matrix includes row 0 to row m-1 and some columns of column 0 to column n-1 in a matrix shown in FIG. 3b-5, where $7\leq m\leq 42$, m is an integer, $17\leq n\leq 52$, and n is an integer.

If a=11 or a value of the lifting factor Z is one of $\{11, 22, 44, 88, 176, 352\}$, the base matrix may include row 0 to row 6 and column 0 to column 16 in a matrix shown in FIG. 3b-6; or the base matrix includes row 0 to row m-1 and column 0 to column n-1 in a matrix shown in FIG. 3b-6, where $7\leq m\leq 42$, m is an integer, $17\leq n\leq 52$, and n is an integer; or the base matrix includes row 0 to row m-1 and some columns of column 0 to column n-1 in a matrix shown in FIG. 3b-6, where $7\leq m\leq 42$, m is an integer, $17\leq n\leq 52$, and n is an integer.

If a=13 or a value of the lifting factor Z is one of $\{13, 26, 52, 104, 208\}$, the base matrix may include row 0 to row 6 and column 0 to column 16 in a matrix shown in FIG. 3b-7; or the base matrix includes row 0 to row m-1 and column 0 to column n-1 in a matrix shown in FIG. 3b-7, where 7≤m≤42, m is an integer, 17≤n≤52, and n is an integer; or the base matrix includes row 0 to row m-1 and some columns of column 0 to column n-1 in a matrix shown in FIG. 3b-7, where 7≤m≤42, m is an integer, 17≤n≤52, and n is an integer.

If a=15 or a value of the lifting factor Z is one of {15, 30, 60, 120, 240}, the base matrix may include row 0 to row 6 and column 0 to column 16 in a matrix 3b-8; or the base matrix includes row 0 to row m-1 and column 0 to column n-1 in a matrix shown in FIG. 3b-8, where 7≤m≤42, m is an integer, 17≤n≤52, and n is an integer; or the base matrix includes and some columns of column 0 to column n-1 in a matrix shown in FIG. 3b-8, where 7≤m≤42, m is an integer, 17≤n≤52, and n is an integer.

Optionally, for a base matrix for an LDPC code, shift values of non-zero-elements in one or more columns may be increased or decreased by a compensation value Offset$_s$, without greatly affecting the system performance. Compensation values of non-zero-elements in different columns may be the same or different. For example, to compensate one or more columns in a matrix, compensation values for different columns may be the same or different. This is not limited in this application.

Not greatly affecting the system performance means that the impact on the system performance is acceptable and is within a tolerance range. For example, the performance decreases within a tolerance range in some scenarios or in some ranges. However, in some scenarios or in some ranges, the performance improves to some extent. Overall performance is not greatly affected.

For example, the compensation value Offset$_s$ is added to or subtracted from each shift value greater than or equal to 0 in column s in any one of the matrices shown in FIGS. 3b-1 to 3b-8, to obtain a compensated matrix Hs, where Offset$_s$ is an integer greater than or equal to 0, and s is an integer greater than or equal to 0 and less than 11. Compensation values Offset$_s$ for one or more columns may be the same or different.

In the performance diagram shown in FIG. 4, based on performance curves of encoding matrices shown in FIG. 3b-1 and FIG. 3b-2, a horizontal coordinate represents a length of an information bit sequence, and a unit of the length is bit, and a vertical coordinate is a symbol signal-to-noise ratio (Es/N0) required to reach a corresponding BLER. Two lines of each code rate are corresponding to two cases of BLERs 0.01 and 0.0001. At a same code rate, 0.01 is corresponding to an upper curve, and 0.0001 is corresponding to a lower curve. If the curves are smooth, it indicates that the matrix has relatively high performance in cases of different block lengths.

FIG. 1 to FIG. 3a and FIGS. 3b-1 to 3b-8 show structures of the base graph and the base matrix that are related to the LDPC code. To sufficiently describe designs of the base graph and/or the base matrix in the implementations of the present application, the structure of the base matrix may be represented in another form that can be identified by the system, for example, in a tabular form.

In a design, the base graph shown by 10a in FIG. 1 is a matrix of 7 rows and 10 columns, and related parameters may be represented in Table 2.

TABLE 2

(Corresponding to 10a in FIG. 1)

| Row number | Row weight | Column index of non-zero-element |
|---|---|---|
| 0 | 8 | 0, 1, 2, 3, 6, 9, 10, 11 |
| 1 | 10 | 0, 3, 4, 5, 6, 7, 8, 9, 11, 12 |
| 2 | 8 | 0, 1, 3, 4, 8, 10, 12, 13 |
| 3 | 10 | 1, 2, 4, 5, 6, 7, 8, 9, 10, 13 |
| 4 | 4 | 0, 1, 11, 14 |
| 5 | 6 | 0, 1, 5, 7, 11, 15 |
| 6 | 6 | 0, 5, 7, 9, 11, 16 |

It may be understood that because column 14 to column 16 in the base graph 10a are columns whose column weight is 1, and locations of the columns are relatively fixed or easily determined, locations of non-zero-elements in column 14 to column 16 may not be recorded in Table 2, but are recorded in another form.

In a design, using the base matrices shown in FIGS. 3b-1 to 3b-8 as examples, parameters related to the base matrices may be respectively represented in Table 3b-1 to Table 3b-8.

TABLE 3b-1

(Corresponding to FIG. 3b-1)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 183, 27, 0, 0, 222, 0, 0, 204, 0, 0 |
| 2 | 8 | 0, 1, 3, 4, 8, 10, 12, 13 | 162, 164, 117, 44, 159, 1, 0, 0 |
| 3 | 10 | 1, 2, 4, 5, 6, 7, 8, 9, 10, 13 | 168, 22, 57, 188, 173, 110, 85, 223, 0, 0 |
| 4 | 4 | 0, 1, 11, 14 | 0, 44, 70, 0 |
| 5 | 6 | 0, 1, 5, 7, 11, 15 | 0, 221, 215, 45, 171, 0 |
| 6 | 6 | 0, 5, 7, 9, 11, 16 | 0, 170, 23, 60, 241, 0 |
| 7 | 6 | 1, 5, 7, 11, 13, 17 | 0, 27, 36, 157, 153, 0 |
| 8 | 4 | 0, 1, 12, 18 | 0, 126, 16, 0 |
| 9 | 5 | 1, 8, 10, 11, 19 | 0, 126, 251, 76, 0 |
| 10 | 5 | 0, 1, 6, 7, 20 | 0, 49, 162, 248, 0 |
| 11 | 5 | 0, 7, 9, 13, 21 | 0, 4, 143, 236, 0 |
| 12 | 4 | 1, 3, 11, 22 | 0, 4, 151, 0 |
| 13 | 5 | 0, 1, 8, 13, 23 | 0, 235, 95, 173, 0 |
| 14 | 5 | 1, 6, 11, 13, 24 | 0, 51, 177, 63, 0 |
| 15 | 4 | 0, 10, 11, 25 | 0, 69, 63, 0 |
| 16 | 5 | 1, 9, 11, 12, 26 | 0, 106, 117, 67, 0 |
| 17 | 5 | 1, 5, 11, 12, 27 | 0, 239, 82, 222, 0 |
| 18 | 4 | 0, 6, 7, 28 | 0, 41, 214, 0 |
| 19 | 4 | 0, 1, 10, 29 | 0, 71, 123, 0 |
| 20 | 4 | 1, 4, 11, 30 | 0, 228, 3, 0 |
| 21 | 4 | 0, 8, 13, 31 | 0, 155, 240, 0 |
| 22 | 3 | 1, 2, 32 | 0, 75, 0 |
| 23 | 4 | 0, 3, 5, 33 | 0, 247, 96, 0 |
| 24 | 4 | 1, 2, 9, 34 | 0, 71, 227, 0 |
| 25 | 3 | 0, 5, 35 | 0, 83, 0 |
| 26 | 5 | 2, 7, 12, 13, 36 | 0, 12, 126, 152, 0 |
| 27 | 3 | 0, 6, 37 | 0, 220, 0 |
| 28 | 4 | 1, 2, 5, 38 | 0, 98, 70, 0 |
| 29 | 3 | 0, 4, 39 | 0, 13, 0 |
| 30 | 5 | 2, 5, 7, 9, 40 | 0, 120, 87, 230, 0 |
| 31 | 3 | 1, 13, 41 | 0, 110, 0 |
| 32 | 4 | 0, 5, 12, 42 | 0, 5, 115, 0 |
| 33 | 4 | 2, 7, 10, 43 | 0, 210, 110, 0 |
| 34 | 4 | 0, 12, 13, 44 | 0, 84, 57, 0 |
| 35 | 4 | 1, 5, 11, 45 | 0, 224, 137, 0 |
| 36 | 4 | 0, 2, 7, 46 | 0, 29, 3, 0 |
| 37 | 3 | 10, 13, 47 | 0, 129, 0 |
| 38 | 4 | 1, 5, 11, 48 | 0, 125, 123, 0 |
| 39 | 4 | 0, 7, 12, 49 | 0, 154, 247, 0 |
| 40 | 4 | 2, 10, 13, 50 | 0, 85, 113, 0 |
| 41 | 4 | 1, 5, 11, 51 | 0, 97, 230, 0 |

TABLE 3b-2

(Corresponding to FIG. 3b-2)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 187, 56, 0, 0, 45, 0, 0, 18, 0, 0 |
| 2 | 8 | 0, 1, 3, 4, 8, 10, 12, 13 | 179, 171, 54, 158, 116, 1, 0, 0 |
| 3 | 10 | 1, 2, 4, 5, 6, 7, 8, 9, 10, 13 | 106, 62, 52, 185, 80, 81, 66, 163, 0, 0 |
| 4 | 4 | 0, 1, 11, 14 | 0, 89, 43, 0 |
| 5 | 6 | 0, 1, 5, 7, 11, 15 | 0, 109, 191, 42, 142, 0 |
| 6 | 6 | 0, 5, 7, 9, 11, 16 | 0, 163, 112, 100, 131, 0 |
| 7 | 6 | 1, 5, 7, 11, 13, 17 | 0, 60, 78, 92, 183, 0 |
| 8 | 4 | 0, 1, 12, 18 | 0, 123, 58, 0 |
| 9 | 5 | 1, 8, 10, 11, 19 | 0, 180, 55, 49, 0 |
| 10 | 5 | 0, 1, 6, 7, 20 | 0, 134, 184, 158, 0 |
| 11 | 5 | 0, 7, 9, 13, 21 | 0, 153, 164, 189, 0 |
| 12 | 4 | 1, 3, 11, 22 | 0, 167, 154, 0 |
| 13 | 5 | 0, 1, 8, 13, 23 | 0, 187, 166, 67, 0 |
| 14 | 5 | 1, 6, 11, 13, 24 | 0, 29, 67, 145, 0 |
| 15 | 4 | 0, 10, 11, 25 | 0, 21, 16, 0 |
| 16 | 5 | 1, 9, 11, 12, 26 | 0, 122, 113, 98, 0 |
| 17 | 5 | 1, 5, 11, 12, 27 | 0, 99, 112, 70, 0 |
| 18 | 4 | 0, 6, 7, 28 | 0, 135, 164, 0 |
| 19 | 4 | 0, 1, 10, 29 | 0, 94, 90, 0 |
| 20 | 4 | 1, 4, 11, 30 | 0, 173, 59, 0 |
| 21 | 4 | 0, 8, 13, 31 | 0, 8, 143, 0 |
| 22 | 3 | 1, 2, 32 | 0, 42, 0 |
| 23 | 4 | 0, 3, 5, 33 | 0, 190, 72, 0 |
| 24 | 4 | 1, 2, 9, 34 | 0, 73, 111, 0 |
| 25 | 3 | 0, 5, 35 | 0, 188, 0 |
| 26 | 5 | 2, 7, 12, 13, 36 | 0, 0, 1, 113, 0 |
| 27 | 3 | 0, 6, 37 | 0, 185, 0 |
| 28 | 4 | 1, 2, 5, 38 | 0, 41, 89, 0 |
| 29 | 3 | 0, 4, 39 | 0, 36, 0 |
| 30 | 5 | 2, 5, 7, 9, 40 | 0, 141, 35, 124, 0 |
| 31 | 3 | 1, 13, 41 | 0, 152, 0 |
| 32 | 4 | 0, 5, 12, 42 | 0, 145, 117, 0 |
| 33 | 4 | 2, 7, 10, 43 | 0, 68, 176, 0 |
| 34 | 4 | 0, 12, 13, 44 | 0, 92, 75, 0 |
| 35 | 4 | 1, 5, 11, 45 | 0, 189, 18, 0 |
| 36 | 4 | 0, 2, 7, 46 | 0, 140, 179, 0 |
| 37 | 3 | 10, 13, 47 | 0, 19, 0 |
| 38 | 4 | 1, 5, 11, 48 | 0, 44, 3, 0 |
| 39 | 4 | 0, 7, 12, 49 | 0, 111, 167, 0 |
| 40 | 4 | 2, 10, 13, 50 | 0, 27, 92, 0 |
| 41 | 4 | 1, 5, 11, 51 | 0, 158, 156, 0 |

TABLE 3b-3

(Corresponding to FIG. 3b-3)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 137, 124, 0, 0, 88, 0, 0, 55, 0, 0 |
| 2 | 8 | 0, 1, 3, 4, 8, 10, 12, 13 | 20, 94, 99, 9, 108, 1, 0, 0 |
| 3 | 10 | 1, 2, 4, 5, 6, 7, 8, 9, 10, 13 | 38, 15, 102, 146, 12, 57, 53, 46, 0, 0 |
| 4 | 4 | 0, 1, 11, 14 | 0, 136, 157, 0 |
| 5 | 6 | 0, 1, 5, 7, 11, 15 | 0, 131, 142, 141, 64, 0 |
| 6 | 6 | 0, 5, 7, 9, 11, 16 | 0, 124, 99, 45, 148, 0 |
| 7 | 6 | 1, 5, 7, 11, 13, 17 | 0, 45, 148, 96, 78, 0 |
| 8 | 4 | 0, 1, 12, 18 | 0, 65, 87, 0 |
| 9 | 5 | 1, 8, 10, 11, 19 | 0, 97, 51, 85, 0 |
| 10 | 5 | 0, 1, 6, 7, 20 | 0, 17, 156, 20, 0 |
| 11 | 5 | 0, 7, 9, 13, 21 | 0, 7, 4, 2, 0 |
| 12 | 4 | 1, 3, 11, 22 | 0, 113, 48, 0 |
| 13 | 5 | 0, 1, 8, 13, 23 | 0, 112, 102, 26, 0 |
| 14 | 5 | 1, 6, 11, 13, 24 | 0, 138, 57, 27, 0 |
| 15 | 4 | 0, 10, 11, 25 | 0, 73, 99, 0 |
| 16 | 5 | 1, 9, 11, 12, 26 | 0, 79, 111, 143, 0 |
| 17 | 5 | 1, 5, 11, 12, 27 | 0, 24, 109, 18, 0 |
| 18 | 4 | 0, 6, 7, 28 | 0, 18, 86, 0 |
| 19 | 4 | 0, 1, 10, 29 | 0, 158, 154, 0 |
| 20 | 4 | 1, 4, 11, 30 | 0, 148, 104, 0 |
| 21 | 4 | 0, 8, 13, 31 | 0, 17, 33, 0 |
| 22 | 3 | 1, 2, 32 | 0, 4, 0 |
| 23 | 4 | 0, 3, 5, 33 | 0, 75, 158, 0 |
| 24 | 4 | 1, 2, 9, 34 | 0, 69, 87, 0 |
| 25 | 3 | 0, 5, 35 | 0, 65, 0 |
| 26 | 5 | 2, 7, 12, 13, 36 | 0, 100, 13, 7, 0 |
| 27 | 3 | 0, 6, 37 | 0, 32, 0 |
| 28 | 4 | 1, 2, 5, 38 | 0, 126, 110, 0 |
| 29 | 3 | 0, 4, 39 | 0, 154, 0 |
| 30 | 5 | 2, 5, 7, 9, 40 | 0, 35, 51, 134, 0 |
| 31 | 3 | 1, 13, 41 | 0, 20, 0 |
| 32 | 4 | 0, 5, 12, 42 | 0, 20, 122, 0 |
| 33 | 4 | 2, 7, 10, 43 | 0, 88, 13, 0 |
| 34 | 4 | 0, 12, 13, 44 | 0, 19, 78, 0 |
| 35 | 4 | 1, 5, 11, 45 | 0, 157, 6, 0 |
| 36 | 4 | 0, 2, 7, 46 | 0, 63, 82, 0 |
| 37 | 3 | 10, 13, 47 | 0, 144, 0 |
| 38 | 4 | 1, 5, 11, 48 | 0, 93, 19, 0 |
| 39 | 4 | 0, 7, 12, 49 | 0, 24, 138, 0 |
| 40 | 4 | 2, 10, 13, 50 | 0, 36, 143, 0 |
| 41 | 4 | 1, 5, 11, 51 | 0, 2, 55, 0 |

TABLE 3b-4

(Corresponding to FIG. 3b-4)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 152, 115, 0, 0, 163, 0, 0, 186, 0, 0 |
| 2 | 8 | 0, 1, 3, 4, 8, 10, 12, 13 | 52, 149, 95, 136, 30, 1, 0, 0 |
| 3 | 10 | 1, 2, 4, 5, 6, 7, 8, 9, 10, 13 | 3, 41, 145, 171, 2, 188, 4, 180, 0, 0 |
| 4 | 4 | 0, 1, 11, 14 | 0, 178, 36, 0 |
| 5 | 6 | 0, 1, 5, 7, 11, 15 | 0, 116, 118, 213, 54, 0 |
| 6 | 6 | 0, 5, 7, 9, 11, 16 | 0, 121, 215, 86, 220, 0 |
| 7 | 6 | 1, 5, 7, 11, 13, 17 | 0, 188, 88, 155, 135, 0 |
| 8 | 4 | 0, 1, 12, 18 | 0, 100, 136, 0 |
| 9 | 5 | 1, 8, 10, 11, 19 | 0, 157, 3, 195, 0 |
| 10 | 5 | 0, 1, 6, 7, 20 | 0, 20, 92, 134, 0 |
| 11 | 5 | 0, 7, 9, 13, 21 | 0, 66, 194, 133, 0 |
| 12 | 4 | 1, 3, 11, 22 | 0, 15, 59, 0 |
| 13 | 5 | 0, 1, 8, 13, 23 | 0, 49, 74, 187, 0 |
| 14 | 5 | 1, 6, 11, 13, 24 | 0, 60, 151, 154, 0 |
| 15 | 4 | 0, 10, 11, 25 | 0, 122, 55, 0 |
| 16 | 5 | 1, 9, 11, 12, 26 | 0, 128, 147, 14, 0 |
| 17 | 5 | 1, 5, 11, 12, 27 | 0, 141, 131, 122, 0 |
| 18 | 4 | 0, 6, 7, 28 | 0, 52, 160, 0 |
| 19 | 4 | 0, 1, 10, 29 | 0, 8, 223, 0 |
| 20 | 4 | 1, 4, 11, 30 | 0, 65, 104, 0 |
| 21 | 4 | 0, 8, 13, 31 | 0, 77, 93, 0 |
| 22 | 3 | 1, 2, 32 | 0, 133, 0 |
| 23 | 4 | 0, 3, 5, 33 | 0, 18, 214, 0 |
| 24 | 4 | 1, 2, 9, 34 | 0, 78, 43, 0 |
| 25 | 3 | 0, 5, 35 | 0, 106, 0 |
| 26 | 5 | 2, 7, 12, 13, 36 | 0, 191, 142, 47, 0 |
| 27 | 3 | 0, 6, 37 | 0, 166, 0 |
| 28 | 4 | 1, 2, 5, 38 | 0, 123, 150, 0 |
| 29 | 3 | 0, 4, 39 | 0, 177, 0 |
| 30 | 5 | 2, 5, 7, 9, 40 | 0, 51, 140, 159, 0 |
| 31 | 3 | 1, 13, 41 | 0, 119, 0 |

TABLE 3b-4-continued (Corresponding to FIG. 3b-4)

| Row number (row index) | Row weight | Column index of non-zero-element | Shift value of non-zero-element |
|---|---|---|---|
| 32 | 4 | 0, 5, 12, 42 | 0, 81, 89, 0 |
| 33 | 4 | 2, 7, 10, 43 | 0, 100, 134, 0 |
| 34 | 4 | 0, 12, 13, 44 | 0, 138, 34, 0 |
| 35 | 4 | 1, 5, 11, 45 | 0, 46, 212, 0 |
| 36 | 4 | 0, 2, 7, 46 | 0, 189, 165, 0 |
| 37 | 3 | 10, 13, 47 | 0, 106, 0 |
| 38 | 4 | 1, 5, 11, 48 | 0, 176, 144, 0 |
| 39 | 4 | 0, 7, 12, 49 | 0, 88, 141, 0 |
| 40 | 4 | 2, 10, 13, 50 | 0, 150, 6, 0 |
| 41 | 4 | 1, 5, 11, 51 | 0, 131, 52, 0 |

TABLE 3b-5

(Corresponding to FIG. 3b-5)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 57, 6, 0, 0, 16, 0, 0, 95, 0, 0 |
| 2 | 8 | 0, 1, 3, 4, 8, 10, 12, 13 | 141, 25, 53, 132, 8, 1, 0, 0 |
| 3 | 10 | 1, 2, 4, 5, 6, 7, 8, 9, 10, 13 | 77, 8, 117, 3, 119, 55, 86, 21, 0, 0 |
| 4 | 4 | 0, 1, 11, 14 | 0, 70, 71, 0 |
| 5 | 6 | 0, 1, 5, 7, 11, 15 | 0, 113, 8, 79, 37, 0 |
| 6 | 6 | 0, 5, 7, 9, 11, 16 | 0, 34, 136, 127, 83, 0 |
| 7 | 6 | 1, 5, 7, 11, 13, 17 | 0, 13, 63, 142, 114, 0 |
| 8 | 4 | 0, 1, 12, 18 | 0, 35, 67, 0 |
| 9 | 5 | 1, 8, 10, 11, 19 | 0, 16, 15, 21, 0 |
| 10 | 5 | 0, 1, 6, 7, 20 | 0, 13, 114, 21, 0 |
| 11 | 5 | 0, 7, 9, 13, 21 | 0, 0, 96, 86, 0 |
| 12 | 4 | 1, 3, 11, 22 | 0, 106, 20, 0 |
| 13 | 5 | 0, 1, 8, 13, 23 | 0, 84, 113, 47, 0 |
| 14 | 5 | 1, 6, 11, 13, 24 | 0, 122, 51, 90, 0 |
| 15 | 4 | 0, 10, 11, 25 | 0, 62, 57, 0 |
| 16 | 5 | 1, 9, 11, 12, 26 | 0, 37, 139, 33, 0 |
| 17 | 5 | 1, 5, 11, 12, 27 | 0, 10, 134, 108, 0 |
| 18 | 4 | 0, 6, 7, 28 | 0, 5, 95, 0 |
| 19 | 4 | 0, 1, 10, 29 | 0, 74, 7, 0 |
| 20 | 4 | 1, 4, 11, 30 | 0, 123, 35, 0 |
| 21 | 4 | 0, 8, 13, 31 | 0, 10, 36, 0 |
| 22 | 3 | 1, 2, 32 | 0, 130, 0 |
| 23 | 4 | 0, 3, 5, 33 | 0, 58, 102, 0 |
| 24 | 4 | 1, 2, 9, 34 | 0, 17, 49, 0 |
| 25 | 3 | 0, 5, 35 | 0, 2, 0 |
| 26 | 5 | 2, 7, 12, 13, 36 | 0, 103, 14, 132, 0 |
| 27 | 3 | 0, 6, 37 | 0, 1, 0 |
| 28 | 4 | 1, 2, 5, 38 | 0, 47, 99, 0 |
| 29 | 3 | 0, 4, 39 | 0, 80, 0 |
| 30 | 5 | 2, 5, 7, 9, 40 | 0, 72, 141, 124, 0 |
| 31 | 3 | 1, 13, 41 | 0, 50, 0 |
| 32 | 4 | 0, 5, 12, 42 | 0, 23, 28, 0 |
| 33 | 4 | 2, 7, 10, 43 | 0, 26, 22, 0 |
| 34 | 4 | 0, 12, 13, 44 | 0, 65, 76, 0 |
| 35 | 4 | 1, 5, 11, 45 | 0, 50, 96, 0 |
| 36 | 4 | 0, 2, 7, 46 | 0, 19, 107, 0 |
| 37 | 3 | 10, 13, 47 | 0, 88, 0 |
| 38 | 4 | 1, 5, 11, 48 | 0, 74, 14, 0 |
| 39 | 4 | 0, 7, 12, 49 | 0, 119, 97, 0 |
| 40 | 4 | 2, 10, 13, 50 | 0, 114, 21, 0 |
| 41 | 4 | 1, 5, 11, 51 | 0, 105, 66, 0 |

TABLE 3b-6

(Corresponding to FIG. 3b-6)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 173, 54, 0, 0, 168, 0, 0, 160, 0, 0 |
| 2 | 8 | 0, 1, 3, 4, 8, 10, 12, 13 | 97, 47, 149, 159, 32, 1, 0, 0 |
| 3 | 10 | 1, 2, 4, 5, 6, 7, 8, 9, 10, 13 | 166, 21, 118, 83, 125, 106, 58, 129, 0, 0 |
| 4 | 4 | 0, 1, 11, 14 | 0, 64, 76, 0 |
| 5 | 6 | 0, 1, 5, 7, 11, 15 | 0, 48, 21, 156, 173, 0 |
| 6 | 6 | 0, 5, 7, 9, 11, 16 | 0, 147, 88, 169, 95, 0 |
| 7 | 6 | 1, 5, 7, 11, 13, 17 | 0, 103, 10, 140, 116, 0 |
| 8 | 4 | 0, 1, 12, 18 | 0, 1, 70, 0 |
| 9 | 5 | 1, 8, 10, 11, 19 | 0, 76, 71, 80, 0 |
| 10 | 5 | 0, 1, 6, 7, 20 | 0, 127, 67, 29, 0 |
| 11 | 5 | 0, 7, 9, 13, 21 | 0, 109, 50, 19, 0 |
| 12 | 4 | 1, 3, 11, 22 | 0, 81, 138, 0 |
| 13 | 5 | 0, 1, 8, 13, 23 | 0, 47, 11, 161, 0 |
| 14 | 5 | 1, 6, 11, 13, 24 | 0, 1, 24, 93, 0 |
| 15 | 4 | 0, 10, 11, 25 | 0, 117, 134, 0 |
| 16 | 5 | 1, 9, 11, 12, 26 | 0, 58, 119, 50, 0 |
| 17 | 5 | 1, 5, 11, 12, 27 | 0, 56, 29, 77, 0 |
| 18 | 4 | 0, 6, 7, 28 | 0, 42, 130, 0 |
| 19 | 4 | 0, 1, 10, 29 | 0, 164, 19, 0 |
| 20 | 4 | 1, 4, 11, 30 | 0, 171, 164, 0 |
| 21 | 4 | 0, 8, 13, 31 | 0, 159, 125, 0 |
| 22 | 3 | 1, 2, 32 | 0, 79, 0 |
| 23 | 4 | 0, 3, 5, 33 | 0, 27, 140, 0 |
| 24 | 4 | 1, 2, 9, 34 | 0, 84, 13, 0 |
| 25 | 3 | 0, 5, 35 | 0, 94, 0 |
| 26 | 5 | 2, 7, 12, 13, 36 | 0, 14, 28, 151, 0 |
| 27 | 3 | 0, 6, 37 | 0, 40, 0 |
| 28 | 4 | 1, 2, 5, 38 | 0, 67, 110, 0 |
| 29 | 3 | 0, 4, 39 | 0, 82, 0 |
| 30 | 5 | 2, 5, 7, 9, 40 | 0, 129, 87, 123, 0 |
| 31 | 3 | 1, 13, 41 | 0, 117, 0 |
| 32 | 4 | 0, 5, 12, 42 | 0, 60, 41, 0 |
| 33 | 4 | 2, 7, 10, 43 | 0, 92, 103, 0 |
| 34 | 4 | 0, 12, 13, 44 | 0, 89, 83, 0 |
| 35 | 4 | 1, 5, 11, 45 | 0, 86, 49, 0 |
| 36 | 4 | 0, 2, 7, 46 | 0, 125, 138, 0 |
| 37 | 3 | 10, 13, 47 | 0, 130, 0 |
| 38 | 4 | 1, 5, 11, 48 | 0, 63, 43, 0 |
| 39 | 4 | 0, 7, 12, 49 | 0, 34, 21, 0 |
| 40 | 4 | 2, 10, 13, 50 | 0, 118, 86, 0 |
| 41 | 4 | 1, 5, 11, 51 | 0, 65, 18, 0 |

TABLE 3b-7

(Corresponding to FIG. 3b-7)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 113, 122, 0, 0, 23, 0, 0, 137, 0, 0 |
| 2 | 8 | 0, 1, 3, 4, 8, 10, 12, 13 | 103, 141, 93, 12, 154, 1, 0, 0 |
| 3 | 10 | 1, 2, 4, 5, 6, 7, 8, 9, 10, 13 | 19, 163, 39, 158, 173, 35, 83, 203, 0, 0 |
| 4 | 4 | 0, 1, 11, 14 | 0, 59, 200, 0 |
| 5 | 6 | 0, 1, 5, 7, 11, 15 | 0, 190, 135, 15, 111, 0 |
| 6 | 6 | 0, 5, 7, 9, 11, 16 | 0, 23, 115, 163, 40, 0 |
| 7 | 6 | 1, 5, 7, 11, 13, 17 | 0, 78, 73, 46, 134, 0 |
| 8 | 4 | 0, 1, 12, 18 | 0, 193, 54, 0 |
| 9 | 5 | 1, 8, 10, 11, 19 | 0, 166, 151, 19, 0 |
| 10 | 5 | 0, 1, 6, 7, 20 | 0, 1, 72, 182, 0 |
| 11 | 5 | 0, 7, 9, 13, 21 | 0, 131, 174, 138, 0 |
| 12 | 4 | 1, 3, 11, 22 | 0, 174, 43, 0 |
| 13 | 5 | 0, 1, 8, 13, 23 | 0, 30, 167, 94, 0 |

TABLE 3b-7-continued (Corresponding to FIG. 3b-7)

| Row number (row index) | Row weight | Column index of non-zero-element | Shift value of non-zero-element |
|---|---|---|---|
| 14 | 5 | 1, 6, 11, 13, 24 | 0, 119, 203, 159, 0 |
| 15 | 4 | 0, 10, 11, 25 | 0, 141, 55, 0 |
| 16 | 5 | 1, 9, 11, 12, 26 | 0, 120, 27, 135, 0 |
| 17 | 5 | 1, 5, 11, 12, 27 | 0, 30, 109, 23, 0 |
| 18 | 4 | 0, 6, 7, 28 | 0, 64, 55, 0 |
| 19 | 4 | 0, 1, 10, 29 | 0, 2, 79, 0 |
| 20 | 4 | 1, 4, 11, 30 | 0, 100, 41, 0 |
| 21 | 4 | 0, 8, 13, 31 | 0, 201, 130, 0 |
| 22 | 3 | 1, 2, 32 | 0, 11, 0 |
| 23 | 4 | 0, 3, 5, 33 | 0, 101, 79, 0 |
| 24 | 4 | 1, 2, 9, 34 | 0, 88, 126, 0 |
| 25 | 3 | 0, 5, 35 | 0, 116, 0 |
| 26 | 5 | 2, 7, 12, 13, 36 | 0, 52, 192, 112, 0 |
| 27 | 3 | 0, 6, 37 | 0, 188, 0 |
| 28 | 4 | 1, 2, 5, 38 | 0, 152, 148, 0 |
| 29 | 3 | 0, 4, 39 | 0, 87, 0 |
| 30 | 5 | 2, 5, 7, 9, 40 | 0, 25, 66, 37, 0 |
| 31 | 3 | 1, 13, 41 | 0, 78, 0 |
| 32 | 4 | 0, 5, 12, 42 | 0, 111, 172, 0 |
| 33 | 4 | 2, 7, 10, 43 | 0, 31, 119, 0 |
| 34 | 4 | 0, 12, 13, 44 | 0, 38, 100, 0 |
| 35 | 4 | 1, 5, 11, 45 | 0, 201, 159, 0 |
| 36 | 4 | 0, 2, 7, 46 | 0, 161, 129, 0 |
| 37 | 3 | 10, 13, 47 | 0, 99, 0 |
| 38 | 4 | 1, 5, 11, 48 | 0, 184, 140, 0 |
| 39 | 4 | 0, 7, 12, 49 | 0, 85, 110, 0 |
| 40 | 4 | 2, 10, 13, 50 | 0, 59, 36, 0 |
| 41 | 4 | 1, 5, 11, 51 | 0, 118, 117, 0 |

TABLE 3b-8

(Corresponding to FIG. 3b-8)

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 63, 126, 0, 0, 229, 0, 0, 98, 0, 0 |
| 2 | 8 | 0, 1, 3, 4, 8, 10, 12, 13 | 100, 137, 42, 209, 50, 1, 0, 0 |
| 3 | 10 | 1, 2, 4, 5, 6, 7, 8, 9, 10, 13 | 7, 83, 3, 133, 207, 226, 32, 153, 0, 0 |
| 4 | 4 | 0, 1, 11, 14 | 0, 175, 53, 0 |
| 5 | 6 | 0, 1, 5, 7, 11, 15 | 0, 71, 139, 28, 138, 0 |
| 6 | 6 | 0, 5, 7, 9, 11, 16 | 0, 90, 52, 64, 125, 0 |
| 7 | 6 | 1, 5, 7, 11, 13, 17 | 0, 209, 206, 237, 167, 0 |
| 8 | 4 | 0, 1, 12, 18 | 0, 139, 184, 0 |
| 9 | 5 | 1, 8, 10, 11, 19 | 0, 201, 126, 8, 0 |
| 10 | 5 | 0, 1, 6, 7, 20 | 0, 43, 145, 10, 0 |
| 11 | 5 | 0, 7, 9, 13, 21 | 0, 33, 61, 116, 0 |
| 12 | 4 | 1, 3, 11, 22 | 0, 236, 31, 0 |
| 13 | 5 | 0, 1, 8, 13, 23 | 0, 159, 141, 220, 0 |
| 14 | 5 | 1, 6, 11, 13, 24 | 0, 112, 32, 41, 0 |
| 15 | 4 | 0, 10, 11, 25 | 0, 11, 152, 0 |
| 16 | 5 | 1, 9, 11, 12, 26 | 0, 118, 25, 92, 0 |
| 17 | 5 | 1, 5, 11, 12, 27 | 0, 55, 213, 218, 0 |
| 18 | 4 | 0, 6, 7, 28 | 0, 86, 53, 0 |
| 19 | 4 | 0, 1, 10, 29 | 0, 57, 143, 0 |
| 20 | 4 | 1, 4, 11, 30 | 0, 228, 50, 0 |
| 21 | 4 | 0, 8, 13, 31 | 0, 58, 168, 0 |
| 22 | 3 | 1, 2, 32 | 0, 231, 0 |
| 23 | 4 | 0, 3, 5, 33 | 0, 74, 80, 0 |
| 24 | 4 | 1, 2, 9, 34 | 0, 163, 144, 0 |
| 25 | 3 | 0, 5, 35 | 0, 198, 0 |
| 26 | 5 | 2, 7, 12, 13, 36 | 0, 20, 211, 234, 0 |
| 27 | 3 | 0, 6, 37 | 0, 84, 0 |
| 28 | 4 | 1, 2, 5, 38 | 0, 155, 137, 0 |
| 29 | 3 | 0, 4, 39 | 0, 195, 0 |
| 30 | 5 | 2, 5, 7, 9, 40 | 0, 227, 88, 91, 0 |
| 31 | 3 | 1, 13, 41 | 0, 21, 0 |

TABLE 3b-8-continued (Corresponding to FIG. 3b-8)

| Row number (row index) | Row weight | Column index of non-zero-element | Shift value of non-zero-element |
|---|---|---|---|
| 32 | 4 | 0, 5, 12, 42 | 0, 37, 194, 0 |
| 33 | 4 | 2, 7, 10, 43 | 0, 132, 156, 0 |
| 34 | 4 | 0, 12, 13, 44 | 0, 55, 204, 0 |
| 35 | 4 | 1, 5, 11, 45 | 0, 195, 139, 0 |
| 36 | 4 | 0, 2, 7, 46 | 0, 178, 15, 0 |
| 37 | 3 | 10, 13, 47 | 0, 206, 0 |
| 38 | 4 | 1, 5, 11, 48 | 0, 76, 56, 0 |
| 39 | 4 | 0, 7, 12, 49 | 0, 197, 232, 0 |
| 40 | 4 | 2, 10, 13, 50 | 0, 14, 45, 0 |
| 41 | 4 | 1, 5, 11, 51 | 0, 189, 216, 0 |

It may be understood that FIG. 3a, FIGS. 3b-1 to 3b-8, Table 2, and Tables 3b-1 to 3b-8 are intended to help understanding the designs of the base graphs and the base matrices, and representation forms thereof are not limited thereto. Other possible variations may also be included. For example, for variations of Table 3b-1 and Table 3b-3 to Table 3b-8, reference may be made to a form of Table 3b-2A. Information about elements in columns, such as column 14 to column 51, that have relatively definite structures and that are corresponding to a shift value 0 may be selectively included in the table or may not be included in the table, to save storage space.

In a design, for a part having a relatively definite structure in the base graph or the base matrix, locations of non-zero-elements of the base graph or the base matrix may be obtained through calculation based on a row/column location, and the locations of the non-zero-elements may not be stored. Using FIG. 3b-2 and Table 3b-2 as an example, locations of column 14 to column 51 in the matrix shown in FIG. 3b-2 are relatively definite, and shift values $V_{i,j}$ are all 0. Locations of non-zero-elements can be calculated based on the known non-zero-elements. In Table 3b-2, information about column 14 to column 51 may not be included, or information about some columns of column 14 to column 51 may not be included. For example, nonzero elements in column 16 to column 51 and corresponding shift values of the non-zero-elements may not be included. For example, the matrix shown in FIG. 3b-2 may alternatively be represented in Table 3b-2A.

TABLE 3b-2A

| Row number (row index) | Row weight | Column index of non-zero-element | Shift value of non-zero-element |
|---|---|---|---|
| 0 | 8 | 0, 1, 2, 3, 6, 9, 10, 11 | 0, 0, 0, 0, 0, 0, 0, 0 |
| 1 | 10 | 0, 3, 4, 5, 6, 7, 8, 9, 11, 12 | 187, 56, 0, 0, 45, 0, 0, 18, 0, 0 |
| 2 | 8 | 0, 1, 3, 4, 8, 10, 12, 13 | 179, 171, 54, 158, 116, 1, 0, 0 |
| 3 | 10 | 1, 2, 4, 5, 6, 7, 8, 9, 10, 13 | 106, 62, 52, 185, 80, 81, 66, 163, 0, 0 |
| 4 | 3 | 0, 1, 11 | 0, 89, 43 |
| 5 | 5 | 0, 1, 5, 7, 11 | 0, 109, 191, 42, 142 |
| 6 | 5 | 0, 5, 7, 9, 11 | 0, 163, 112, 100, 131 |
| 7 | 5 | 1, 5, 7, 11, 13 | 0, 60, 78, 92, 183 |
| 8 | 3 | 0, 1, 12 | 0, 123, 58 |
| 9 | 4 | 1, 8, 10, 11 | 0, 180, 55, 49 |
| 10 | 4 | 0, 1, 6, 7 | 0, 134, 184, 158 |
| 11 | 4 | 0, 7, 9, 13 | 0, 153, 164, 189 |
| 12 | 3 | 1, 3, 11 | 0, 167, 154 |
| 13 | 4 | 0, 1, 8, 13 | 0, 187, 166, 67 |
| 14 | 4 | 1, 6, 11, 13 | 0, 29, 67, 145 |
| 15 | 3 | 0, 10, 11 | 0, 21, 16 |

TABLE 3b-2A-continued

| Row number (row index) | Row weight | Column index of non-zero-element | Shift value of non-zero-element |
|---|---|---|---|
| 16 | 4 | 1, 9, 11, 12 | 0, 122, 113, 98 |
| 17 | 4 | 1, 5, 11, 12 | 0, 99, 112, 70 |
| 18 | 3 | 0, 6, 7 | 0, 135, 164 |
| 19 | 3 | 0, 1, 10 | 0, 94, 90 |
| 20 | 3 | 1, 4, 11 | 0, 173, 59 |
| 21 | 3 | 0, 8, 13 | 0, 8, 143 |
| 22 | 2 | 1, 2 | 0, 42 |
| 23 | 3 | 0, 3, 5 | 0, 190, 72 |
| 24 | 3 | 1, 2, 9 | 0, 73, 111 |
| 25 | 2 | 0, 5 | 0, 188 |
| 26 | 4 | 2, 7, 12, 13 | 0, 0, 1, 113 |
| 27 | 2 | 0, 6 | 0, 185 |
| 28 | 3 | 1, 2, 5 | 0, 41, 89 |
| 29 | 2 | 0, 4 | 0, 36 |
| 30 | 4 | 2, 5, 7, 9 | 0, 141, 35, 124 |
| 31 | 2 | 1, 13 | 0, 152 |
| 32 | 3 | 0, 5, 12 | 0, 145, 117 |
| 33 | 3 | 2, 7, 10 | 0, 68, 176 |
| 34 | 3 | 0, 12, 13 | 0, 92, 75 |
| 35 | 3 | 1, 5, 11 | 0, 189, 18 |
| 36 | 3 | 0, 2, 7 | 0, 140, 179 |
| 37 | 2 | 10, 13 | 0, 19 |
| 38 | 3 | 1, 5, 11 | 0, 44, 3 |
| 39 | 3 | 0, 7, 12 | 0, 111, 167 |
| 40 | 3 | 2, 10, 13 | 0, 27, 92 |
| 41 | 3 | 1, 5, 11 | 0, 158, 156 |

For another example, using FIG. 3b-2 as an example, shift values $V_{i,j}$ in row 0 are also 0, and information about row 0 may not be stored, but is obtained through calculation.

In an implementation, the parameter "row weight" in Table 2, Tables 3b-1 to 3b-8, and Table 3b-2A may alternatively be omitted. A quantity of non-zero-elements in a row may be learned based on a column in which the non-zero-elements in the row are located. Therefore, the row weight is also learned.

In an implementation, parameter values in the "column in which a non-zero-element is located" in Table 2, Table 3b-1 to Table 3b-8, and Table 3b-2A may not be arranged in ascending order, provided that the parameter values are indexed to columns in which non-zero-elements are located. Moreover, parameter values in the "shift value of a non-zero-element" in Table 2 and Table 3b-1 to Table 3b-8 may not be arranged in a column order, provided that the parameter values in the "shift value of non-zero-element" are in a one-to-one correspondence with the parameter values in the "Column index of non-zero-element".

In an implementation, the foregoing different base matrices may be combined into one or more tables for representation. For example, non-zero-elements corresponding to different base matrices have a same location and a same row number, but have different shift values $V_{i,j}$. Therefore, a plurality of base matrices may be represented by using one table by listing row numbers, columns index in which non-zero-elements are located, and shift values of a plurality of groups of non-zero-elements. For example, shift values of two groups of non-zero-elements may be listed in different columns, and are indicated by using indexes.

In an implementation, the base graph may be used to indicate locations of non-zero-elements. The parameter "Column index of non-zero-element" in the foregoing tables may alternatively be optional.

In an implementation, the matrices shown in FIG. 3a and FIGS. 3b-1 to 3b-8 may alternatively be represented by using column numbers (column indexes), rows in which non-zero-elements are located, and shift values of the non-zero-elements. Optionally, column weight may be included.

In another implementation, 1 and 0 in each row or each column in the base graph or the base matrix may be considered as binary numerals, and storing the binary numerals in decimal numerals or hexadecimal numerals can save storage space. Using any foregoing base graph or base matrix as an example, locations of non-zero-elements in first 14 columns or first 17 columns may be stored by using hexadecimal numerals. For example, if first 14 columns in row 0 are 11110010011100, locations of the non-zero-elements in row 0 may be recorded as 0xF2 and 0x70. That is, every 8 columns form a hexadecimal numeral. For last two columns, a corresponding hexadecimal numerals may be obtained by filling zeroes to reach an integer multiple of 8 bits. Alternatively, a corresponding hexadecimal number may be obtained by filling zeroes in first two columns to reach an integer multiple of 8 bits. The same is true of other rows and details are not described herein.

Figures 3, 3B, 4, 5:
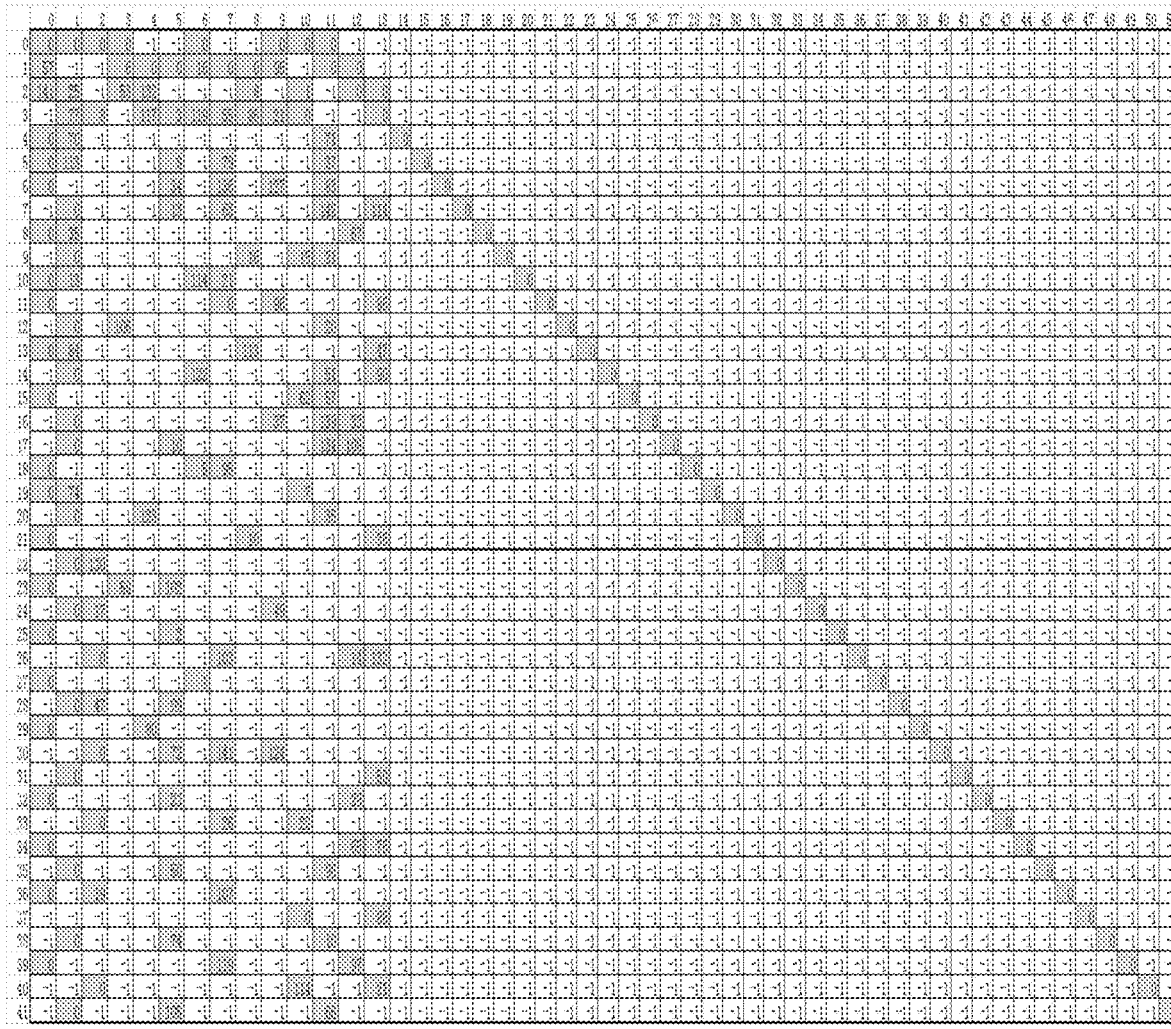

FIG. 5 shows a flowchart of a data processing process. The data processing process may be implemented by using a communication apparatus. The communication apparatus may be a base station, a terminal, or other entity such as a communication chip, or an encoder/a decoder, etc.

Block 501: Obtain an input sequence. In an implementation, an input sequence for encoding may be an information bit sequence, a filled information bit sequence, or a sequence obtained by adding a CRC bit sequence to an information bit sequence. Sometimes the information bit sequence is also referred to as a code block, for example, may be an output sequence obtained by performing code block segmentation on a transport block. In an implementation, an input sequence for decoding may be a soft value sequence of an LDPC code.

Block 502: Encode/decode the input sequence based on an LDPC matrix. A base matrix of the LDPC matrix may be any base matrix shown in the foregoing examples.

In an implementation, the LDPC matrix may be obtained based on a lifting factor Z and the base matrix.

In an implementation, parameters related to the LDPC matrix may be stored. The parameters include one or more of the following:

(a) Parameters used to obtain any base matrix listed in the foregoing implementations. The base matrix may be obtained based on the parameters. For example, the parameters may be one or more of the following: row index, row weight, column index, column weight; locations of non-zero-elements (such as row indexes of the non-zero-elements, or column indexes of the non-zero-elements), shift values in the base matrix, shift values of non-zero-elements and corresponding locations of the non-zero-elements, a compensation value, a lifting factor Z, a base graph, a code rate, and the like;

(b) A base matrix, which is one of any base matrices listed in the foregoing implementations;

(c) A compensation matrix $H_s$, obtained by compensating at least one column to the base matrix;

(d) A matrix obtained by lifting (expanding) the base matrix or the compensation matrix $H_s$ of the base matrix;

(e) A base matrix obtained by performing a row/column transformation on any base matrix or compensation matrix $H_s$ of the base matrix listed in the foregoing implementations;

(f) A matrix obtained by lifting a row/column transformed base matrix or a row/column transformed compensation matrix $H_s$ of the base matrix; and (g) A base matrix obtained by performing a shortening or puncturing operation on any base matrix or compensation matrix $H_s$ of the base matrix listed in the foregoing implementations.

In a possible implementation, encoding/decoding an input sequence based on a low density parity check (LDPC) matrix may be performed in an encoding/decoding process in one or more of the following manners:

i. Obtaining a base matrix based on some or all of the parameters listed in the forgoing item (a), and then:

encoding/decoding information based on the obtained base matrix; or performing a row/column transformation on the obtained base matrix, and encoding/decoding information based on the row/column transformed base matrix; or encoding/decoding information based on a compensation matrix $H_s$ of the obtained base matrix; or encoding/decoding information based on a matrix, which is obtained by performing a row/column transformation on a compensation matrix $H_s$ of the base matrix. Alternatively, the encoding/decoding information based on the base matrix or the compensation matrix $H_s$ may further include: encoding/decoding information based on a base matrix lifted from the base matrix or the compensation matrix $H_s$ of the base matrix; or encoding/decoding information based on a matrix obtained by performing a shortening or puncturing operation on the base matrix or the compensation matrix $H_s$.

ii. Encoding/decoding information based on a matrix stored according to the forgoing item (b), (c), (d), or (e). The matrix may be a stored base matrix, a compensation matrix $H_s$ of the base matrix, a matrix obtained by performing a row/column transformation on the base matrix, or a matrix obtained by performing a row/column transformation on the compensation matrix $H_s$. Alternatively, a row/column transformation is performed on the stored base matrix, and encoding/decoding is performed based on a matrix obtained by performing the row/column transformation. Herein, optionally, the encoding/decoding based on the base matrix or the compensation matrix $H_s$ may further include: performing encoding/decoding based on a spreading matrix of the base matrix or a spreading matrix of the compensation matrix $H_s$; or performing encoding/decoding based on a matrix obtained after performing a shortening or puncturing operation on the base matrix or the compensation matrix $H_s$.

iii. Encoding/decoding information based on a matrix described in the forgoing (d), (f), or (g).

Block 503: Output an encoded/decoded bit sequence. In a design, an input sequence $c=\{c_0, c_1, c_2, \ldots, c_{K-1}\}$ may be encoded to obtain an output sequence $d=\{d_0, d_1, d_2, \ldots, d_{N-1}\}$, where K and N are integers greater than 0. The output sequence d includes $K_0$ bits in the input sequence c and parity bits in a parity check sequence w, where $K_0$ is an integer, and $0 < K_0 \leq K$. The parity sequence w and the input sequence c satisfy a formula $$H \times \begin{bmatrix} c^T \\ w^T \end{bmatrix} = 0^T,$$

where $c^T = [c_0, c_1, c_2, \ldots, c_{K-1}]^T$ if is a transposed vector of a vector formed by bits in the input sequence c, $w^T = [w_0, w_1, w_2, \ldots, w_{N-K0-1}]^T$ is a transposed vector of a vector formed by bits in the parity sequence w; $0^T$ is a column vector, and values of all elements in $0^T$ are 0; and H is a low density parity check (LDPC) matrix. A base graph of H includes $H_{BG}$ and $H_{BG,EXT}$:

$$H_{BG,EXT} = \begin{bmatrix} 0_{m_c \times n_c} \\ I_{n_c \times n_c} \end{bmatrix},$$

where $0_{m_c \times n_c}$ represents an all zero matrix of size $m_c \times n_c$, and $I_{n_c \times n_c}$ represents an identity matrix of size $n_c \times n_c$; and $H_{BG}$ includes columns corresponding to $K_b$ columns of information bits in $H_{BG2}$ and column 10 to column $10+m_A-1$ in $H_{BG2}$, where a quantity of columns in $H_{BG2}$ is $10+m_A$, $4 \leq m_A \leq 7$, where $K_b \square \{6, 8, 9, 10\}$. For $m_c=7$, and $0 \leq n_c \leq 35$, a quantity of columns in $H_{BG2}$ is equal to 17; or for $m_c=6$, and $0 \leq n_c \leq 36$, a quantity of columns in $H_{BG2}$ is equal to 16; or for $m_c=5$, and $0 \leq n_c \leq 37$, a quantity of columns in $H_{BG2}$ is equal to 15; or for $m_c=4$, and $0 \leq n_c \leq 38$, a quantity of columns in $H_{BG2}$ is equal to 14.

Figures 3, 3B, 4, 5, 6:
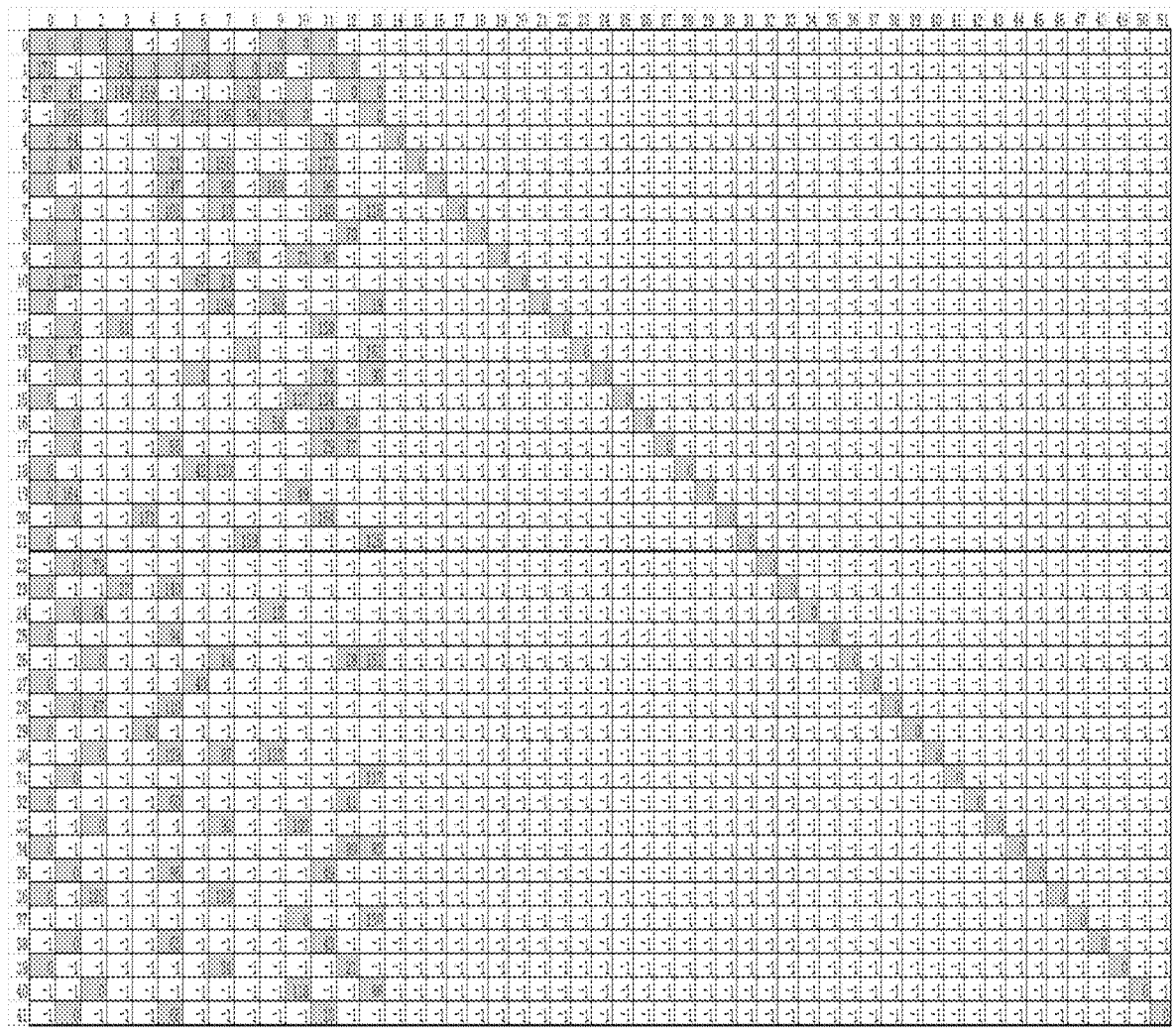

FIG. 6 shows a flowchart of a data processing process, which may be applied to block 502 in FIG. 5.

Block 601: Obtain a lifting factor Z. In a possible design, filling may be performed on an information bit sequence to obtain an input sequence. A length of the input sequence is $K=K_b \cdot Z$, and $Z=K/K_b$. In another possible design, bits that need to be punctured or shortened in an information bit sequence may be filled. In other words, filling bits are used to replace the bits that need to be punctured or shortened, so that after encoding, the filling bits can be identified and are not sent. For example, a null value, a value 0, a value agreed in a system, or a predefined value may be used as a value of a filling bit. In a design, the bits that need to be punctured are punctured without filing. Filling bits are filled after the information bit sequence.

In an implementation, the lifting factor Z may be determined based on the length K of the input sequence. For example, a minimum $Z_0$ that meets $K_b \cdot Z_0 \geq K$ may be determined from a plurality of lifting factors in a supported lifting factor set and may be used as a value of the lifting factor Z. In a possible design, $K_b$ may be a quantity of columns of information bits in a base matrix of an LDPC code. For a base graph in FIG. 3a, a quantity of columns of information bits is $K_{bmax}=10$. It is assumed that a lifting factor set supported by the base graph in FIG. 3a is {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}. If the length of the input sequence is K=529 bits, Z is equal to 26. If the length of the input sequence is K=5000 bits, Z is equal to 240. It should be noted that this is merely an example herein, which is not limited thereto.

For another example, a value of $K_b$ may vary with the value of K, but does not exceed the quantity of columns of information bits in the base matrix of the LDPC code. For example, different thresholds may be set for $K_b$.

In a design, it should be noted that thresholds 640, 560, and 192 herein are merely examples. Alternatively, another value may be designed depending on a system design requirement.

if (K>640), $K_b$=10;
else if (K>560), $K_b$=9;
else if (K>192), $K_b$=8;
else $K_b$=6;
end The lifting factor Z may be determined by a communication apparatus based on the length K of the input sequence, or may be obtained by the communication apparatus from another entity (for example, a processor).

Block 602: Obtain an LDPC matrix based on the lifting factor and a base matrix. The base matrix is any base matrix listed in the foregoing implementations, a compensation matrix obtained by compensating at least one column in any base matrix listed above, or a base matrix obtained after transformation is performed on a row order, a column order, or a row order and a column order of any base matrix listed above or a compensation matrix. A base graph of the base matrix includes at least a submatrix A and a submatrix B. Optionally, the base graph may further include a submatrix C, a submatrix D, and a submatrix E. For descriptions of the submatrices, reference may be made to the descriptions in the foregoing embodiments. Details are not described herein again. The base matrix may be obtained based on the base graph and a shift value, may be any stored base matrix listed in the foregoing implementations, or may be obtained through variation of any base matrix listed in the foregoing implementations.

In a possible implementation, the corresponding base matrix is determined based on the lifting factor Z, and the base matrix is permutated based on the lifting factor Z to obtain the LDPC matrix.

In an implementation, the LDPC matrix H may be obtained based on a correspondence between the lifting factor and the base matrix. For example, the corresponding base matrix is determined based on the lifting factor Z obtained in block 601.

For example, if Z is equal to 26, and a is equal to 13, the base matrix may include row 0 to row 6 and column 0 to column 16 in a matrix shown in FIG. 3b-7, or the base matrix includes row 0 to row 6 and some columns of column 0 to column 16 in a matrix shown in FIG. 3b-7. Further, alternatively, the base matrix further includes row 0 to row m-1 and column 0 to column n-1 in a matrix, where 7≤m≤42, m is an integer, 17≤n≤52, and n is an integer; or the base matrix includes row 0 to row m-1 and column 0 to column n-1 in a matrix shown in FIG. 3b-7, where 7≤m≤42, m is an integer, 17≤n≤52, and n is an integer. The base matrix is permutated based on the lifting factor Z to obtain the LDPC matrix. It should be noted that herein, Z=26, a=13, and the matrix shown in FIG. 3b-7 are only used as an example for description. This is merely an example herein, and the present application is not limited thereto. It may be understood that different lifting factors lead to different base matrices.

In a possible implementation, the correspondence between the lifting factor and the base matrix may be listed in Table 4, and a base matrix index corresponding to the lifting factor is determined based on Table 4. In a possible design, PCM1 may be the matrix shown in FIG. 3b-1, PCM2 may be the matrix shown in FIG. 3b-2, PCM3 may be the matrix shown in FIG. 3b-3, PCM4 may be the matrix shown in FIG. 3b-4, PCM5 may be the matrix shown in FIG. 3b-5, PCM6 may be the matrix shown in FIG. 3b-6, PCM7 may be the matrix shown in FIG. 3b-7, and PCM8 may be the matrix shown in FIG. 3b-8. This is merely an example herein, which is not limited thereto.

TABLE 4

| Base matrix index | Lifting factor Z | | | | | | |
|---|---|---|---|---|---|---|---|
| PCM1 | 2 | 4 | 8 | 16 | 32 | 64 | 128 | 256 |
| PCM2 | 3 | 6 | 12 | 24 | 48 | 96 | 192 | 384 |
| PCM3 | 5 | 10 | 20 | 40 | 80 | 160 | 320 | |

TABLE 4-continued

| Base matrix index | Lifting factor Z | | | | | |
|---|---|---|---|---|---|---|
| PCM4 | 7 | 14 | 28 | 56 | 112 | 224 |
| PCM5 | 9 | 18 | 36 | 72 | 144 | 288 |
| PCM6 | 11 | 22 | 44 | 88 | 176 | 352 |
| PCM7 | 13 | 26 | 52 | 104 | 208 | |
| PCM8 | 15 | 30 | 60 | 120 | 240 | |

In another design, the following manner may alternatively be used:

TABLE 4A

| Base matrix index | Lifting factor Z | | | | | | |
|---|---|---|---|---|---|---|---|
| PCM1 | 2 | 4 | 8 | 16 | 32 | 64 | 128 | 256 |
| PCM2 | 3 | 6 | 12 | 24 | 48 | 96 | 192 | |
| PCM3 | 5 | 10 | 20 | 40 | 80 | 160 | | |
| PCM4 | 7 | 14 | 28 | 56 | 112 | 224 | | |
| PCM5 | 9 | 18 | 36 | 72 | 144 | | | |
| PCM6 | 11 | 22 | 44 | 88 | 176 | | | |
| PCM7 | 13 | 26 | 52 | 104 | 208 | | | |
| PCM8 | 15 | 30 | 60 | 120 | 240 | | | |

Further, in a possible design, for the lifting factor Z, an element $P_{i,j}$ in row i and column j in the base matrix may satisfy the following relationship:

$$P_{i,j} = \begin{cases} -1 & V_{i,j} = -1 \\ \mod(V_{i,j}, Z) & V_{i,j} \geq 0 \end{cases}$$

where $V_{i,j}$ may be a shift value of an element in row i and column j in a base matrix for a set to which the lifting factor Z belongs, or a shift value of a non-zero-element in row i and column j in a base matrix corresponding to a maximum lifting factor in a set which the lifting factor Z belongs.

For example, Z is equal to 13. An element $P_{i,j}$ in row i and column j in a base matrix corresponding to Z satisfies:

$$P_{i,j} = \begin{cases} -1 & V_{i,j} = -1 \\ \mod(V_{i,j}, Z) & V_{i,j} \geq 0 \end{cases}$$

where $V_{i,j}$ is a shift value of a non-zero-element in row i and column j in PCM7, that is, a matrix shown in FIG. 3b-7. For Z=13, perform modulo operation of $V_{i,j}$ modulo 13, where $V_{i,j}$ is a shift value of the non-zero-element in row i and column j in the matrix shown in FIG. 3b-7. It should be noted that this is merely an example herein, and the present application is not limited thereto.

Block 603: Encode/decode the input sequence based on the LDPC matrix.

In an implementation, the input sequence for encoding may be an information bit sequence. In another implementation, the input sequence for decoding may be a soft value sequence of the LDPC code, and reference may be made to the related descriptions in FIG. 5. When encoding/decoding the input sequence, the LDPC matrix H may be obtained by lifting the base matrix based on Z. For each non-zero-element $P_{i,j}$ in the base matrix, determine a circular permutation matrix $h_{i,j}$ of size Z×Z, where $h_{i,j}$ is a circular permutation matrix obtained by circularly shifting an identity matrix for $P_{i,j}$ times. A non-zero-element $P_{i,j}$ is replaced with $h_{i,j}$, and zero-elements in the base matrix $H_B$ are replaced with an all zero matrix of size Z×Z, so as to obtain the parity check matrix H.

In a possible implementation, the base matrix of the LDPC code may be stored in a memory. The communication apparatus obtains the LDPC matrix corresponding to the lifting factor Z, to encode/decode the input sequence.

In a possible implementation, because there are a plurality of base matrices of the LDPC code, relatively large storage space is occupied if the base matrices are stored based on a matrix structure. Alternatively, the base graph of the LDPC code may be stored in the memory, and shift values of non-zero-elements in each base matrix are stored row by row or column by column, and then the LDPC matrix is obtained based on the base graph and a shift value in the base matrix associated with the lifting factor Z.

In a possible implementation, the shift values of the non-zero-elements in each base matrix may be stored according to Table 2 and Table 3b-1 to Table 3b-8. As a parameter of the LDPC matrix, Parameter "row weight" of the LDPC matrix is optional. In other words, parameter "row weight" may be or may not be stored. A quantity of non-zero-elements in a row is learned based on a column in which the non-zero-elements in the row are located. Therefore, the row weight is also learned. In a possible implementation, parameter values in the "column index of non-zero-element" in Table 2 and Table 3b-1 to Table 3b-8 may alternatively not be arranged in ascending order, as long as the parameter values are indexed to column index in which the non-zero-elements are located. Moreover, parameter values in the "shift value of non-zero-element" in Table 2 and Table 3b-1 to Table 3b-8 may alternatively not be arranged in a column index order, as long as the parameter values in the "shift value of non-zero-element" are in a one-to-one correspondence with the parameter values in the "column index of non-zero-element" and the communication apparatus can learn a shift value of a non-zero-element in which row and which column. For example, in an implementation, the shift value of non-zero-elements may be learned according to the parameter values of column index, column weight, and row index of non-zero-element, or row index of zero-element. This is similar to the form in Table 2 and Table 3b-1 to Table 3b-8, and details are not described herein again.

In a possible implementation, related parameters of the LDPC matrix may be stored with reference to related descriptions in FIG. 5.

In a possible implementation, when the related parameters of the LDPC matrix are stored, not all rows in the matrices in FIG. 3*a* and FIGS. 3*b*-1 to 3*b*-8 or not all rows in the matrices in Table 2 and Table 3b-1 to Table 3b-8 are stored, and parameters indicated by corresponding rows in the tables may be stored based on rows included in the base matrix. For example, a matrix constituted by rows and columns included in the base matrix of the LDPC matrix described in the foregoing embodiments or related parameters of the matrix constituted by the rows and the columns may be stored.

For example, for row 0 to row 6 and column 0 to column 16 in any matrix in FIGS. 3*b*-1 to 3*b*-8, a matrix constituted by row 0 to row 6 and column 0 to column 16 and/or related parameters of a matrix constituted by row 0 to row 6 and column 0 to column 16 may be stored. For details, reference may be made to the parameters listed in Table 3b-1 to Table 3b-8 and some of the foregoing descriptions.

For row 0 to row m-1 and column 0 to column n-1 in any matrix in FIGS. 3*b*-1 to 3*b*-8, where 7≤m≤42, m is an integer, 17≤n≤52, and n is an integer, a matrix constituted by row 0 to row m-1 and column 0 to column n-1 and/or related parameters of the matrix constituted by row 0 to row m-1 and column 0 to column n-1 may be stored. For details, reference may be made to the parameters listed in Table 3b-1 to Table 3b-8 and some of the foregoing descriptions.

In a possible implementation, a compensation value Offsets may be added to or subtracted from each shift value that is greater than or equal to 0 in at least one locations indicated by "column index of non-zero-element" in any one of Table 2 and Table 3b-1 to Table 3b-8. It should be noted that this is merely an example herein, which is not limited thereto.

Using FIG. 1 as an example, in an implementation, after the base matrix $H_B$ is determined, first, parity bits corresponding to column 10 to column 15 may be obtained based on the input sequence and row 0 to row 3 and column 0 to column 9 in the base matrix, that is, $H_{core\text{-}dual}$. Next, parity bits corresponding to column 16, that is, a column with column weight of 1, are obtained based on the input sequence and parity bits corresponding to $H_{core\text{-}dual}$. Then, parity bits corresponding to the submatrix E are obtained by encoding the submatrix D based on the input sequence and the parity bits corresponding to column 10 to column 16 in order to complete encoding. For an encoding process of the LDPC code, reference may be made to the descriptions in the foregoing implementations. Details are not described herein again.

In a design, in the foregoing part 502 and part 603, when the input sequence is encoded/decoded based on the LDPC matrix, the input sequence may be encoded by using the LDPC matrix H corresponding to the lifting factor Z.

In a possible implementation, LDPC encoding may be implemented in the following manner:

(1) The to-be-encoded input sequence is represented as $c=\{c_0, c_1, c_2, \ldots, c_{K-1}\}$, the length of the input sequence c is K, and an output sequence obtained by encoding the input sequence c by an encoder is represented as $d=\{d_0, d_1, d_2, \ldots d_{N-1}\}$, where K is an integer greater than 0, K may be an integer multiple of the lifting factor Z, the lifting factor of the input sequence c may be represented as Z or $Z_c$, and the subscript c indicates that the lifting factor is associated to the input sequence c. Optionally, other parameters in this implementation may be provided with or not provided with a subscript index. This does not affect an essential meaning of the parameter. A person skilled in the art may understand the meaning thereof, where N=50Z or N=(40+$K_b$)·Z. The length of the input sequence c is K, the length of the output sequence d is N, and the output sequence of N bits may include $K_0$ bits in the input sequence c and N-$K_0$ parity bits in a parity sequence w, where $K_0$ is an integer, and 0<$K_0$≤K. The parity sequence w may be represented as $w=\{w_0, w_1, w_2, \ldots, w_{N-K0-1}\}$, and a length of the parity sequence w is N-$K_0$. In a design, if the LDPC matrix H includes p built-in puncture column(s), where p is an integer greater than or equal to 0, and the p built-in puncture column(s) does/do not participate in encoding, for example, p=2, a length of the parity sequence w is N+2$Z_c$-K, and the parity sequence w may be represented as $w=\{w_0, w_1, w_2, \ldots, w_{N+2Zc-K-1}\}$. If the p built-in puncture column(s) participate in encoding, the length of the parity sequence w is N-K, and the parity sequence w may be represented as $\{w_0, w_1, w_2, \ldots, w_{N-K-1}\}$.

For a value of $K_b$, reference may be made to the foregoing design. For example:

if (K>640), $K_b$=10;
else if (K>560), $K_b$=9;
else if (K>192), $K_b$=8;
else Kb=6;
end (2) A PCM index or a lifting factor set index corresponding to the length K of a bit segment is determined based on $Z_c=K/K_b$. For example, the lifting factor $Z_c$ may be determined with reference to Table 1 and Table 2.

(3) Values are assigned to first $K-2Z_c$ bits in the encoded bit sequence $d=\{d_0, d_1, d_2, \ldots, d_{N-1}\}$. Herein, first $2Z_c$ filling bits in the to-be-encoded bit segment need to be skipped, and that the to-be-encoded bit segment may include a filling bit needs to be considered.

In an implementation, value assignment may be performed in the following manner:

for $k=2Z_c$ to $k-1$,
  if $c_k \neq$ <NULL>
    $d_{k-2Zc}=c_k$;
  else
    $c_k=0$;
    $d_{k-2Zc}=$<NULL>,
  end if
end for where k is an index value, k is an integer, <NULL> represents a filling bit, and a value thereof may be 0 or other predetermined value. Optionally, the filling bit may not to be sent.

(4) The parity bits w are generated, so that the parity bits satisfy the following formula:

$$H \times \begin{bmatrix} c \\ w \end{bmatrix} = 0 \quad (1)$$

In the formula (1), $c=[c_0, c_1, c_2, \ldots, c_{K-1}]^T$, where 0 represents a column vector, and values of all elements in 0 are zero. The matrix H represents an LDPC check matrix, and may be divided into two parts $H_1$ and $H_2$ for representation, for example, $H=[H_1 H_2]$. $c=[c_0, c_1, c_2, \ldots, c_{K-1}]^T$ is a transposed vector of a vector formed by bits in the input sequence. The parity bits w in the formula (1) are a transposed vector of a vector formed by bits in the parity sequence w. For example, for $N+2Z_c-K$ parity bits, $w=[W_0, W_1, W_2, \ldots, W_{N+2Zc-K-1}]^T$ are a transposed vector of a vector formed by bits in a parity sequence $\{W_0, W_1, W_2, \ldots, W_{N+2Zc-K-1}\}$. For another example, for $N-K-1$ parity bits, $w=[W_0, W_1, W_2, \ldots, W_{N-K-1}]^T$ is a transposed vector of a vector formed by bits in a parity sequence $\{W_0, W_1, W_2, \ldots, W_{N-K-1}\}$. H in the formula (1) is any one of LDPC matrix listed in the foregoing embodiments.

In an implementation, H may be obtained based on any base graph listed in the foregoing embodiments and a $Z_c \times Z_c$ spreading matrix. Each zero-element in the base graph is replaced with an all zero matrix of size $Z_c \times Z_c$. An element whose value is 1 (non-zero-element) in the base graph is replaced with a $Z*Z$ circulant permutation matrix $I(P_{ij})$ corresponding to a shift value $P_{ij}$ of the element, where i and j represent a row index and a column index of the element. The circular permutation matrix $I(P_{ij})$ is obtained by circularly shifting the matrix of size $Z_c \times Z_c$ to the right or to the left $P_{i,j}$ times, where $P_{i,j}=\mod(V_{i,j}, Z_c)$, and $V_{i,j}$ is a shift value that is in the base matrix and that is corresponding to a non-zero-element in the base graph.

In an implementation, $H_1$ may be parts A, B, and D of the base graph or the base matrix listed in the foregoing embodiments, that is, row 10 to row 41 and column 0 to column 16 in FIG. 3a and FIGS. 3b-1 to 3b-8.

In an implementation, $H_1$ may be some rows and some columns in the parts A, B, and D of the base graph or the base matrix listed in the foregoing embodiments, for example, row 0 to row 41 and column 0 to column 13, or row 0 to row 41 and column 0 to column 14, or row 0 to row 41 and column 0 to column 15, or row 1 to row 41 and column 0 to column 13.

In an implementation, Hi may alternatively be m rows and n columns in the base graph or the base matrix listed in the foregoing embodiments, for example, m=7 and n=35, or m=4 and n=38, or m=5 and n=37, or m=6 and n=36.

In an implementation, based on a value of $K_b$, an input sequence length of the encoder is $K_b \times Z$. If $K_b<9$, columns $\{K_b, K_{b+1}, \ldots, 9\}$ in the matrix $H_1$ are removed, and then encoding is performed.

In an implementation, the matrix H may include M rows and (N+p·Z) columns or M rows and N columns, and a size of the base matrix of H is m=M/Z rows, and n=(N+p·Z)/Z columns or n=N/Z columns.

In an implementation, $H_2$ may be represented as $$H_2 = \begin{bmatrix} 0_{m \times n} \\ I_{n \times n} \end{bmatrix},$$

where $0_{m \times n}$ represents an m×n all zero matrix (m rows and n columns), for example, may have 7 rows and 35 columns, or 4 rows and 38 columns, or 5 rows and 37 columns, or 6 rows and 36 columns, and $I_{n \times n}$ represents an n×n (n rows and n columns) matrix, for example, may have 35 rows and 35 columns, or 36 rows and 36 columns, or 37 rows and 37 columns, or 38 rows and 38 columns.

In an implementation, when the matrix H is used for encoding, encoding may be performed based on any one of the foregoing described base graphs or base matrices, for example, may be performed based on a matrix of row 0 to row 41 and column 0 to column 16 in any one of the matrices in FIG. 3a or FIGS. 3b-1 to 3b-8, or may be performed based on a matrix of row 0 to row 41 and column 0 to column 13 in any one of the matrices in FIG. 3a or FIGS. 3b-1 to 3b-8.

In a design, for $K_b \in \{6,8,9\}$, the matrix H may be a matrix obtained after columns $\{K_b, K_{b+1}, \ldots, 9\}$ are removed from any basis matrix or basis matrix described above; for $K_b=10$, the matrix H may be any base graph or base matrix described above.

The shift value $V_{i,j}$ in the matrix H may be obtained based on in FIGS. 3b-1 to 3b-8, or Table 3b-1 to Table 3b-8 and Table 3b-2A, or any manner described above. Based on an index of the check matrix, which is sometimes considered as a lifting factor set index, a corresponding check matrix may be determined, thereby a corresponding shift value $V_{i,j}$ are obtained.

In a design, H includes p built-in puncture column(s), where p is an integer greater than or equal to 0, and the p built-in puncture column(s) does/do not participate in encoding. For example, p is equal to 2, and a length of the parity sequence w is $N+2Z_c-K$. If the p built-in puncture columns participate in encoding, a length of the parity sequence w is N−K.

In a design, $0_{m \times n}$ may be a submatrix C, the submatrix C plus a last column in the submatrix B, a submatrix C plus last two columns of the submatrix B, or a submatrix C plus last three columns of the submatrix B in the foregoing embodiments.

$I_{n \times n}$ may be the submatrix E, the submatrix E plus a last column in each of the submatrix B and the submatrix D, the submatrix E plus last two columns of each of the submatrix B and the submatrix D, or the submatrix E plus last three columns of each of the submatrix B and the submatrix D in the foregoing embodiments.

(5) Optionally, for k=K to N+2$Z_c$−1, $d_{k-2Z_c}$=$W_{k-K}$.

In the foregoing implementations, the encoder may perform encoding and outputting in a plurality of manners. Any one of the base graphs or the base matrices shown in FIG. 3a and FIGS. 3b-1 to 3b-8 listed in the foregoing embodiments is used as an example for description below. The base graph has a maximum of 42 rows and a maximum of 52 columns, including two built-in puncture columns. For ease of description, in the present application, sometimes a base graph/base matrix with a maximum quantity of rows and a maximum quantity of columns is referred to as a complete base graph or base matrix. A base graph/base matrix obtained by removing the two built-in puncture columns from the complete base graph/base matrix is referred to as a complete base graph/base matrix that includes no built-in puncture column.

Manner 1

Encoding is performed based on the complete base graph/base matrix or the complete base graph/base matrix that includes no built-in puncture column, so as to obtain as many parity bits as possible. In this case, m is equal to 42. If the built-in puncture columns participate in encoding, n is equal to 52, that is, row 0 to row 41 and column 0 to column 51 in any one of the matrices in FIG. 3a and FIGS. 3b-1 to 3b-8. If the built-in puncture columns does not participate in encoding, n is equal to 51, that is, row 0 to row 41 and column 2 to column 51. Correspondingly, for the LDPC matrix H, M is equal to 41Z, and N is equal to 52Z or 51Z. In a subsequent processing process, information bits and parity bits that need to be sent may be determined from the output sequence generated by the encoder.

Manner 2

Encoding is performed based on some rows and columns of the complete base graph. A row and a column may be selected, from the complete base graph or the complete base graph that includes no built-in puncture column and based on a code rate that needs to be used for sending, the information bits and the parity bits, or the like, for encoding. For example, the code rate is ⅔, and m is equal to 7. If the built-in puncture columns participate in encoding, n is equal to 17. To be specific, encoding is performed based on some of row 0 to row 6 and column 0 to column 16 in any matrix in FIG. 3a and FIGS. 3b-1 to 3b-8. If the built-in puncture columns participate in encoding, n is equal to 15, that is, a row 0 to a row 6 and a column 2 to a column 16 in any matrix in FIG. 3a and FIGS. 3b-1 to 3b-8.

In a possible design, column 14 to column 51 in any matrix in FIG. 3a and FIGS. 3b-1 to 3b-8 listed above are columns with column weight of 1, and one or more of the columns with column weight of 1 in the core matrix may be punctured. One or more corresponding columns in the core matrix may be encoded based on some of row 0 to row 6 and column 0 to column 15 in any matrix in FIG. 3a and FIGS. 3b-1 to 3b-8, where for example, m is 6, n is 16, and the built-in puncture columns participate in encoding. In an implementation, the built-in puncture columns may alternatively not participate in encoding, so that a higher code rate can be obtained.

It should be noted that the foregoing describes the principle of the matrix H. The solution provided in this embodiment of the present application may be implemented based on various transformations of the matrix H, provided that the generated parity bits satisfy the formula (1).

A possible implementation is that Quasi-Cycle (QC) expansion is performed on the matrix H before being used. In another possible implementation, in a use process of the matrix H, QC expansion is performed on a part corresponding to current to-be-processed elements.

A possible implementation is that (calculating a shift value), the matrix H is not lifted in a use process, but a method for an expandable equivalence formula is used to calculate a connection relationship between rows and columns of the matrix.

A possible implementation is that the matrix H may not be lifted. In an encoding process, for each to-be-processed element, a shifting operation is performed on a to-be-encoded bit segment corresponding to the element based on a shift value of the element. Then, an encoding operation is performed on all bit segments on which the shifting operation is performed.

In a possible implementation, the base matrix may be obtained by predefining a base matrix PCM or defining a base matrix PCM by a system, without using the base graph. For example, the LDPC matrix may be obtained based on the base matrices provided in FIGS. 3b-1 to 3b-8, or the LDPC matrix may be obtained based on the corresponding Table 3b-1 to Table 3b-8.

In an implementation process, a transmitting end or a receiving end may store a complete matrix, that is, all of A, B, C, D, and E. Alternatively, a complete matrix may not be stored, to save storage space. For example, encoding/decoding can be implemented by storing only a part of the complete matrix or parameters corresponding to the matrix needs to be stored. Compared with a method in which a complete matrix is stored, storing only a part of a matrix can reduce overheads of a storage device in a codec. For details, reference may be made to the descriptions in the foregoing embodiments.

For example, in an implementation, parts A, B, and D in the matrix are stored, or parts A, B, and D do not include a part with column weight of 1. In an actual encoding/decoding process, values of the parts C and E or values of the part with column weight of 1 are calculated by using a formula. To be specific, only first 17 columns or first 14 columns in the original complete matrix are stored. Because the part C is an all zero matrix and can be obtained, and the part E is an identity matrix, for a location of a non-zero-element in the part E, a corresponding column index may be obtained through calculation based on a number of a currently processed row. For example, when the currently processed row is row 18, a non-zero-element corresponding to the part E is located in column 28; when the currently processed row is row 19, a non-zero-element corresponding to the part E is located in column 29; and so on. If locations of all non-zero-elements in the part E are obtained through calculation, a calculation result may be stored or may not be stored. A location of a non-zero-element can be obtained when the corresponding row and column are calculated in the encoding or decoding process In another implementation, the first 14 columns in the original complete matrix are stored. In a part that is not stored on the right side of the matrix, a location of a non-zero-element in the part that is not stored may be obtained through calculation. For example, when a currently processed row is row 4, a non-zero-element corresponding to a stored part is located in column 14; when a currently processed row is row 5, a non-zero-element corresponding to a stored part is located in column 15; and so on. When locations of all non-zero-elements in the part that is not stored in the matrix are obtained through calculation, a calculation result may be stored or may not be stored. A location of a non-zero-element can be obtained when the corresponding row and column are calculated in the encoding or decoding process In another implementation, first 14+x columns in the original complete matrix are stored. In an unstrored part of the right side of the matrix, first 4 rows are an all zero matrix, the other part is an identity matrix, and a location of a non-zero-element in the part that is not stored may be obtained through calculation. For example, when a currently processed row is row 3+x, a non-zero-element corresponding to the part that is not stored is located in column (14+x)z; when a currently processed row is row (3+x)+1, a non-zero-element corresponding to the part E is located in column (14+x)z+1; and so on. When locations of all non-zero-elements in the part that is not stored in the matrix are obtained through calculation, a calculation result may be stored. Alternatively, a calculation result may not be stored and a location of a non-zero-element can be calculated when encoding or decoding a corresponding row and column.

In still another implementation, when a shift matrix is being stored, values recorded in the shift matrix may be stored, or a value obtained after simple mathematical transformation is performed on values in the shift matrix described in this application may be stored.

In an implementation, the values in the shift matrix are transformed and then stored. During transformation, transformation is performed row by row starting from the first row in a current shift matrix. In case of an element (for example, −1) representing an all zero matrix, the element is stored without transformation. In case of an element (a nonnegative element) that represents a non-zero matrix and that is the first element (a nonnegative element) representing the non-zero matrix in the column, the element is stored without transformation. In case of an element (a nonnegative element) that represents a non-zero-element matrix and that is not the first element (a nonnegative element) representing the non-zero matrix in the column, a difference between the nonnegative element and a previous element representing the non-zero matrix in the same column is stored. If the difference is positive, it indicates right shifting. If the difference is negative, it indicates left shifting.

It should be noted that similar transformation may not be performed starting from the first row in the shift matrix, and may be performed starting from any row. After similar transformation is performed on the last row in the matrix, transformation continues to be performed starting from the first row. In addition, such a difference storage manner may vary based on different lifting factors Z. An actual shift value be calculated according to $P_{i,j}=\mathrm{mod}(V_{i,j},Z_c)$, and then a difference is calculated.

In an encoding/decoding process, a shift value before transformation may be restored through recursion calculation based on a value of a previous element in a same column. Alternatively, a relative shift value may be used to perform encoding and decoding.

In an implementation, the value $V_{i,j}$ in the shift matrix may be transformed and then stored. In a transformation operation process, locations and values of all elements (for example, −1) representing an all zero matrix in the matrix remain unchanged. For an element (a nonnegative element) representing a non-zero matrix, assuming that an original value of the element is $V_{i,j}$, the transformed value is $(z-V_{i,j})$ mod z. In an actual encoding/decoding process, a left shifting operation (which is originally a right shifting operation) is performed on an identity matrix based on the transformed shift value, so as to implement normal encoding and decoding.

In an implementation, the value $V_{i,j}$ in the shift value matrix is transformed and then stored. In a transformation operation process, an original decimal shift value is transformed into a number in another base, such as a binary system, an octal system, or a hexadecimal system. In an encoding/decoding process, a transformed shift value matrix may be chosen for restoration, and then is encoded/decoded. Alternatively, a transformed shift value matrix may be directly used for encoding/decoding.

In an implementation, an encoder side does not store a check matrix, but stores a possibly required generation matrix for encoding. It is assumed that a to-be-encoded bit segment is $c=\{c_0, c_1, c_2, c_3, \ldots, c_{K-1}\}$, and an encoded bit segment is $d=\{d_0, d_1, d_2, \ldots, d_{N-1}\}$. The generation matrix G satisfies $d=c \cdot G$.

The generation matrix may be obtained by transforming the matrix H. A right side of the matrix H may be transformed into a form of a diagonal matrix through row/column transformation, and may be represented as:

$$H=[PI] \qquad (2)$$

In this case, the corresponding generation matrix G satisfies:

$$G=[I\ PT] \qquad (3)$$

The check matrix H may be any one of the parity matrices or base matrices in the foregoing embodiments, or the LDPC matrix. During encoding, the encoded bit segment $d=\{d_0, d_1, d_2, \ldots d_{N-1}\}$ may be calculated based on the to-be-encoded bit segment $c=\{c_0, c_1, c_2, c_3, \ldots, c_{K-1}\}$ by using the stored generation matrix G.

In an implementation, during encoding, for a dual diagonal part of the matrix, encoding may be performed in any one of the foregoing manners or by using a method for storing a matrix having a plurality of superimposed rows.

In an implementation, a shift matrix corresponding to each lifting factor Z may be calculated based on $P_{i,j}=\mathrm{mod}(V_{i,j}, Z_c)$, and then, matrices corresponding to 51 lifting factors are all stored for encoding/decoding.

Optionally, in a communication system, encoding may be performed by using the foregoing method, to obtain the LDPC code. After the LDPC code is obtained, the communication apparatus may further perform the following one or more operations: performing rate matching on the LDPC code; interleaving, according to an interleaving solution, the LDPC code on which rate matching is performed; modulating the interleaved LDPC code according to a modulation scheme, to obtain a bit sequence X; and sending the bit sequence X.

Decoding is a reverse process of encoding. A base matrix used during decoding and a base matrix used during encoding have same characteristics. For an encoding process of the LDPC code, reference may be made to the descriptions in the foregoing implementations. Details are not described herein again. In an implementation, before decoding, the communication apparatus may further perform the following one or more operations: receiving a signal including information that is based on LDPC encoding, demodulating the signal, performing deinterleaving and rate de-matching to obtain a soft value sequence of the LDPC code, and decoding the soft value sequence of the LDPC code. Alternatively, decoding may be performed based on a complete base graph, a complete base graph that includes no built-in puncture column, or some rows and columns of a complete base graph.

The "storage" in this application may be storage in one or more memories. The one or more memories may be separately disposed, or may be integrated into an encoder, a decoder, a processor, a chip, a communication apparatus, or a terminal. Alternatively, some of the one or more memories may be separately disposed, or may be integrated into a decoder, a processor, a chip, a communication apparatus, or a terminal. The memory may be a storage medium in any form. This is not limited in this application.

Figures 3, 3B, 4, 5, 6, 7:
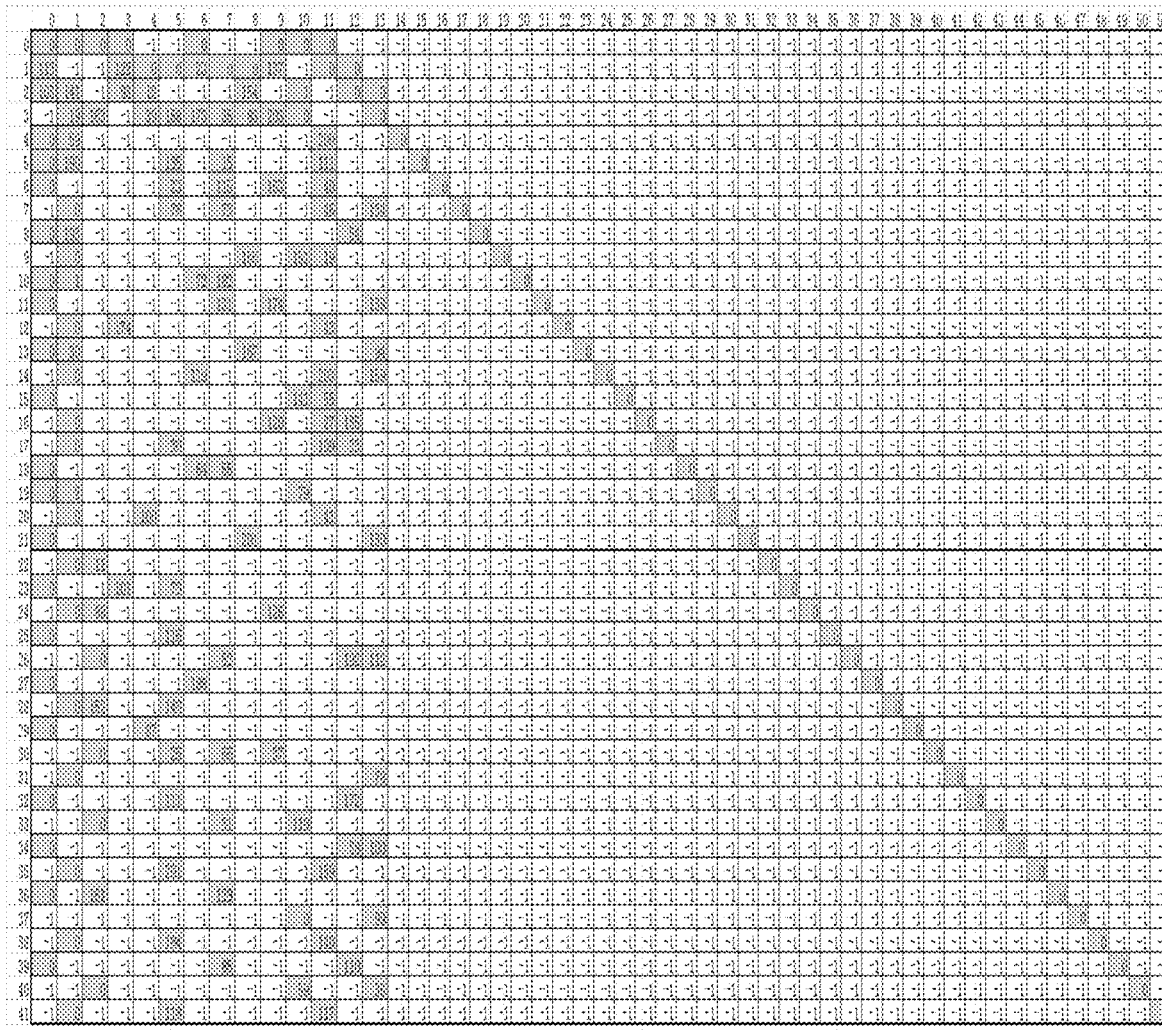
Figure 4:
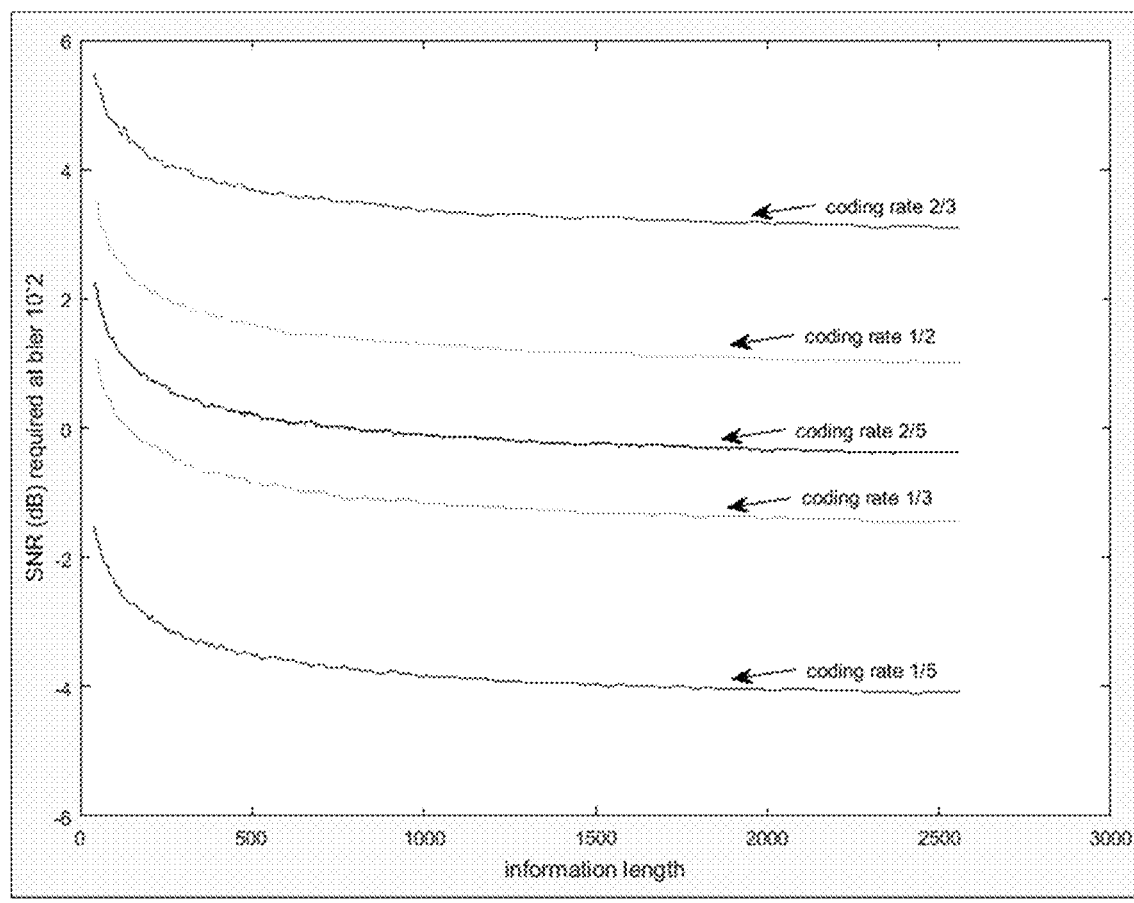
Figure 5:
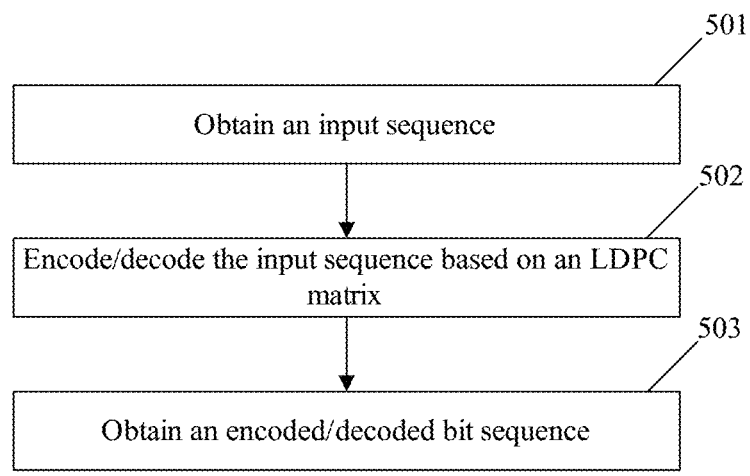
Figure 6:
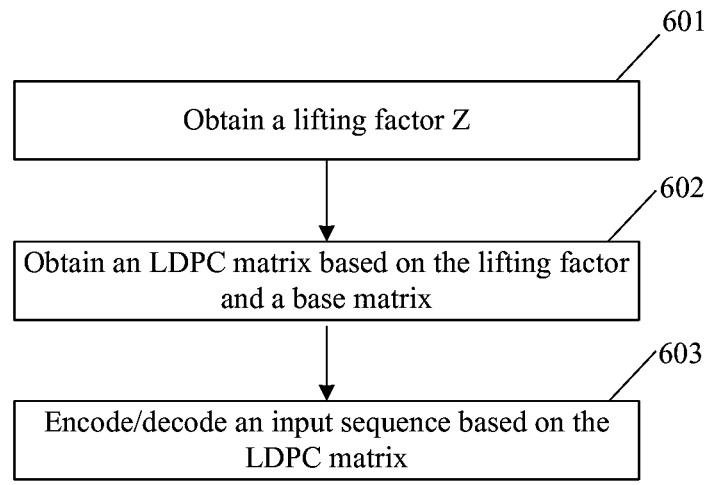
Figure 7:
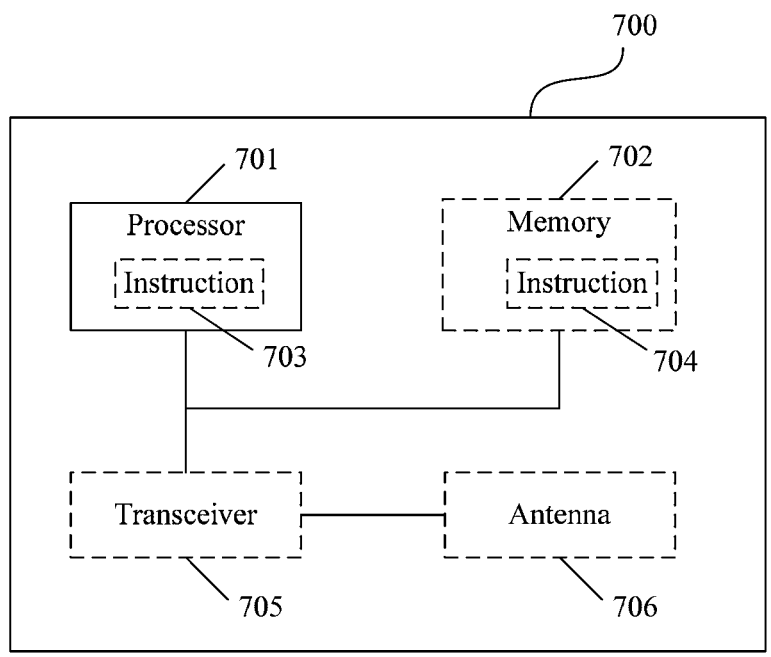

Corresponding to the designs of the data processing process described in FIG. 5 and FIG. 6, an embodiment of the present application further provides a corresponding communication apparatus. The communication apparatus includes a corresponding module configured to perform each part in FIG. 5 or FIG. 6. The module may be software, hardware, or a combination of software and hardware. For example, the module may include a memory, an electronic device, an electronic component, a logic circuit, or any combination thereof. FIG. 7 is a schematic structural diagram of a communication apparatus 700. The apparatus 700 may be configured to implement the methods described in the foregoing method embodiments. For details, reference may be made to the descriptions in the foregoing method embodiments. The communication apparatus 700 may be a chip, a base station, a terminal, or another network device.

The communication apparatus 700 includes one or more processors 701. The processor 701 may be a general-purpose processor or a dedicated processor, for example, a baseband processor or a central processing unit. The baseband processor may be configured to process a communication protocol and communication data. The central processing unit may be configured to control the communication apparatus (for example, a base station, a terminal, or a chip) to execute a software program, and process data in the software program.

In a possible design, one or more modules in FIG. 5 and FIG. 6 may be implemented by one or more processors, or by one or more processors and memories.

In a possible design, the communication apparatus 700 includes one or more processors 701. The one or more processors 701 can implement the encoding/decoding function. For example, the communication apparatus may be an encoder or a decoder. In another possible design, the processor 701 can implement other functions in addition to the encoding/decoding function.

The communication apparatus 700 encodes/decodes an input sequence based on an LDPC matrix. A base matrix of the LDPC matrix may be any base matrix in the foregoing examples, a base matrix obtained by performing transformation on a row order, a column order, or a row order and a column order in any base matrix listed above, a base matrix obtained by shortening or puncturing based on any base matrix listed above, or a matrix obtained through spreading of any base matrix listed above. For encoding/decoding processing, reference may be made to the descriptions of related parts in FIG. 5 and FIG. 6. Details are not described herein again.

Optionally, in a design, the processor 701 may include an instruction 703 (or sometimes referred to as code or a program). The instruction may run in the processor, so that the communication apparatus 700 performs the methods described in the foregoing embodiments. In another possible design, the communication apparatus 700 may further include a circuit. The circuit can implement the encoding/decoding function in the foregoing embodiments.

Optionally, in a design, the communication apparatus 700 may include one or more memories 702. The memory 702 stores an instruction 704. The instruction may run in the processor, so that the communication apparatus 700 performs the methods described in the foregoing method embodiments.

Optionally, the memory may further store data. Optionally, the processor may further store an instruction and/or data. The processor and the memory may be disposed separately or may be integrated together.

Optionally, the "storage" in the foregoing embodiments may be storage in the memory 702, or may be storage in another external memory or a storage device.

For example, the one or more memories 702 may store a parameter related to the LDPC matrix listed above, for example, a parameter related to a base matrix, such as a shift value, a base graph, spreading of a matrix based on a base graph, each row in a base matrix, a lifting factor, a base matrix, or spreading of a matrix based on a base matrix. For details, reference may be made to the related descriptions in the part in FIG. 5.

Optionally, the communication apparatus 700 may further include a transceiver 705 and an antenna 706. The processor 701 may be referred to as a processing unit, and controls the communication apparatus (a terminal or a base station). The transceiver 505 may be referred to as a transceiver unit, a transceiver circuit, or the like, and is configured to implement sending and receiving functions of the communication apparatus 700 by using the antenna 506.

Optionally, the communication apparatus 700 may further include a device for transport block CRC generation, a device for code block segmentation and a CRC check, an interleaver for interleaving, a device for rate matching, a modulator for modulation processing, or the like. Functions of these devices may be implemented by using the one or more processors 701.

Optionally, the communication apparatus 700 may further include a demodulator for a demodulation operation, a deinterleaver for deinterleaving, a device for rate de-matching, a device for code block concatenation and a CRC check, or the like. Functions of these devices may be implemented by using the one or more processors 701.

Figure 8:
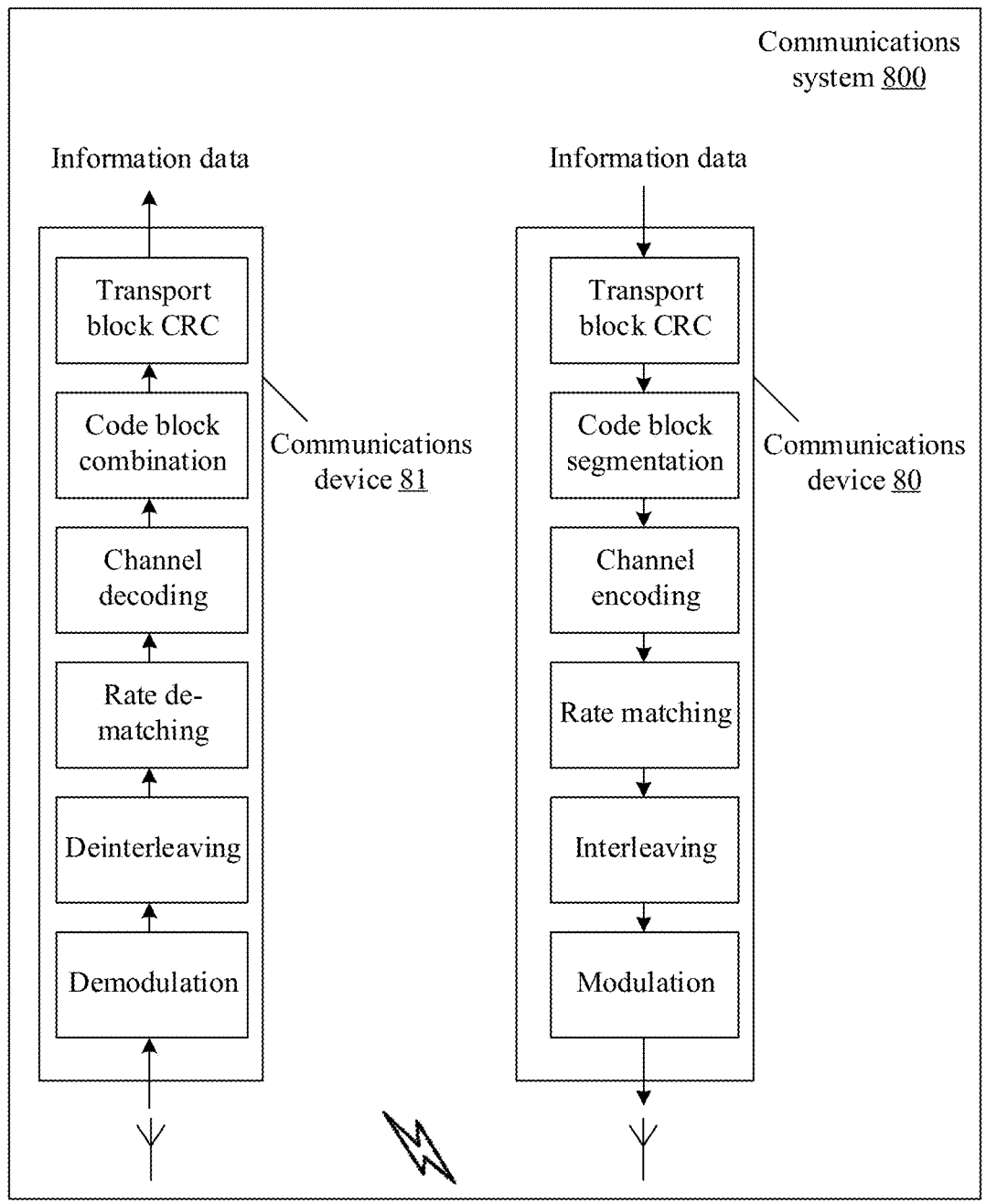

FIG. 8 is a schematic diagram of a communication system 800. The communication system 800 includes communication devices 80 and 81. Information data is received and sent between the communication devices 80 and 81. The communication devices 80 and 81 may be the communication apparatus 700, or the communication devices 80 and 81 each include the communication apparatus 700, and receive and/or send the information data. In an example, the communication device 80 may be a terminal, and the corresponding communication device 81 may be a base station. In another example, the communication device 80 may be a base station, and the corresponding communication device 81 may be a terminal.

It is further understood that various illustrative logical blocks and steps may be implemented by electronic hardware, computer software, or a combination thereof. Whether such functions are implemented by hardware or software depends on a particular application and a design requirement of an entire system. For each particular application, various methods may be used to implement the functions. However, such implementations should not be construed as going beyond the protection scope of the embodiments of the present application.

The technologies described in this application can be implemented in various manners. For example, the technologies may be implemented by hardware, software, or a combination thereof. For implementation by hardware, a processing unit configured to implement the technologies in the communication apparatus (for example, a base station, a terminal, a network entity, or a chip) can be implemented in one or more general-purpose processors, a digital signal processor (DSP), a digital signal processing device (DSPD), an application-specific integrated circuit (ASIC), a programmable logic device (PLD), a field programmable gate array (FPGA), another programmable logic apparatus, a discrete gate, a transistor logic, a discrete hardware component, or any combination thereof. The general-purpose processor may be a microprocessor. Optionally, the general-purpose processor may be any conventional processor, controller, microcontroller, or status machine. The processor may be implemented by using a combination of computing apparatuses, for example, a digital signal processor and a microprocessor, a plurality of microprocessors, one or more microprocessors in combination with a digital signal processor core, or any other similar configurations.

The steps of the methods or the algorithms described in the embodiments of the present application may be directly embedded into hardware, an instruction executed by a processor, or a combination thereof. The memory may be a RAM memory, a flash memory, a ROM memory, an EPROM memory, an EEPROM memory, a register, a hard disk, a removable disk, a CD-ROM, or any other form of storage medium in the art. For example, the memory may be connected to the processor, so that the processor can read information from the memory, and store and write information in the memory. Optionally, the memory may be integrated into the processor. The processor and the memory may be disposed in the ASIC, and the ASIC may be disposed in a terminal or a base station or other network devices. Optionally, the processor and the memory may be disposed in different components of the terminal or a base station or other network devices.

With descriptions of the foregoing implementations, the present application may be implemented by hardware, firmware, or a combination thereof. When the embodiments of the present application is implemented by a software program, the implementation may be fully or partially in a form of a computer program product, where the computer program product includes one or more computer instructions. When the computer instructions are loaded and executed, the procedures or functions according to the embodiments of the present application are all or partially generated. When the present application is implemented by the software program, the foregoing functions may alternatively be stored in a computer-readable medium or transmitted as one or more instructions or code in the computer-readable medium. The computer may be a general-purpose computer, a dedicated computer, a computer network, or another programmable apparatus. The computer-readable medium includes a computer storage medium and a communication medium, where the communication medium includes any medium that enables a computer program to be transmitted from one place to another. The storage medium may be any available medium that can be accessed by a computer. The computer readable medium may be the memory as described above. For example, if software is transmitted from a website, a server, or another remote source by using a coaxial cable, an optical fiber/cable, a twisted pair, a digital subscriber line (DSL), or wireless technologies such as infrared ray, radio, and microwave, the coaxial cable, optical fiber/cable, twisted pair, DSL, or wireless technologies such as infrared ray, radio, and microwave are included in definitions of mediums to which they belong. For example, a disk and a disc used by the present application include a compact disc (CD), a laser disc, an optical disc, a digital versatile disc (DVD), a floppy disk, and a Blu-ray disc, where the disk generally copies data magnetically, and the disc copies data optically by using a laser. The foregoing combination should also be included in the protection scope of the computer-readable medium.

It should be noted that "/" in this application represents and/or. For example, "encoding/decoding (encoding and/or decoding)" means encoding, decoding, or encoding and decoding.

In conclusion, what is described above is merely examples of embodiments of the technical solutions of the present application, but is not intended to limit the protection scope of the present application. Any modification, equivalent replacement, or improvement made without departing from principle of the present application shall fall within the protection scope of the present application.

What is claimed is:

1. An apparatus for wireless communication, comprising at least one processor configured to:
determine a lifting factor Z; and
encode an input sequence based on a low density parity check (LDPC) matrix,
wherein the LDPC matrix is identified based on a matrix $H_B$ and the lifting factor Z, and wherein non-zero-elements of the matrix $H_B$ whose row indexes (i), column indexes (j), and corresponding values are as follows:

| matrix $H_B$ | | |
| --- | --- | --- |
| row indexes (i) | column indexes (j) | $V_{i,j}$ |
| 0 | 0, 1, 2, 3, 6, 9, 10, 11 | 0, 0, 0, 0, 0, 0, 0, 0 |
| 1 | 0, 3, 4, 5, 6, 7, 8, 9, 11, 12 | 137, 124, 0, 0, 88, 0, 0, 55, 0, 0 |
| 2 | 0, 1, 3, 4, 8, 10, 12, 13 | 20, 94, 99, 9, 108, 1, 0, 0 |
| 3 | 1, 2, 4, 5, 6, 7, 8, 9, 10, 13 | 38, 15, 102, 146, 12, 57, 53, 46, 0, 0 |
| 4 | 0, 1, 11, 14 | 0, 136, 157, 0 |
| 5 | 0, 1, 5, 7, 11, 15 | 0, 131, 142, 141, 64, 0 |
| 6 | 0, 5, 7, 9, 11, 16 | 0, 124, 99, 45, 148, 0 |
| 7 | 1, 5, 7, 11, 13, 17 | 0, 45, 148, 96, 78, 0 |
| 8 | 0, 1, 12, 18 | 0, 65, 87, 0 |
| 9 | 1, 8, 10, 11, 19 | 0, 97, 51, 85, 0 |
| 10 | 0, 1, 6, 7, 20 | 0, 17, 156, 20, 0 |
| 11 | 0, 7, 9, 13, 21 | 0, 7, 4, 2, 0 |
| 12 | 1, 3, 11, 22 | 0, 113, 48, 0 |
| 13 | 0, 1, 8, 13, 23 | 0, 112, 102, 26, 0 |
| 14 | 1, 6, 11, 13, 24 | 0, 138, 57, 27, 0 |
| 15 | 0, 10, 11, 25 | 0, 73, 99, 0 |
| 16 | 1, 9, 11, 12, 26 | 0, 79, 111, 143, 0 |
| 17 | 1, 5, 11, 12, 27 | 0, 24, 109, 18, 0 |
| 18 | 0, 6, 7, 28 | 0, 18, 86, 0 |
| 19 | 0, 1, 10, 29 | 0, 158, 154, 0 |
| 20 | 1, 4, 11, 30 | 0, 148, 104, 0 |
| 21 | 0, 8, 13, 31 | 0, 17, 33, 0 |
| 22 | 1, 2, 32 | 0, 4, 0 |
| 23 | 0, 3, 5, 33 | 0, 75, 158, 0 |
| 24 | 1, 2, 9, 34 | 0, 69, 87, 0 |
| 25 | 0, 5, 35 | 0, 65, 0 |
| 26 | 2, 7, 12, 13, 36 | 0, 100, 13, 7, 0 |
| 27 | 0, 6, 37 | 0, 32, 0 |
| 28 | 1, 2, 5, 38 | 0, 126, 110, 0 |
| 29 | 0, 4, 39 | 0, 154, 0 |
| 30 | 2, 5, 7, 9, 40 | 0, 35, 51, 134, 0 |
| 31 | 1, 13, 41 | 0, 20, 0 |
| 32 | 0, 5, 12, 42 | 0, 20, 122, 0 |
| 33 | 2, 7, 10, 43 | 0, 88, 13, 0 | matrix $H_B$

| row indexes (i) | column indexes (j) | $V_{i,j}$ |
|---|---|---|
| 34 | 0, 12, 13, 44 | 0, 19, 78, 0 |
| 35 | 1, 5, 11, 45 | 0, 157, 6, 0 |
| 36 | 0, 2, 7, 46 | 0, 63, 82, 0 |
| 37 | 10, 13, 47 | 0, 144, 0 |
| 38 | 1, 5, 11, 48 | 0, 93, 19, 0 |
| 39 | 0, 7, 12, 49 | 0, 24, 138, 0 |
| 40 | 2, 10, 13, 50 | 0, 36, 143, 0 |
| 41 | 1, 5, 11, 51 | 0, 2, 55, 0. |

2. The apparatus according to claim 1, wherein the at least one processor is configured to:
determine the matrix $H_B$ according to a set index of the lifting factor Z.

3. The apparatus according to claim 1, wherein the lifting factor Z is determined based on following sets of lifting factors, wherein each of the sets of lifting factors is identified by a set index:
{2, 4, 8, 16, 32, 64, 128, 256};
{3, 6, 12, 24, 48, 96, 192, 384};
{5, 10, 20, 40, 80, 160, 320};
{7, 14, 28, 56, 112, 224};
{9, 18, 36, 72, 144, 288};
{11, 22, 44, 88, 176, 352};
{13, 26, 52, 104, 208}; and
{15, 30, 60, 120, 240}.

4. The apparatus according to claim 1, wherein the lifting factor Z is one of 5, 10, 20, 40, 80, 160 and 320.

5. The apparatus according to claim 1, wherein all elements except the non-zero-elements in the matrix $H_B$ are zero elements.

6. The apparatus according to claim 5, wherein the LDPC matrix is identified based on the matrix $H_B$ by replacing the zero-elements of the matrix $H_B$ with all zero matrices of size Z×Z, and replacing the non-zero-elements of the matrix $H_B$ with circular permutation matrices.

7. The apparatus according to claim 6, wherein each circular permutation matrix respectively corresponds to a Z×Z identity matrix circularly shifted to the right for $P_{i,j}$ times, wherein $P_{i,j}=\mod(V_{i,j},Z)$.

8. The apparatus according to claim 1, comprising at least one memory configured to store one or more of the following:
parameters associated with the matrix $H_B$;
the matrix $H_B$;
the lifting factor Z; or
a transformed matrix of the matrix $H_B$.

9. The apparatus according to claim 1, comprising a transceiver configured to:
receive a signal,
wherein the at least one processor is configured to decode the signal based on the matrix $H_B$.

10. A method for wireless communication, comprising:
determining a lifting factor Z; and
encoding an input sequence based on a low density parity check (LDPC) matrix,
wherein the LDPC matrix is identified based on a matrix $H_B$ and the lifting factor Z, and wherein non-zero-elements of the matrix $H_B$ whose row indexes (i), column indexes (j), and corresponding values $V_{i,j}$ are as follows:

matrix $H_B$

| row indexes (i) | column indexes (j) | $V_{i,j}$ |
|---|---|---|
| 0 | 0, 1, 2, 3, 6, 9, 10, 11 | 0, 0, 0, 0, 0, 0, 0, 0 |
| 1 | 0, 3, 4, 5, 6, 7, 8, 9, 11, 12 | 137, 124, 0, 0, 88, 0, 0, 55, 0, 0 |
| 2 | 0, 1, 3, 4, 8, 10, 12, 13 | 20, 94, 99, 9, 108, 1, 0, 0 |
| 3 | 1, 2, 4, 5, 6, 7, 8, 9, 10, 13 | 38, 15, 102, 146, 12, 57, 53, 46, 0, 0 |
| 4 | 0, 1, 11, 14 | 0, 136, 157, 0 |
| 5 | 0, 1, 5, 7, 11, 15 | 0, 131, 142, 141, 64, 0 |
| 6 | 0, 5, 7, 9, 11, 16 | 0, 124, 99, 45, 148, 0 |
| 7 | 1, 5, 7, 11, 13, 17 | 0, 45, 148, 96, 78, 0 |
| 8 | 0, 1, 12, 18 | 0, 65, 87, 0 |
| 9 | 1, 8, 10, 11, 19 | 0, 97, 51, 85, 0 |
| 10 | 0, 1, 6, 7, 20 | 0, 17, 156, 20, 0 |
| 11 | 0, 7, 9, 13, 21 | 0, 7, 4, 2, 0 |
| 12 | 1, 3, 11, 22 | 0, 113, 48, 0 |
| 13 | 0, 1, 8, 13, 23 | 0, 112, 102, 26, 0 |
| 14 | 1, 6, 11, 13, 24 | 0, 138, 57, 27, 0 |
| 15 | 0, 10, 11, 25 | 0, 73, 99, 0 |
| 16 | 1, 9, 11, 12, 26 | 0, 79, 111, 143, 0 |
| 17 | 1, 5, 11, 12, 27 | 0, 24, 109, 18, 0 |
| 18 | 0, 6, 7, 28 | 0, 18, 86, 0 |
| 19 | 0, 1, 10, 29 | 0, 158, 154, 0 |
| 20 | 1, 4, 11, 30 | 0, 148, 104, 0 |
| 21 | 0, 8, 13, 31 | 0, 17, 33, 0 |
| 22 | 1, 2, 32 | 0, 4, 0 |
| 23 | 0, 3, 5, 33 | 0, 75, 158, 0 |
| 24 | 1, 2, 9, 34 | 0, 69, 87, 0 |
| 25 | 0, 5, 35 | 0, 65, 0 |
| 26 | 2, 7, 12, 13, 36 | 0, 100, 13, 7, 0 |
| 27 | 0, 6, 37 | 0, 32, 0 |
| 28 | 1, 2, 5, 38 | 0, 126, 110, 0 |
| 29 | 0, 4, 39 | 0, 154, 0 |
| 30 | 2, 5, 7, 9, 40 | 0, 35, 51, 134, 0 |
| 31 | 1, 13, 41 | 0, 20, 0 |
| 32 | 0, 5, 12, 42 | 0, 20, 122, 0 |
| 33 | 2, 7, 10, 43 | 0, 88, 13, 0 |
| 34 | 0, 12, 13, 44 | 0, 19, 78, 0 |
| 35 | 1, 5, 11, 45 | 0, 157, 6, 0 |
| 36 | 0, 2, 7, 46 | 0, 63, 82, 0 |
| 37 | 10, 13, 47 | 0, 144, 0 |
| 38 | 1, 5, 11, 48 | 0, 93, 19, 0 |
| 39 | 0, 7, 12, 49 | 0, 24, 138, 0 |
| 40 | 2, 10, 13, 50 | 0, 36, 143, 0 |
| 41 | 1, 5, 11, 51 | 0, 2, 55, 0. |

11. The method according to claim 10, further comprising:
determining the matrix $H_B$ according to a set index of the lifting factor Z.

12. The method according to claim 10, wherein the lifting factor Z is determined based on following sets of lifting factors, wherein each of the sets of lifting factors is identified by a set index:
{2, 4, 8, 16, 32, 64, 128, 256};
{3, 6, 12, 24, 48, 96, 192, 384};
{5, 10, 20, 40, 80, 160, 320};
{7, 14, 28, 56, 112, 224};
{9, 18, 36, 72, 144, 288};
{11, 22, 44, 88, 176, 352};
{13, 26, 52, 104, 208}; and
{15, 30, 60, 120, 240}.

13. The method according to claim 10, wherein the lifting factor Z is one of 5, 10, 20, 40, 80, 160 and 320.

14. The method according to claim 10, wherein all elements except the non-zero-elements in the matrix $H_B$ are zero elements.

15. The method according to claim 14, wherein the LDPC matrix is identified based on the matrix $H_B$ by replacing the zero-elements of the matrix $H_B$ with all zero matrices of size Z×Z, and replacing the non-zero-elements of the matrix $H_B$ with circular permutation matrices.

16. The method according to claim 15, wherein each circular permutation matrix respectively corresponds to a Z×Z identity matrix circularly shifted to the right for $P_{i,j}$ times, wherein $P_{i,j}=\mathrm{mod}(V_{i,j},Z)$.

17. The method according to claim 10, further comprising:
receiving a signal; and
decoding the signal based on the matrix $H_B$.

18. A computer-readable storage medium having instructions stored thereon that, when executed by a processor, cause a computer to perform a process that comprises:
determining a lifting factor Z; and
encoding an input sequence based on a low density parity check (LDPC) matrix,
wherein the LDPC matrix is identified based on a matrix $H_B$ and the lifting factor Z, and wherein non-zero-elements of the matrix $H_B$ whose row indexes (i), column indexes (j), and corresponding values V1, are as follows:

| matrix $H_B$ | | |
|---|---|---|
| row indexes (i) | column indexes (j) | $V_{i,j}$ |
| 0 | 0, 1, 2, 3, 6, 9, 10, 11 | 0, 0, 0, 0, 0, 0, 0, 0 |
| 1 | 0, 3, 4, 5, 6, 7, 8, 9, 11, 12 | 137, 124, 0, 0, 88, 0, 0, 55, 0, 0 |
| 2 | 0, 1, 3, 4, 8, 10, 12, 13 | 20, 94, 99, 9, 108, 1, 0, 0 |
| 3 | 1, 2, 4, 5, 6, 7, 8, 9, 10, 13 | 38, 15, 102, 146, 12, 57, 53, 46, 0, 0 |
| 4 | 0, 1, 11, 14 | 0, 136, 157, 0 |
| 5 | 0, 1, 5, 7, 11, 15 | 0, 131, 142, 141, 64, 0 |
| 6 | 0, 5, 7, 9, 11, 16 | 0, 124, 99, 45, 148, 0 |
| 7 | 1, 5, 7, 11, 13, 17 | 0, 45, 148, 96, 78, 0 |
| 8 | 0, 1, 12, 18 | 0, 65, 87, 0 |
| 9 | 1, 8, 10, 11, 19 | 0, 97, 51, 85, 0 |
| 10 | 0, 1, 6, 7, 20 | 0, 17, 156, 20, 0 |
| 11 | 0, 7, 9, 13, 21 | 0, 7, 4, 2, 0 |
| 12 | 1, 3, 11, 22 | 0, 113, 48, 0 |
| 13 | 0, 1, 8, 13, 23 | 0, 112, 102, 26, 0 |
| 14 | 1, 6, 11, 13, 24 | 0, 138, 57, 27, 0 |
| 15 | 0, 10, 11, 25 | 0, 73, 99, 0 |
| 16 | 1, 9, 11, 12, 26 | 0, 79, 111, 143, 0 |
| 17 | 1, 5, 11, 12, 27 | 0, 24, 109, 18, 0 |
| 18 | 0, 6, 7, 28 | 0, 18, 86, 0 |
| 19 | 0, 1, 10, 29 | 0, 158, 154, 0 |
| 20 | 1, 4, 11, 30 | 0, 148, 104, 0 |
| 21 | 0, 8, 13, 31 | 0, 17, 33, 0 |
| 22 | 1, 2, 32 | 0, 4, 0 |
| 23 | 0, 3, 5, 33 | 0, 75, 158, 0 |
| 24 | 1, 2, 9, 34 | 0, 69, 87, 0 |
| 25 | 0, 5, 35 | 0, 65, 0 |
| 26 | 2, 7, 12, 13, 36 | 0, 100, 13, 7, 0 |
| 27 | 0, 6, 37 | 0, 32, 0 |
| 28 | 1, 2, 5, 38 | 0, 126, 110, 0 |
| 29 | 0, 4, 39 | 0, 154, 0 |
| 30 | 2, 5, 7, 9, 40 | 0, 35, 51, 134, 0 |
| 31 | 1, 13, 41 | 0, 20, 0 |
| 32 | 0, 5, 12, 42 | 0, 20, 122, 0 |
| 33 | 2, 7, 10, 43 | 0, 88, 13, 0 |
| 34 | 0, 12, 13, 44 | 0, 19, 78, 0 |
| 35 | 1, 5, 11, 45 | 0, 157, 6, 0 |
| 36 | 0, 2, 7, 46 | 0, 63, 82, 0 |
| 37 | 10, 13, 47 | 0, 144, 0 |
| 38 | 1, 5, 11, 48 | 0, 93, 19, 0 |
| 39 | 0, 7, 12, 49 | 0, 24, 138, 0 |
| 40 | 2, 10, 13, 50 | 0, 36, 143, 0 |
| 41 | 1, 5, 11, 51 | 0, 2, 55, 0. |

19. The computer-readable storage medium according to claim 18, wherein the lifting factor Z is one of 5, 10, 20, 40, 80, 160 and 320.

20. The computer-readable storage medium according to claim 19, wherein the computer-readable storage medium is configured to store one or more of the following:
parameters associated with the matrix $H_B$;
the matrix $H_B$;
the lifting factor Z; or
a transformed matrix of the matrix $H_B$.

* * * * *

UNITED STATES PATENT AND TRADEMARK OFFICE
CERTIFICATE OF CORRECTION

PATENT NO. : 11,671,116 B2
APPLICATION NO. : 17/591347
DATED : June 6, 2023
INVENTOR(S) : Jin et al.

Page 1 of 1

It is certified that error appears in the above-identified patent and that said Letters Patent is hereby corrected as shown below:

In the Claims

Claim 1: Column 42, Line 31: "column indexes (j), and corresponding values are as" should read -- column indexes (j), and corresponding values $V_{i,j}$ are as --.

Claim 18: Column 45, Line 18: "column indexes (j), and corresponding values V1, are" should read -- column indexes (j), and corresponding values $V_{i,j}$ are --.

Signed and Sealed this
Ninth Day of January, 2024

Katherine Kelly Vidal
*Director of the United States Patent and Trademark Office*